United States Patent [19]

Turino et al.

[11] Patent Number: 5,994,892
[45] Date of Patent: Nov. 30, 1999

[54] INTEGRATED CIRCUIT DESIGN AUTOMATIC UTILITY METER: APPARATUS & METHOD

[75] Inventors: Thomas R. Turino, Elk Grove; Keith Bergiven, Rocklin; Dan Opperman, Gold River; Anthony Warner, Davis, all of Calif.

[73] Assignee: Sacramento Municipal Utility District, Sacramento, Calif.

[21] Appl. No.: 08/690,581

[22] Filed: Jul. 31, 1996

[51] Int. Cl.$^6$ .................................................. G01R 11/32
[52] U.S. Cl. ...................................... 324/142; 340/870.02
[58] Field of Search .................................... 324/142, 127; 364/483; 340/870.02; 379/106.03, 106.04

[56] References Cited

U.S. PATENT DOCUMENTS

| | | | |
|---|---|---|---|
| 3,842,206 | 10/1974 | Barsellotti et al. | 179/2 A |
| 3,922,492 | 11/1975 | Lumsden | 179/2 A |
| 4,077,061 | 2/1978 | Johnston et al. | 364/483 |
| 4,086,434 | 4/1978 | Bocchi | 179/2 A |
| 4,254,472 | 3/1981 | Juengel et al. | 364/900 |
| 4,337,466 | 6/1982 | Spahn | 340/870.09 |
| 4,365,302 | 12/1982 | Elms | 364/483 |
| 4,495,596 | 1/1985 | Sciulli | 364/900 |
| 4,504,831 | 3/1985 | Jahr et al. | 340/870.03 |
| 4,578,536 | 3/1986 | Oliver et al. | 179/2 AM |
| 4,639,728 | 1/1987 | Swanson | 340/870.03 |
| 4,654,868 | 3/1987 | Shelley | 379/106 |
| 4,672,602 | 6/1987 | Hargrave et al. | 370/58 |
| 4,713,837 | 12/1987 | Gordon | 379/93 |
| 4,720,851 | 1/1988 | Smith | 379/107 |

(List continued on next page.)

OTHER PUBLICATIONS

Equimeter Incorporated, "Meter Reading Technologies for Taking the Measure of Tomorrow", Jun. 1990, entire brochure.

Landis & Gyr, "The RDS3 Reactive Demand Meter" (Product Brochure), Mar., 1993, entire brochure.

Process Systems, Inc., "PSI Product News", Apr., 1993, entire brochure.

Landis & Gyr, "DX"(Product Brochure), Jun., 1993, entire brochure.

General Electric, "GE UCNet System, Understanding the UCNet System", Sep., 1993, entire brochure.

Landis & Gyr, "Service Limiter Meter" (Prodcut Brochure), Oct., 1993, entire brochure.

Interec, Transmission & Distribution, "Integrated Communications Enhances Automated Customer Information System", Oct., 1993, entire brochure.

General Electric, "The Phase3 Electronic Meter with Internal Modem" (Product Brochure), Dec., 1993, entire brochure.

Ekstrom Industries, Inc., "AMR–7000 Block Diagram, Flow Chart for Metering Point Unit", 1994, entire brochure. (Month Unavailable).

American Innovations, Inc., "The AlMetering System— Advanced Metering System" (Product Brochure), entire brochure. (Feb., 1994).

Iris Systems, Inc., "The First All–Radio Automatic Meter Reading Trial for Electric, Gas & Water" (Press Release), Oct., 1991, entire release (pp. 1 through 4).

Genesis by Itron, "Top Electric Meter Manufactures Offer ERT–equipped Meters" Network, Jan., 1994.

*Primary Examiner*—Josie Ballato
*Assistant Examiner*—Russell M. Kobert
*Attorney, Agent, or Firm*—John P. O'Banion; Bernhard Kreten

[57] ABSTRACT

An automatic utility meter is provided for collecting, calculating, storing and displaying data correlative of consumption of utility commodities such as electric power, gas, water and the like. In addition, the automatic utility meter includes communication means which allows bi-directional communication of data to and from a remote computer. The automatic utility meter is a direct replacement for existing electric utility meters and uses direct read circuitry to sample and calculate power directly from the input voltage and current waveforms received from an electric utility company.

16 Claims, 35 Drawing Sheets

U.S. PATENT DOCUMENTS

| | | | |
|---|---|---|---|
| 4,782,287 | 11/1988 | Marx | 324/142 |
| 4,803,632 | 2/1989 | Frew et al. | 364/464.04 |
| 4,804,957 | 2/1989 | Selph et al. | 340/870.03 |
| 4,833,618 | 5/1989 | Verma et al. | 364/483 |
| 4,850,010 | 7/1989 | Stanbury et al. | 379/107 |
| 4,856,054 | 8/1989 | Smith | 379/107 |
| 4,862,493 | 8/1989 | Venkataraman et al. | 379/107 |
| 5,018,192 | 5/1991 | Smith | 379/107 |
| 5,056,107 | 10/1991 | Johnson et al. | 375/1 |
| 5,079,715 | 1/1992 | Venkataraman et al. | 364/481 |
| 5,197,095 | 3/1993 | Bonnet et al. | 379/107 |
| 5,202,916 | 4/1993 | Oliver | 379/106 |
| 5,204,896 | 4/1993 | Oliver | 379/106 |
| 5,239,575 | 8/1993 | White et al. | 379/107 |
| 5,243,644 | 9/1993 | Garland et al. | 379/106 |
| 5,283,572 | 2/1994 | McClelland et al. | 340/870.02 |
| 5,311,581 | 5/1994 | Merriam et al. | 379/107 |
| 5,325,051 | 6/1994 | Germer et al. | |
| 5,369,691 | 11/1994 | Cain et al. | 379/106 |
| 5,381,462 | 1/1995 | Larson et al. | 379/107 |
| 5,391,983 | 2/1995 | Lusignan et al. | |
| 5,434,911 | 7/1995 | Gray et al. | 379/106 |
| 5,451,937 | 9/1995 | Olson et al. | 340/870.03 |

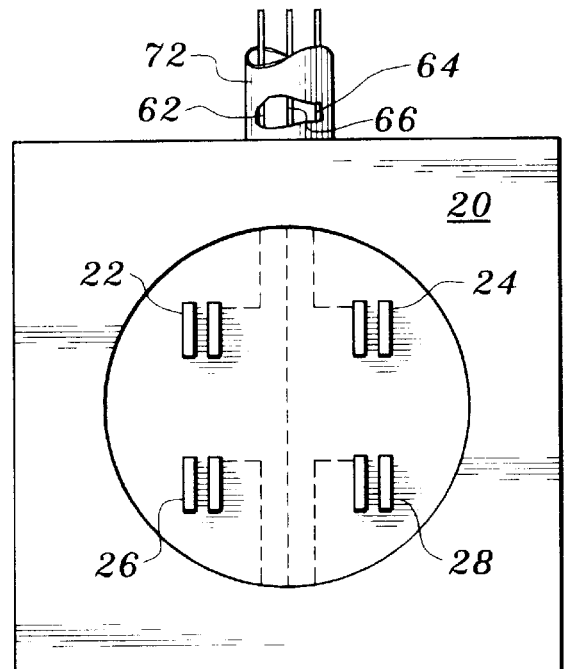
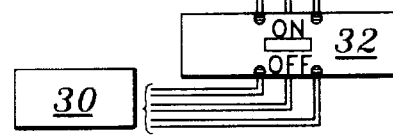
Fig. 2
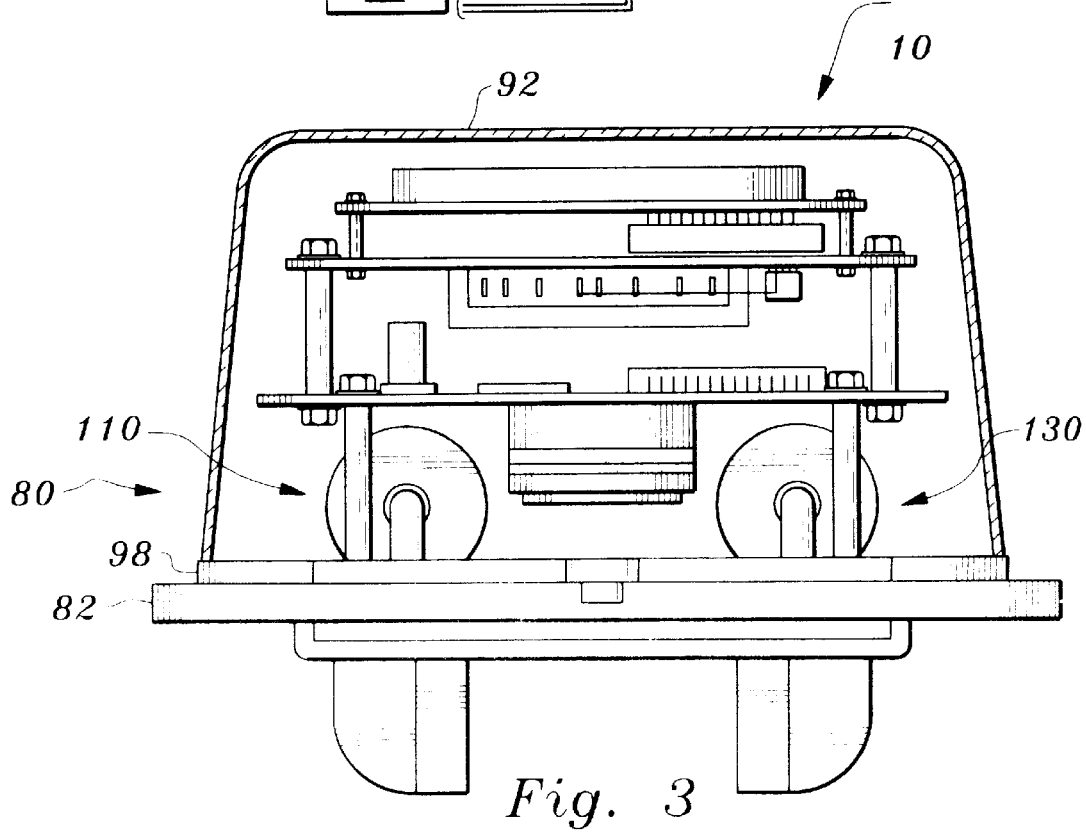
Fig. 3

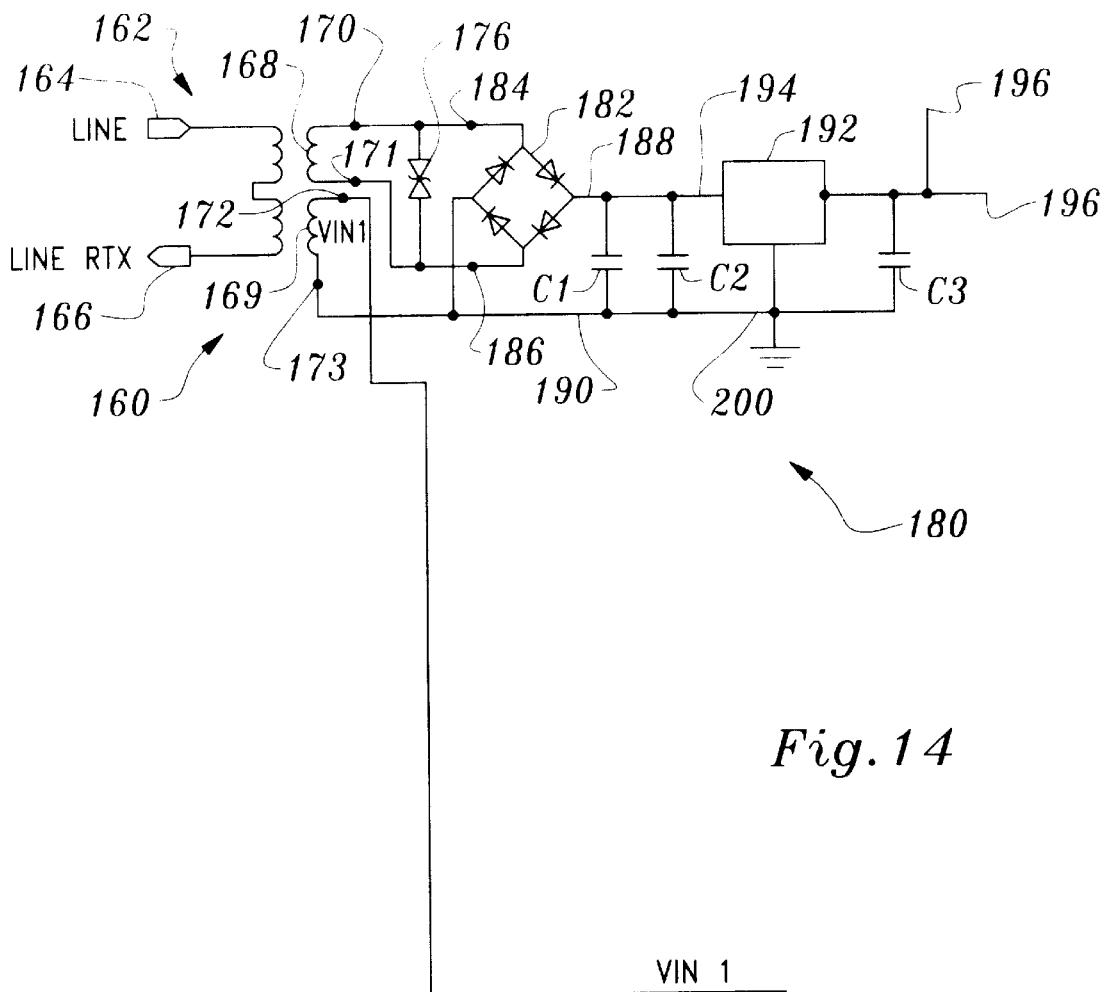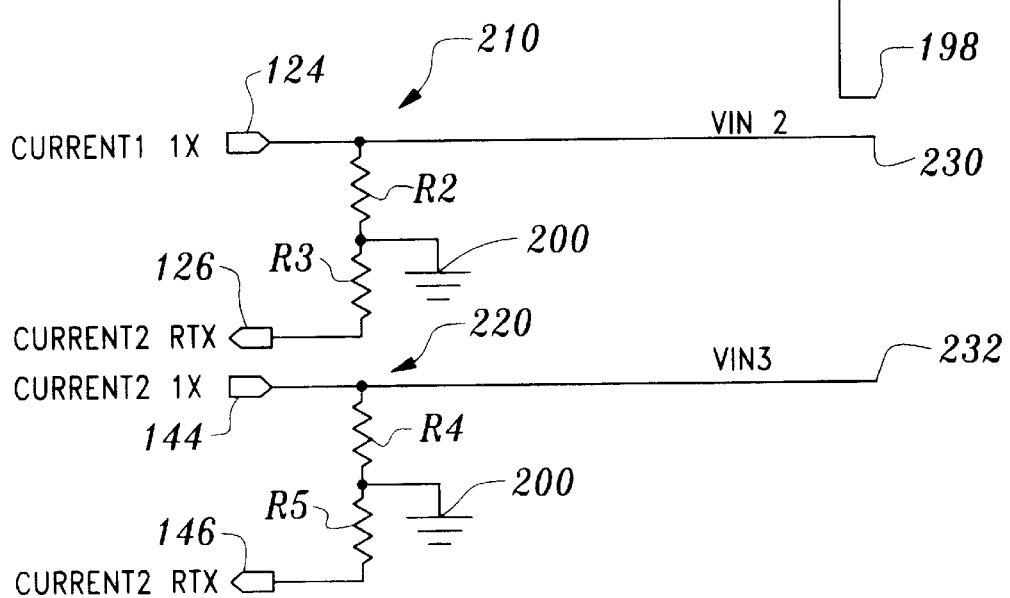
Fig.14

XMINUTES INTERRUPT FLOW DIAGRAM

INTEGRATED CIRCUIT DESIGN AUTOMATIC UTILITY METER: APPARATUS & METHOD

GOVERNMENT RELATED INVENTION

This invention was made in the performance of a cooperative research and development agreement with the Department of the Air Force. The invention may be manufactured and used by or for the Government of the United States for all government purposes without the payment of any royalty.

FIELD OF THE INVENTION

The present invention relates generally to an automatic utility meter apparatus, and in particular, to an integrated circuit design automatic utility meter apparatus which is a one for one replacement of existing utility meters and which provides collection, calculation, storage, display and transmission of consumption of utility commodities such as electric power, gas, water and the like.

BACKGROUND OF THE INVENTION

Interest in automatic meter reading has existed for over twenty-five years. Reasons for automatic meter reading, such as lower cost, lost time by a meter reader due to injuries from dog bites, inaccessibility to meters, irate customers, undesirable neighborhoods, the ability to control theft and destruction are all valid reasons for automatic meter reading. The industry, however, has not been able to provide any system that could compete in cost to the existing electromechanical meter. Thus, automatic meters were only considered for hard-to-read situations. Most systems require additional infrastructures which increases the overall cost of the system, and is therefore not at all cost effective for a system-wide implementation.

Systems are presently on the market which retrofit the existing electromechanical meter with pulse generating devices such as contact closures, reed switches or photo diodes which generate pulses for every revolution of a least significant digital wheel or revolution of a disk. Typically, this pulse data is stored and retrieved via a remote handheld radio transmitter, the customer's phone line, power line carrier generator or fiber optic photo coupler. This pulsed data is then downloaded to a computer and then uploaded to a central billing computer. In addition, these systems require the use of a meter interface unit (MIU) which is an external device to retrieve and store gas and water usage. The MIU is also used to house the mode of communication. The MIU fails to offer any visual display to the consumer.

These systems are relatively accurate for their method by which data is collected, stored and downloaded to a utilities computer for billing purposes. However, there are several downsides to this technology. For example, utilizing these pulse generating devices can lead to error introductions due to mechanical shock, electrostatic charge or the addition of external light sources in the case of photo diodes. This introduction of possible errors means the meter must be read more often to ensure that no error introduction has occurred, thereby defeating the purpose of automatic reading.

Hence, both the utility company and the consumer would benefit from a more accurate and efficient meter that would allow for multi-utility data collection, calculation, storage, a display of consumption in units of real time and a communication medium which allows for data transmission to and from a central billing computer. A meter which provides, inter alia, the above attributes would represent a marked improvement over prior art utility meters. Furthermore, a direct meter replacement would solve the problems associated with retro-fitting existing meters.

The following prior art reflects the state of the art of which applicant is aware and is included herewith to discharge applicant's acknowledged duty to disclose relevant prior art. It is stipulated, however, that none of these references teach singly nor render obvious when considered in any conceivable combination the nexus of the instant invention as disclosed in greater detail hereinafter and as particularly claimed.

| PAT. NO.  | ISSUE DATE         | INVENTOR             |
|-----------|--------------------|----------------------|
| 3,842,206 | October 15, 1974   | Barsellotti, et al.  |
| 3,922,492 | November 25, 1975  | Lumsden              |
| 4,086,434 | April 25, 1978     | Bocchi               |
| 4,254,472 | March 3, 1981      | Juengel, et al.      |
| 4,337,466 | June 29, 1982      | Spahn                |
| 4,495,596 | January 22, 1985   | Sciulli              |
| 4,504,831 | March 12, 1985     | Jahr, et al.         |
| 4,578,536 | March 25, 1986     | Oliver, et al.       |
| 4,639,728 | January 27, 1987   | Swanson              |
| 4,654,868 | March 31, 1987     | Shelley              |
| 4,672,602 | June 9, 1987       | Hargrave, et al.     |
| 4,713,837 | December 15, 1987  | Gordon               |
| 4,720,851 | January 19, 1988   | Smith                |
| 4,782,287 | November 1, 1988   | Marx                 |
| 4,803,632 | February 7, 1989   | Frew, et al.         |
| 4,804,957 | February 14, 1989  | Selph, et al.        |
| 4,833,618 | May 23, 1989       | Verma, et al.        |
| 4,850,010 | July 18, 1989      | Stanbury, et al.     |
| 4,856,054 | August 8, 1989     | Smith                |
| 4,862,493 | August 29, 1989    | Venkataraman, et al. |
| 5,018,192 | May 21, 1991       | Smith                |
| 5,056,107 | October 8, 1991    | Johnson, et al.      |
| 5,079,715 | January 7, 1992    | Venkataraman, et al. |
| 5,197,095 | March 23, 1993     | Bonnet, et al.       |
| 5,202,916 | April 13, 1993     | Oliver               |
| 5,204,896 | April 20, 1993     | Oliver               |
| 5,239,575 | August 24, 1993    | White, et al.        |
| 5,243,644 | September 7, 1993  | Garland, et al.      |
| 5,283,572 | February 1, 1994   | McClelland, et al.   |
| 5,311,581 | May 10, 1994       | Merriam, et al.      |
| 5,369,691 | November 29, 1994  | Cain, et al.         |
| 5,381,462 | January 10, 1995   | Larson, et al.       |
| 5,434,911 | July 18, 1995      | Gray, et al.         |
| 5,451,937 | September 19, 1995 | Olson, et al.        |

OTHER PRIOR ART (Including Author, Title, Date, Pertinent Pages, Etc.)

Equimeter Incorporated, "Meter Reading Technologies for Taking the Measure of Tomorrow", June, 1990, entire brochure.

Landis & Gyr, "The RDS3 Reactive Demand Meter" (Product Brochure), March, 1993, entire brochure.

Process Systems Inc., "PSI Product News", April, 1993, entire brochure.

Landis & Gyr, "DX" (Product Brochure), June, 1993, entire brochure.

General Electric, "GE UCNet System, Understanding the UCNet System", September, 1993, entire brochure.

Landis & Gyr, "Service Limiter Meter" (Product Brochure), October, 1993, entire brochure.

Intertec, *Transmission & Distribution* (T&D Automation Expo '93 Program), "Integrated Communications Enhances Automated Customer Information Systems", October, 1993, entire brochure.

General Electric, "The Phase3 Electronic Meter with Internal Modem" (Product Brochure), December, 1993, entire brochure.

Ekstrom Industries, Inc., "AMR-7000 Block Diagram, Flow Chart for Metering Point Unit", 1994, entire brochure.

American Innovations, Inc., "The AIMetering System—Advanced Metering System" (Product Brochure), February, 1994, entire brochure.

Landis & Gyr, "TouchRead" (Product Brochure),

Itron, "Commercial ERT Module" (Product Brochure),

Itron, "The Electric Meter AMR Kit" (Product Brochure),

Nertec, "Making Contact" (Product Brochure),

U.S. Pat. No. 3,842,206 to Barsellotti, et al. teach the use of an outbound (a system which is initiated at a central location remote from the customer's site) system requiring a meter interface unit. The system requires the retrofit of existing electromechanical meters with reed switches sensing the least significant digit wheel as a measure of usage. The usage is stored in memory and this memory is released to a secondary storage network upon the receipt of a signal received over the phone line. This data is then encoded and transmitted in sequence over a special trunk line to a data processor. This system includes three sections: (1) the data processing section; (2) the meter sensor and transmitter section; and (3) the interface unit between these two sections. The system is referred to as a transponder.

U.S. Pat. No. 3,922,492 to Lumsden teaches an outbound system requiring a transponder. The system requires the retrofit of an existing meter with an L.E.D. photo pickup or contact closure for monitoring every revolution of a least significant digit wheel as a measure of consumption. This consumption is stored as a pulse data in a cascade of counters. The data from the counters is downloaded to a computer at the central billing office upon receipt of a signal from the computer at the central office.

U.S. Pat. No. 4,086,434 to Bocchi teaches an inbound system that is a meter interface unit. The system requires the use of contact closure meters (electric, gas and water). The system communicates via standard telephone lines to central offices for the various utilities, and also to the appropriate authorities in case of emergency. In the case of a utility the contact closures represent an indication of a measured amount of usage (typically the least significant digit wheel or one revolution of a disc within the meter). This contact closure is represented as a stored pulse and is typically calculated at the central billing center. In the case of an emergency, a contact closure represents a variety of home protection devices as well as medical or fire information. A calling cycle is initiated to call the central office of the company supervising the installation and operation of the home units, which may or may not be the same as one of the utility companies.

U.S. Pat. No. 4,254,472 to Juengel, et al. teaches the use of a meter interface unit which can be used with a variety of known devices which provide a pulse-like output whose frequency is proportional to the quantity being sensed. A peripheral interface adapter provides the necessary interface between circuitry, a display unit and a microprocessor.

U.S. Pat. No. 4,337,466 to Spahn teaches a system for providing tamper protection. Tamper protection is provided for a meter and for a transmission line carrying energy usage information to a transponder such that any interruption of the circuit path causes an alarm to be generated. The circuitry includes an encoder associated with each remote meter to be protected and a centrally located decoder for receiving the signal transmitted by the encoder. Any interruptions of the circuit path which could be caused by disconnecting the meter or tampering with the line connected thereto will interrupt the pulsed carrier signal and cause pulses corresponding to the interruptions to be placed on the line. The class of tampers which can be detected includes open and shorted lines, and the series or parallel connection of additional resistance to the lines.

U.S. Pat. No. 4,495,596 to Sciulli teaches the use of a transponder with a battery back-up for a time of day clock.

U.S. Pat. No. 4,504,831 to Jahr, et al. teaches the use of meter interface unit (MIU) that collects meter data through a meter encoder and can transmit this data either by a cable or telephone to a central data processor.

U.S. Pat. No. 4,578,536 to Oliver, et al. teaches the use of an outbound system requiring a meter interface unit powered by the phone line. The system requires a pulse output from the existing meters through a meter interface device which stores the data. This data is then transmitted over the customer's phone line when an interrogation signal is sent from the telephone company's computer to the multiplexer (centerpoint) which can accommodate up to 100 telephone lines. The data received is either by pulse width modulation or dual-tone modulation and is demodulated by the telephone company and translated to digital information representative of actual usage.

U.S. Pat. No. 4,654,868 to Shelley teaches the use of an outbound system requiring a meter interface unit. The system comprises a telephone company computer, a time independent data transmission device (TIDTD) and a data set (meter interface unit). The system is activated at the telephone company's computer which connects the TIDTD to the data set using a one ring burst to not interfere with the customer's phone use. The one ring burst is suppressed so as not to notify the customer as a false ring and still obtain the data from the data set.

U.S. Pat. No. 4,672,602 to Hargrave, et al. teaches the use of an information transport system for providing data services over existing telephone lines without interference with existing voice services supported by the telephone network. The system includes equipment that is located at the subscriber's premises, equipment at the central exchange, and adapters for interconnecting the central exchange equipment with the individual subscribers' lines. This system allows the transportation of data over the existing phone line without having to go through the telephone company's main switch.

U.S. Pat. No. 4,713,837 to Gordon teaches the use of a communications network for transmitting information originating from a receiving and transmitting station and destined for another receiving and transmitting station over telecommunication channels.

U.S. Pat. No. 4,720,851 to Smith teaches an outbound system utilizing ring detection to initiate several voltage supplies across different size zener diodes to determine the actual dial indicator for the meter to be read.

U.S. Pat. No. 4,782,287 to Marx teaches the use of a watt-hour meter in which the pulse width modulated signals, representing the voltage supplied to a load, serve as chopping signals that modulate a waveform representing current to produce an output indicative of power. A series of pulses is spaced on the basis of the power signal and the number of pulses connected as a measure of energy.

U.S. Pat. No. 4,803,632 to Frew, et al. teaches the use of an electronic meter that utilizes a power line carrier or optical probe to obtain data. Features include a remote readout, credit card slot and cost of utilities and samples at 16.67 times a cycle or 1024 times a second. It is not remote but requires a meter reader.

U.S. Pat. No. 4,804,957 to Selph, et al. teaches the use of a utility meter which is a microprocessor-based circuit using Hall effect electric current sensors to measure power usage by residential and commercial customers. An analog signal from the Hall effect sensor is converted to a digital signal which is fed to the microprocessor for analysis and storage in random access memory. Using a real time clock, the microprocessor determines time of use information which is also stored in random access memory. The memory may be remotely interrogated via a telephone line or serial communication link. The system requires a MRAC at the telephone central switch for communication so that the utility can contact the meter for data. The system is an outbound system, that is, a system that is initiated at the utility to acquire the data. The system utilizes an operational amplifier which generates a DC level output proportional to the time integral of the power sensed by the current sensor which is then fed into a voltage to frequency converter. The conversion is made by sampling the output for a fixed time interval and counting the number of pulses or oscillations produced.

U.S. Pat. No. 4,833,618 to Verma, et al. teaches the use of a system requiring a meter interface unit. The system comprises a remote data unit (meter interface), a utility data processor and a digital communication interface. In effect, the system is designed to count each rotation of the least significant dial of one or more utility meters at a particular premise and to store the sum of each utility usage in a separate register allocated to a particular utility, i.e., gas, water, electric. Each utility usage is accumulated in the assigned register. At a specific predetermined time during one day of the billing cycle or period, the remote data unit calls the utility data processor and transmits the utility usage information from the remote data unit to the utility data processor.

U.S. Pat. No. 4,850,010 to Stanbury, et al. teaches the use of a telemetry terminal which utilizes a utility management terminal (UMT) and is used for load shedding and remote metering from pulse meters.

U.S. Pat. No. 4,862,493, to Venkataraman, et al. teaches the use of a remote data recorder which connects to a pulse-type meter. Enclosed within the recorder is a modem, non-volatile memory and a CPU to count the pulses.

U.S. Pat. No. 5,018,192 to Smith teaches the use of an interface unit specifically designed for data transmission over the customer's phone line. The meters are connected to an interrogation device and are signaled from the telephone interface unit, all of which are connected together.

U.S. Pat. No. 5,056,107 to Johnson, et al. teaches the use of a radio communication network for transmitting data from a number of remote stations to a central station. The system requires a retrofit of existing meters using a photo diode to determine the number of revolutions of the disc in a electromechanical meter. The output of the photo diode creates a pulse and this pulse represents a known value of usage. The usage is stored into memory until called upon by a radio transmitter receiver and downloaded into a computer base.

U.S. Pat. No. 5,079,715 to Venkataraman, et al. teaches the use of an electronic data recorder. The system comprises an electronic remote data recorder which records pulses representing utility usage from a number of consumers. The system is powered from the consumer's home phone line.

U.S. Pat. No. 5,197,095 to Bonnet, et al. teaches the use of a system for remote transfer and collection of data. The systeni is an outbound system requiring a meter interface unit. The system comprises a storage and transmission unit at the meter, a transmitter, a collection means and a data processor.

U.S. Pat. No. 5,202,916 to Oliver teaches the use of a signal processing circuit for use in a meter interface unit (MIU).

U.S. Pat. No. 5,204,896 to Oliver teaches the use of an outbound telemetry device type of meter interface unit. The system includes a processor which is capable of collecting consumption information at the subscriber's site. The processor draws electrical power from the phone line in an electrically isolated fashion.

U.S. Pat. No. 5,239,575 to White, et al. teaches the use of a meter interface unit (MIU) termed a remote data unit (RDU). This RDU is a telephone inbound unit with a modem and real time clock. The unit can be interfaced with meters that provide a pulse output or an absolute encoder.

U.S. Pat. No. 5,243,644 to Garland, et al. teaches the use of a telemetry access arrangement requiring a meter interface unit. The system requires an interface with the phone company's central office, the utility and the customer's interface unit.

U.S. Pat. No. 5,283,572 to McClelland, et al. teach the use of an interface with an electric meter which facilitates storing water usage data.

U.S. Pat. No. 5,311,581 to Merriam, et al. teaches the use of an outbound remote meter reading system requiring telephone test trunks and switching to access the customer's pulse meter. The dial indicator of the rotary hand type which represents the lease significant digit is replaced with a rotary two-pole permanent magnet. A Wiegand sensor is disposed adjacent the rotary magnet and generates two alternating pulses for each revolution of the rotary magnet.

U.S. Pat. No. 5,369,691 to Cain, et al. teaches the use of a telephone communications infrastructure designed to provide an information transmission path between customer locations and remote locations deriving the information. The information is transmitted out of band to a local distribution point then retransmitted to in-band signals for further transmission.

U.S. Pat. No. 5,381,462 to Larson, et al. teaches the use of a meter interface unit (MIU) described as a meter reader terminal requiring a pulse type meter to acquire data and then transmits this data over the customer's phone line.

U.S. Pat. No. 5,434,911 to Gray, et al. teaches the use of a meter interface unit (MIU) for remotely reading utility meters, including data processing. This system is an inbound system which is designed to interface with two encoder type utility meters.

U.S. Pat. No. 5,451,937 to Olson, et al. teaches the use of a module interface for a variety of metering pulse generators which converts an analog pulse to a digital pulse.

The other prior art listed above, but not specifically discussed, further catalog the prior art of which the applicant is aware. These references diverge even more starkly from the references specifically distinguished above.

SUMMARY OF THE INVENTION

One primary function of the present invention is to measure, calculate, store and provide a visual readout of electricity, gas, and water usage and send this data to a central computer for automatic billing. The primary method utilized to transfer the data is via the residential phone line, although because of its modular and open architectural design, a variety of commercially available communications medium may be incorporated to transfer the data, such as a radio transceiver, power line carrier or fiberoptic coupler. The meter calculates kilowatt-hours (KWHs), volt-amperes (VAs), volt-amperes reactive (VARs), and power factor angle.

The present invention uses direct read circuitry to sample and calculate power directly from the input voltage and current waveforms. The sampled waveforms are converted to digital signals suitable for processing by the meter's central processing unit. This data is stored and accumulated in memory devices until a periodic transfer to a central computer via modem. In addition, the meter is designed to accept measurements from gas and water meters with the capability to transfer digital signal levels to the central office.

The memory devices are powered by conventional and capacitive-backup circuitry to ensure data retention. Data retention circuitry is designed to meet a minimum of 15 hours without conventional power.

Voltage and Current Transformation—The voltage and current sinusoids entering the residential dwellings shall be transformed to values within ranges acceptable for processing by the meter's microelectronic circuits. A voltage transformer and a current sensor are the two devices used to achieve voltage and current reduction. The meter will measure the values on the secondary side of these waveforms to determine power consumption. The current sensors will transform the current by a ratio of 1:1000 to generate values on the secondary side in the milliampere range. The voltage transformer will convert 240 V RMS to approximately 10 V RMS. The RMS voltage will also be used to provide power to the microelectronic circuits in addition to being sampled for power consumption calculations.

Input Power Sampling—The meter shall sample the secondary side sinusoidal voltage and current analog waveforms for conversion to digital values. These values shall subsequently be used to perform power usage calculations. One primary component to perform these steps is an eight channel twelve bit analog-to-digital converter (A/D). A secondary winding of the voltage transformer provides a secondary waveform which is directed to the A/D converter for sampling. The secondary currents from the current sensors are directed through precision resistance branches to generate voltage waveforms for sampling by the analog-to-digital converter (A/D). The outputs from A/D are digital values that shall be transferred to a hardware multiplier via a field programmable gate array for rapid multiplication. The voltage values are also read by the microcontroller for VAR calculations.

Sampling Rates—The input waveforms to the analog-to-digital converter are sampled at a periodic and frequent rate to ensure accurate measurement. Both current and voltage waveforms are 60 Hz sinusoids that are preferably sampled 84 times per cycle. The sampling rate is thus 84×60=5040 times per second.

Power Calculations—Results of the hardware multiplier are used to calculate KWHs, KVAs, and VARs. The sampled voltage and current values are sampled, stored, and accessed for continuous calculations.

KW & KWH—The sampled voltage and current values are multiplied with the results summed and then accumulated in memory. These results are summed over periodic intervals. This summed result is divided by the number of multiplications to derive the average value over the given intervals. This average value represents watts. Watts are accumulated over seconds, minutes, hours, etc. to calculate KW-Seconds, KW-Minutes, and KW-Hours.

KVAR—The current samples are multiplied by voltage samples taken 90 degrees earlier to calculate VARS. The results of the multiplications are continuously summed over time. The summed result is divided by the number of multiplications to derive VARS.

VA—The calculated values of watts and vars can now be used to calculate volt-amps. The VA value is the square root of (Watts squared+VAR squared).

Data Storage—The present invention contains memory capability both on a microcontroller and an external SRAM. The values of the calculations derived in KW and KWH and VA are initially stored in the microcontroller memory. These values are transferred to SRAM every 5, 10, or 15 minutes (programmable by the utility company). This SRAM is capacitively backed-up to ensure data retention during power outages.

Modem—The present invention includes modem capability designed onto the module for transfer of data to and from a central computer. The modem module (U11) consists of a modem and data access arrangement (DAA) to interface to the phone line. The DAA consists of a transformer built into the module to provide isolation from the phone line as required per FCC Part 68.

The microcontroller initiates transfers to and from the modem via serial ports. The microcontroller commands the modem to initiate calls to a central office at programmed intervals. The modem accepts digital data retrieved from memory by the microcontroller and transferred to the modem. This data consists of an identification number (ID#) unique to the residential customer, the central office phone number, and data representing the power consumption.

A telephone line status detector is provided which functions as a current sensor on the phone line to detect the status of the customers phone. This function is necessary to detect an off-hook status of the residential phone indicating a requirement by the customer to place a phone call. The status detector detects current changes due to a phone going into an off-hook condition. Immediately a signal is sent via an off hook detect output OHD to the microcontroller to provide notification of the customer's requirement to use the phone. Should the modem currently be in a sending/receiving mode, the microcontroller immediately stores existing data and takes the modem off line. This releases the phone line for immediate customer use.

Tamper Switch—A motion sensitive tamper switch is designed to ensure that the meter is not tampered with by unauthorized individuals. The microcontroller immediately detects release of the motion switch via an interrupt signal to the microcontroller. The microcontroller immediately initiates a call to the central office emergency number stored in memory. The time and date of the tamper is also recorded.

Real Time Clock—The meter of the present invention includes a real time clock which provides time and date from 1/100th of a second to years, including leap years. The microcontroller accesses the real time clock at programmable intervals for functions requiring time and date. The microcontroller continually updates capacitively backed memory with data from the real time clock. The meter uses the real time clock for numerous functions. These include time/date to upload data to the central computer, time of power outages, and time-of-use for different rate structures.

LCD Display—The meter includes an LCD display to present usage data. The LCD displays power consumption accumulated to date for the most recent billing period.

Battery Backup—The meter contains a supervisory circuit and associated components to ensure power is retained to the essential components of the electronic circuits for a minimum of fifteen hours. This supervisory circuit operates using a very large value capacitor, to store and release energy sufficient to retain data in the memory and real time clock. The capacitor is charged via the line voltage and held at full charge until power (Vcc) drops low or off. The supervisory circuit detects a drop of Vcc below a set threshold level which is sufficient to ensure power levels to the essential components. When this occurs the supervisory circuit switches the power source to the back-up power capacitor. In addition, a signal is sent to the microcontroller notifying the device to go into standby mode to save data and conserve power. The capacitor provides current to the SRAM containing the consumption data and to the real time clock. Due to the requirement to update consumption data to the SRAM every 5, 10, or 15 minutes (utility company programmable), these are the maximum time intervals respectively for which data would be lost.

OBJECTS OF THE INVENTION

The primary object of the present invention is to provide a new and novel utility meter free from the problems of the prior art.

Another object of the present invention is to provide a meter as characterized above which allows for multi-utility data collection, calculation, storage and transmission for utility billing purposes.

Another further object of the present invention is to provide a meter as characterized above wherein the power usage shall be obtained through direct read components that shall allow the usage to be calculated in kilowatts, kilowatt hours and kilowatt amps.

Another further object of the present invention is to provide a meter as characterized above which is capable of bi-directional communication and can be remotely programmable via a telephone line, without interference to the normal use of the telephone line.

Another further object of the present invention is to provide a meter as characterized above which has a self-diagnostic feature that shall initiate a trouble call for any present or anticipated problems.

Another further object of the present invention is to provide a meter as characterized above which has a local real time display capable of displaying accumulated power usage, time, and date, continuously or on demand.

Another further object of the present invention is to provide a meter as characterized above which includes non-volatile data memory which is updated on predetermined programmable intervals.

Another further object of the present invention is to provide a meter as characterized above which is capable of calling a plurality of programmable telephone numbers and sending discrete data transmissions to each.

Another further object of the present invention is to provide a meter as characterized above which includes a back-up power source to avoid memory loss and to provide power for a real time clock and outage/tamper reporting.

Another further object of the present invention is to provide a meter as characterized above which includes a discrete non-volatile identification number.

Another further object of the present invention is to provide a meter as characterized above which is provided with surge protection for protecting the electronics of the meter from high voltage transient signals.

Another further object of the present invention is to provide a meter as characterized above which accepts viable digital and pulse encoded data from external meters or systems.

Another further object of the present invention is to provide a meter as characterized above which is capable of sensing power outages for a duration of longer than sixty seconds and to report such outages via a telephone line.

Another further object of the present invention is to provide a meter as characterized above which includes tamper detection capabilities for physical intrusion and power disruption and initiates a tamper call via a telephone line.

Another further object of the present invention is to provide a meter as characterized above which is capable of compiling, calculating and storing all of the data samples and including time of use data in a non-volatile memory means.

Another further object of the present invention is to provide a meter as characterized above which contacts a host computer via an existing telephone line.

Another further object of the present invention is to provide a meter as characterized above in which the electronics are an open architecture design to allow for further developments, such as remote disconnect, demand side load management and a variety of communication means.

Another further object of the present invention is to provide a meter as characterized above which includes automatic calibration.

Another further object of the present invention is to provide a meter as characterized above which upon installation calls a host billing computer for initial data such as time, date and instructions.

Another further object of the present invention is to provide a meter as characterized above which automatically converts to a maintenance mode upon a problem report and will display KWs and KVARs on the LCD.

Viewed from a first vantage point, it is an object of the present invention to provide a utility meter, comprising in combination: means for sensing incoming data correlative of a product received from a utility company; means connected to the sensing means for sampling the sensed data; means for storing and accumulating the sampled data; a transmission media; means for transmitting the stored accumulated sampled data at a predetermined interval to the utility company from the meter via the transmission media; and means for acknowledging receipt of the transmitted data by the utility company.

Viewed from a second vantage point, it is an object of the present invention to provide a method for surveying utility output, comprising the steps of: interposing a meter at a product input from the utility adjacent a consuming site; coupling the meter to a communication means; periodically reporting from the consuming site to a remote site via the communication means.

Viewed from a third vantage point, it is an object of the present invention to provide a utility meter, comprising in combination: means for transforming voltage across and current through a first and a second power supply line; means for sampling the transformed voltage and current for providing voltage samples and current samples; a processing means; an interface means operatively coupled to the sampling means and to the processing means; the interface means receiving the voltage samples and the current samples from the sampling means and retaining both the samples until the processing means reads the voltage samples and current samples from the interface means.

Viewed from a fourth vantage point, it is an object of the present invention to provide an automatic utility meter, comprising in combination: a power supply circuit, means for sensing voltage and current waveforms received from a utility company; an analog-to-digital converter connected to the power supply circuit and operatively coupled to the sensing means for receiving and digitizing the voltage and current waveforms into voltage and current samples; a field programmable gate array connected to the power supply circuit and operatively coupled to the analog-to-digital converter for controlling the analog-to-digital converter and for receiving and retaining the voltage and current samples; a processing means connected to the power supply circuit and operatively coupled to the field programmable gate array for reading the digitized voltage and current samples from the field programmable gate array.

Viewed from a fifth vantage point it is an object of the present invention to provide a utility meter, comprising in combination: a power supply circuit; a voltage transformer having a primary operatively coupled across a first power supply line and a second power supply line; the voltage transformer having a first secondary operatively coupled to the power supply circuit and a second secondary outputting a first voltage signal; a first current transformer and a second current transformer respectively coupled in line with the first and the second power supply line; a first converter circuit operatively coupled to the first current transformer for generating a second voltage signal proportional to a current in the first power supply line; a second converter circuit operatively coupled to the second current transformer for generating a third voltage signal proportional to a current in the second power supply line; sampling means operatively coupled to the first converter circuit, the second converter circuit and to the secondary of the voltage transformer wherein the sampling means samples the first voltage signal, the second voltage signal and the third voltage signal; a control means connected to the power supply circuit; the control means operatively coupled to the sampling means for controlling the sampling means and receiving the first, the second, and the third voltage samples from the sampling means; a processing means connected to the power supply circuit and operatively coupled to the control means; the processing means reading the first voltage samples and reading and summing the second and the third voltage samples together to obtain resultant samples; a hardware multiplier connected to the power supply circuit and operatively coupled to the control means; the control means receiving the first voltage samples and the resultant samples from the processing means and transferring the first voltage samples and the resultant samples to the multiplier wherein the multiplier multiplies the first voltage samples by the resultant samples to form product samples; the control means receiving the product samples from the multiplier, and the processing means reading the product samples from the control means wherein the product samples are processed by the processing means to obtain a watt time value.

These and other objects will be made manifest when considering the following detailed specification when taken in conjunction with the appended drawing figures.

BRIEF DESCRIPTION OF THE DRAWINGS

FIG. 2 is a plan front view of a conventional electric utility box showing electric utility lines entering and exiting the utility box.

FIG. 3 is a first side view of the utility meter according to the present invention.

FIG. 14 is a portion of the master schematic shown in FIG. 13 detailing a pair of current sensors, a step down transformer and a power supply circuit.

DESCRIPTION OF PREFERRED EMBODIMENTS

Figure 1:
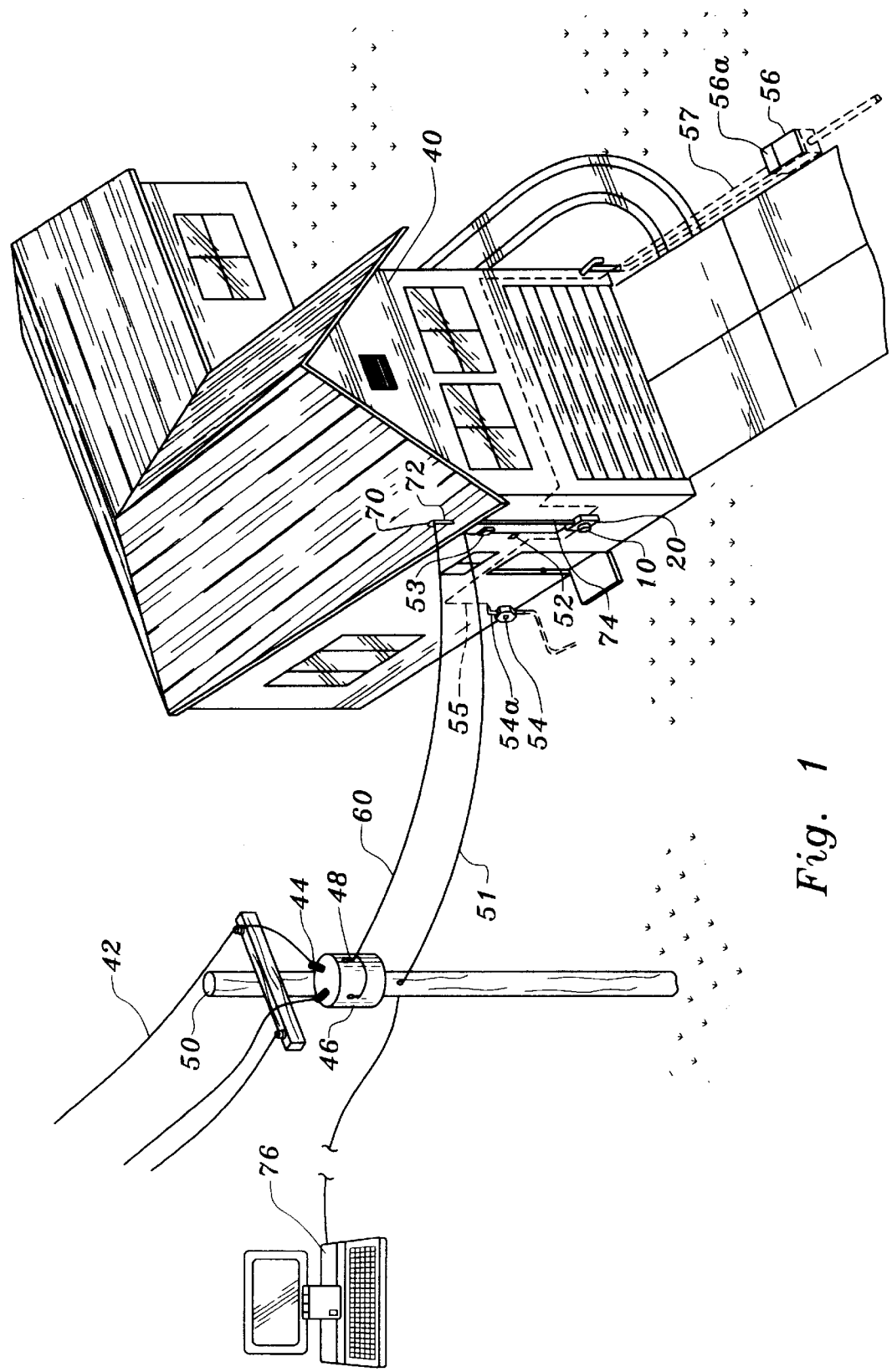
FIG. 1 is an elevational view of a utility meter according to the present invention which is shown disposed on a side of a building to which utilities are being supplied.

Considering the drawings, wherein like reference numerals denote like parts throughout the various drawing figures, reference numeral 10 is directed to the utility meter according to the present invention.

Figure 12:
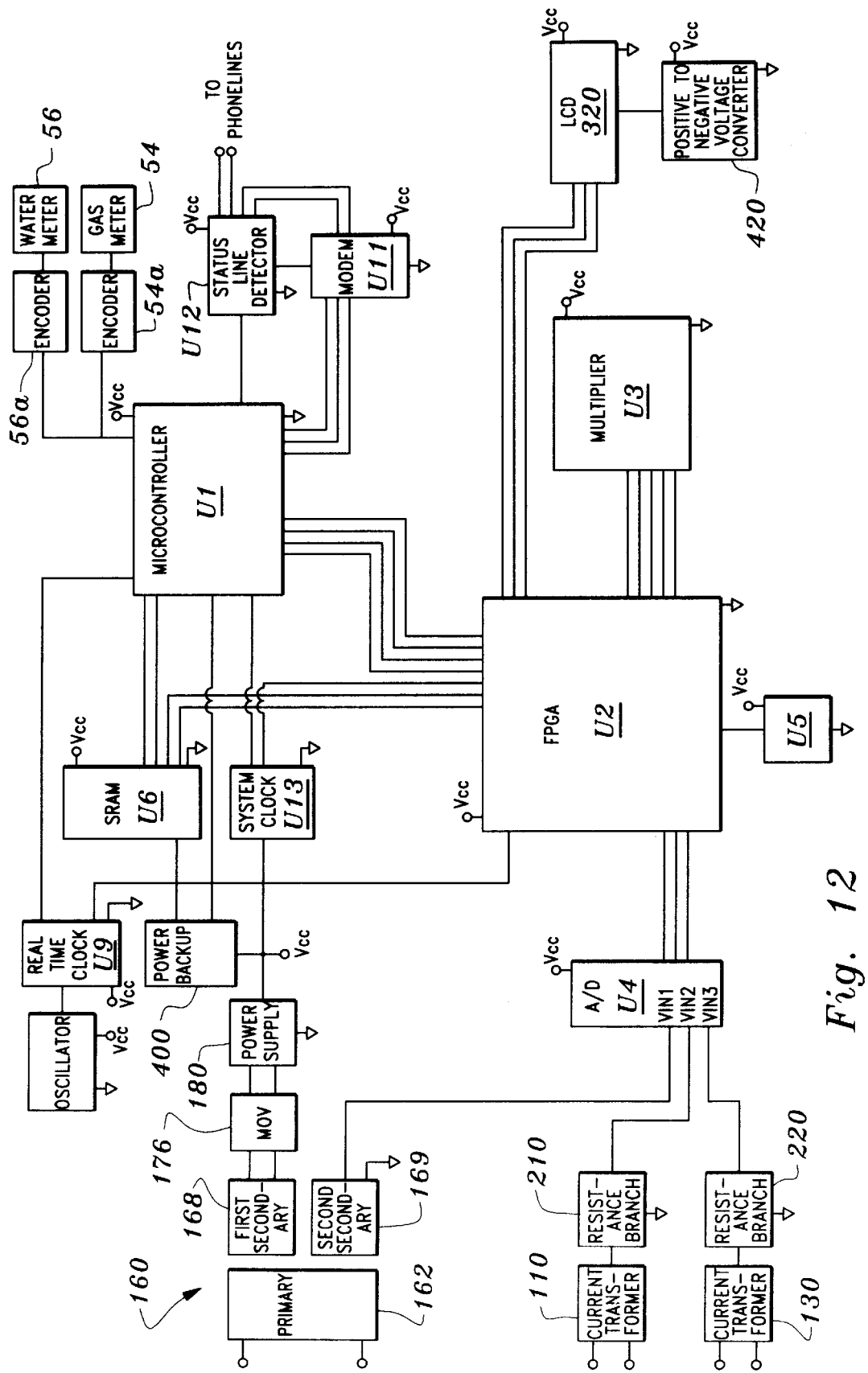
FIG. 12 is a block diagram detailing the electronics associated with the utility meter.

In essence, and referring to FIGS. 1, 2 and 12, the utility meter 10 includes a transformer 160 having a primary 162 and a first and a second secondary 168, 169 respectively. The primary 162 is operatively coupled across a first and second power supply line 62, 64. The first secondary is operatively coupled to a DC power supply circuit 180 which powers electronic circuitry of the meter 10. The second secondary 169 of the transformer 160 provides a first voltage waveform.

In addition, the utility meter 10 includes a first and a second current sensor 110, 130 each respectively coupled in line with the first power line 62 and the second power supply line 64. The outputs of the current sensors 110, 130 are coupled to a first and second converter circuit 210, 220 respectively. The converter circuits 210, 220 output a second and a third voltage waveform proportional to the current in the first and second power line 62, 64.

An analog-to-digital converter (ADC) U4 is operatively coupled to the second secondary 169 and to the first and second converter circuit 210, 220 for receiving the corresponding voltage waveforms therefrom. The voltage waveforms are converted to digital samples which will subsequently be used to perform power usage calculations.

A field programmable gate array (FPGA) U2 interfaces the analog-to-digital converter U4 to a processing means U1. The FPGA U2 receives the digital samples and retains them in registers until they are read by the processing means U1. The digital samples are processed by the processing means into an X and Y operand format and then written to the FPGA U2.

A hardware multiplier U3 is operatively coupled to the FPGA U2 and receives the X and Y operands therefrom. The multiplier U3 multiplies the X operands by the Y operands to form product samples which are transferred to the FPGA U2. The FPGA U2 retains the product samples until they are read by the processing means. The processing means stores, accumulates and processes the product samples to obtain a watt-time values, for example, a KW-seconds.

Moreover, the digital samples are processed by the processing means to obtain X and Y operands which are 90 degrees out of phase. These out of phase operands are multiplied together as delineated supra and are stored, accumulated and processed by the processing means to obtain VARs.

A data storage means (SRAM) is operatively coupled to the FPGA and the processing means. The KW and VAR data is transferred to the SRAM under the control of the FPGA.

A modem U11 is operatively coupled to the processing means U1 and a communication line for transferring data to and from a remote computer. The processing means initiates the transfer of, inter alia, data correlative to power consumption and commands the modem to upload the data to the remote computer.

Furthermore, a real time clock is coupled to the processing means and accessed at programmable intervals for functions requiring time and date.

An alphanumeric display is operatively coupled to the FPGA and under its control displays, inter alia, data correlative to power consumption.

Furthermore, a tamper switch provides tamper protection and a power back-up supply provides a back-up power source to B, inter alia, the SRAM U6 in case of a utility power outage.

More specificaly, and referring to FIG. 1, the utility meter 10 is shown operatively coupled to a conventional utility box 20. Typically, the utility box 20 is mounted on the side of a home or other building 40 to which electrical power is being supplied. The electrical power is supplied to the building 40 via high voltage AC power lines 42 which feed into a primary side 44 of a step-down transformer 46 shown mounted on power line pole 50. A secondary side 48 of the step-down transformer 46 is operatively coupled to a service drop cable 60 which may include one or more hot conductors and neutral conductors. Typically, there are two hot conductors 62, 64 and one neutral conductor 66 (please see FIG. 2). The conductors 62, 64 and 66 enter an upper end 70 of a riser conduit 72 and pass through to a lower end 74 where the conductors exit into and couple to the utility box 20. Preferably, the lower end 74 of the riser conduit 72 is coupled to utility box 20. AC power is branched from the utility box 20 to a circuit panel 30 via a main circuit breaker 32 or the like, for further distribution throughout building 40.

Typically, a telephone service wire 51 extends from the power line pole 50 to the building 40 where the wire 51 couples to a telephone service box 53. The telephone service box 53 is preferably mounted on the building 40 and operatively couples the telephone service wire 51 with the meter 10 via a telephone service line 52. The preferred method utilized to transfer data from the meter 10 to a host billing computer 76 is via the telephone service wire 51. In addition, a gas meter 54 associated with building 40 is preferably provided with an encoder 54a to digitally encode amounts of gas used by the consumer. A signal cable 55 couples the encoder 54a to the meter 10. Furthermore, a water meter 56 associated with the building 40 is preferably provided with an encoder 56a to digitally encode the water usage by the consumer. A signal cable 57 connects the encoder 56a to the meter 10.

Referring to FIG. 2, the conventional utility box 20 includes a four jaw socket having sockets 22, 24, 26 and 28. The utility meter 10 directly couples with the four socket 22, 24, 26 and 28 of the utility box 20. Preferably, hot conductor 62 is coupled to socket 22and hot conductor 64 is coupled to socket 24. Hot conductors 62 and 64 are reestablished at sockets 26 and 28 respectively and are both ultimately wired to the main breaker 32. Ultimately conductors 62, 64 and 66 are wired to a circuit breaker panel 30 for further distribution throughout building 40. Thus, standard 120 volt outlets are then operatively coupled between conductor 62 and/or conductor 64 and the neutral conductor 66. A 220 -volt outlet may be operatively coupled across hot conductors 62 and 64. Note that the conductors coupled to socket 22 and 24 are both hot conductors carrying currents which may be out of phase.

Figure 8:
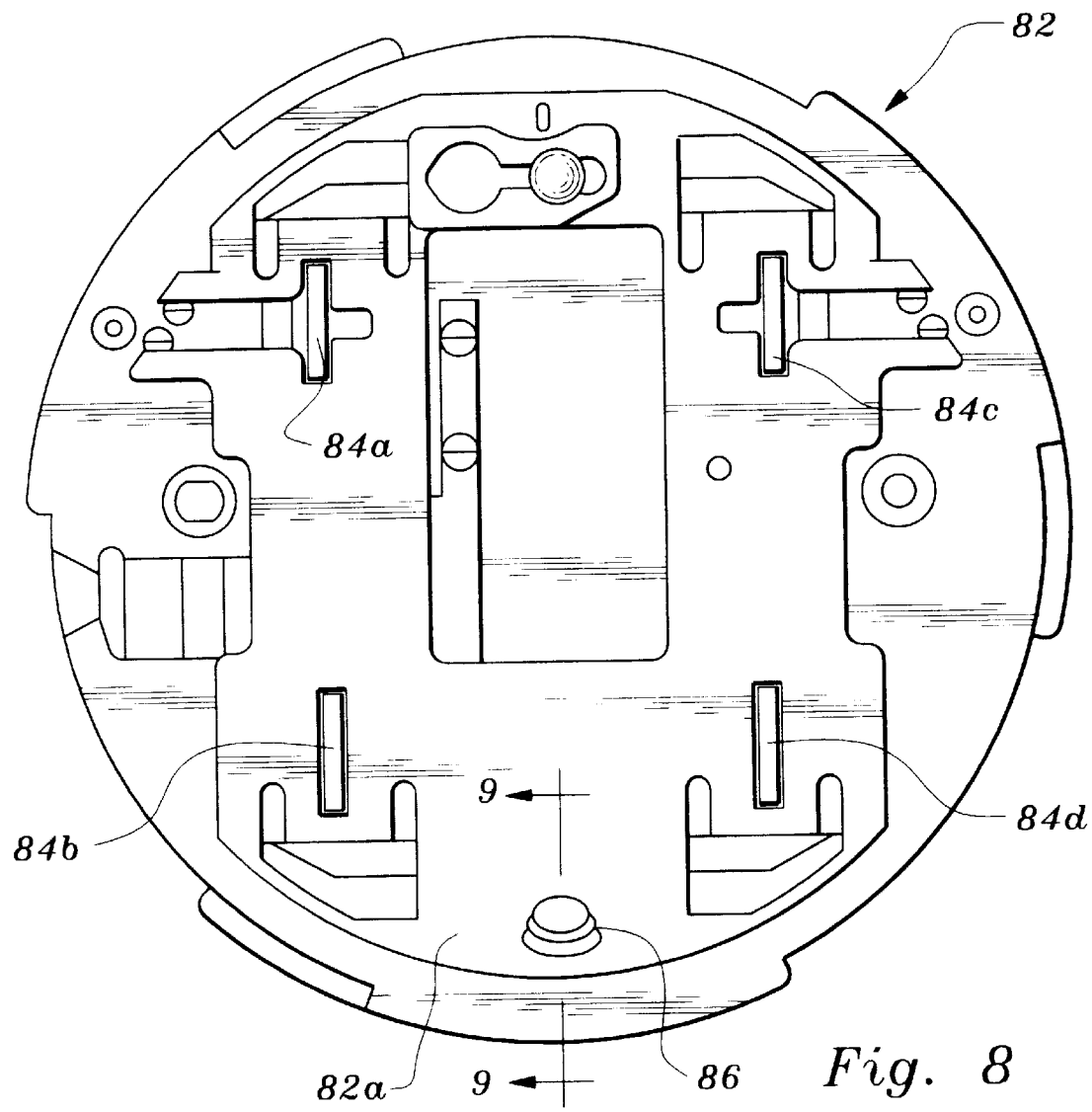
FIG. 8 is as bottom plan view of a base plate of the utility meter according to the present invention.
Figure 9:
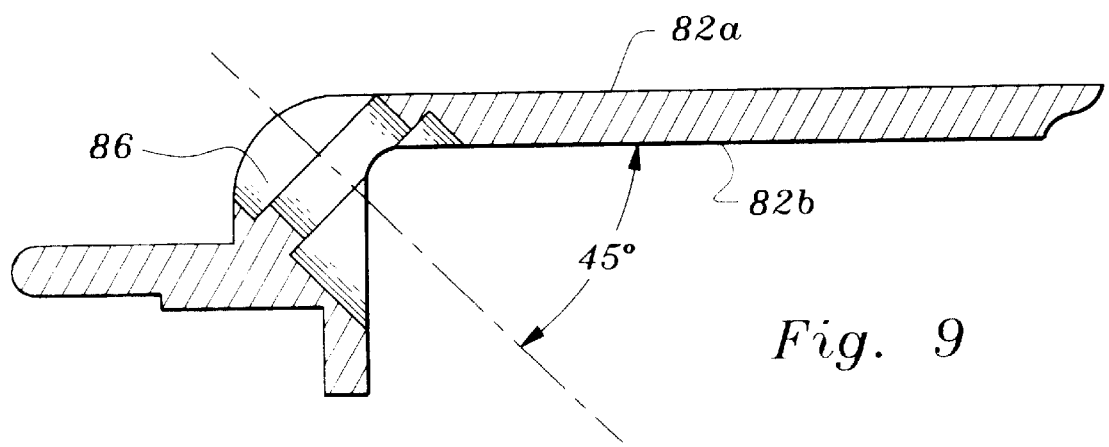
FIG. 9 is a partial sectional view taken along lines 8—8 and rotated 90 degrees in a clockwise direction.
Figure 10A:
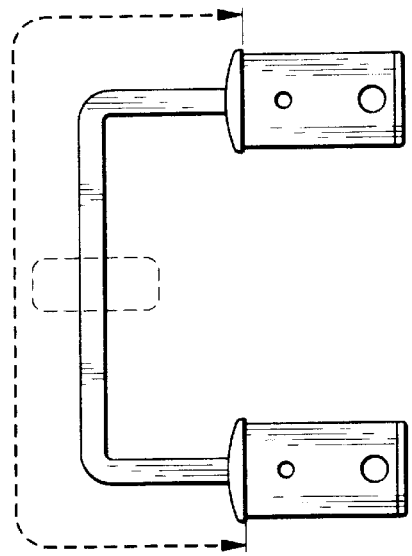
FIG. 10A is a front plan view of a first current sensor according to the present invention.
Figure 10B:
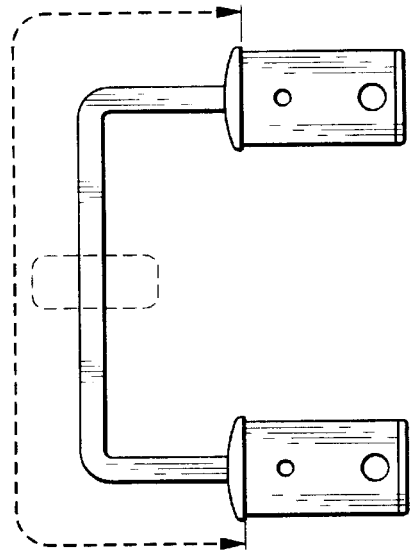
FIG. 10B is a front plan view of a second current sensor according to the present invention.
Figure 10C:
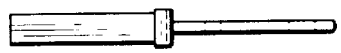
FIG. 10C is a second side view of that which is shown in FIG. 10A.
Figure 10D:
FIG. 10D is a second side view of that which is shown in FIG. 10B.
Figure 11A:
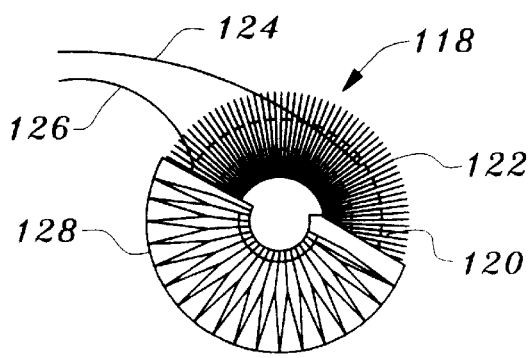
FIG. 11A is a top plan view of a first coil according the present invention.
Figure 11B:
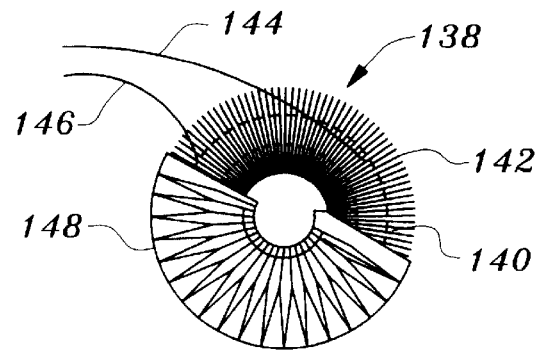
FIG. 11B is a top plan view of a second coil according to the present invention.
Figure 11C:
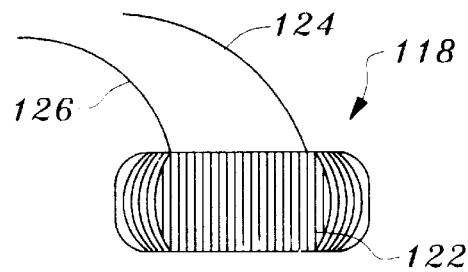
FIG. 11C is a side plan view of that which is shown in FIG. 11A.
Figure 11D:
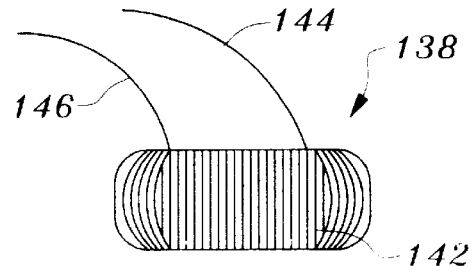
FIG. 11D is a side plan view of that which is shown in FIG. 11B.

Referring to FIGS. 3, 8 and 8A, a sealed enclosure 80 protects the electronic components and associated hardware of the meter 10 from the environmental elements and from being tampered with. The enclosure 80 preferably includes a base plate 82 and a glass or plastic housing 92 extending therefrom. Preferably, a collar 98 detachable couples the housing 92 to the base plate 82. In addition, and referring to FIGS. 8 and 8A, the base plate 82 includes an opening 86 such that a connection cable may be routed through for operatively interconnecting the meter 10 with telephone service wire 51, the gas meter 54 and the water meter 56. Preferably, the opening 86 is C-bored from both a back surface 82a and a front surface 82b of the base plate 82. Furthermore, the opening 86 is preferably inclined away from the front surface 82b of the base plate 82. Preferably, the opening 86 is inclined at an angle from the front surface 82b of the base plate 82 of approximately 45 degree (please see FIG. 9 ). Thus, the connection cable is allowed to enter the enclosure 80 without being pinched between the back surface 82a and the utility box 20 when the meter 10 is coupled thereto. Preferably, the connection cable is a five pair twisted cable including a pigtail connection.

Figure 4:
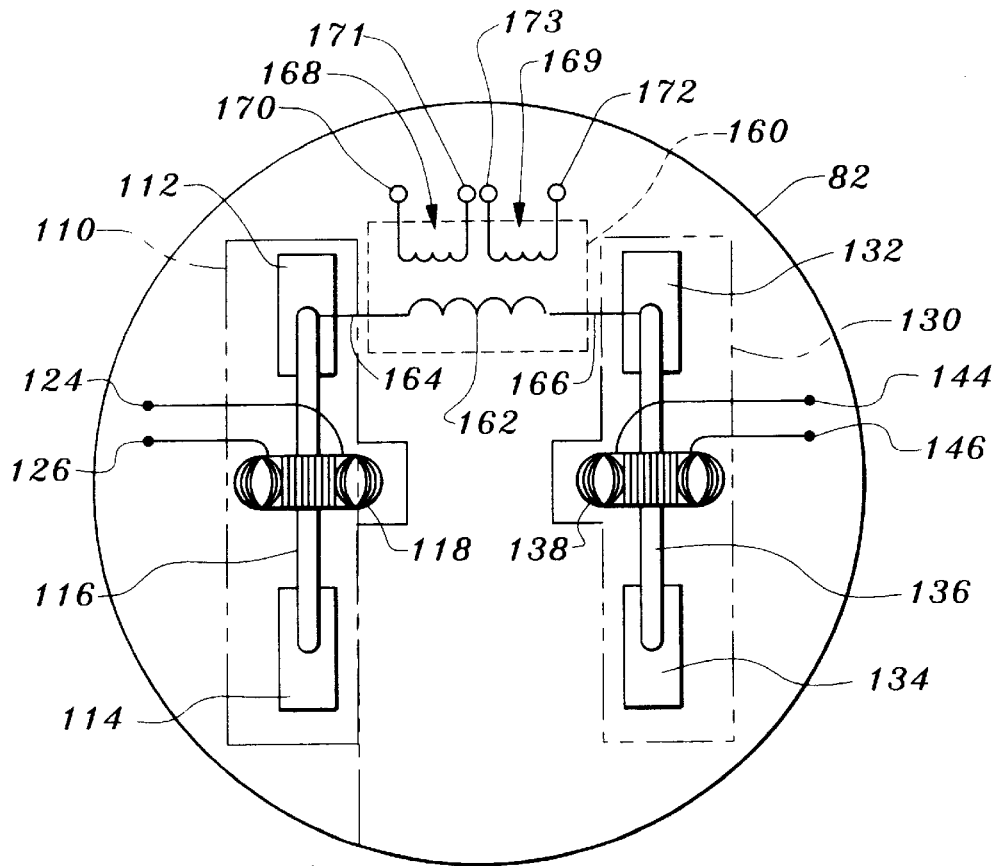
FIG. 4 is a top plan view of a pair of current sensors and a voltage sensor according to the present invention.

Referring to FIGS. 3 and 4, the meter 10 includes two current sensors 110, 130 which are substantially internal to the enclosure 80 of the meter 10 and are preferably mounted on base plate 82 of meter 10. Each current sensor 110, 130 includes a pair of stabs 112, 114 and 132 , 134 respectively which are silver soldered to solid conductor 116 and 136, respectively. The four stabs 112, 114, 132 and 134 extend beyond the enclosure 80 via similarly sized openings 84a, 84b, 84c and 84d disposed in the base plate 82 (please see FIG. 8). The openings 84a, 84b, 84c and 84d are disposed in a pattern which correlates with the sockets of the utility box 20 such that the stabs 112, 114, 132 , 134 may pass through the openings 84a–d and plug directly into the corresponding sockets 22, 24, 26, 28 of the utility box 20.

Figure 13:
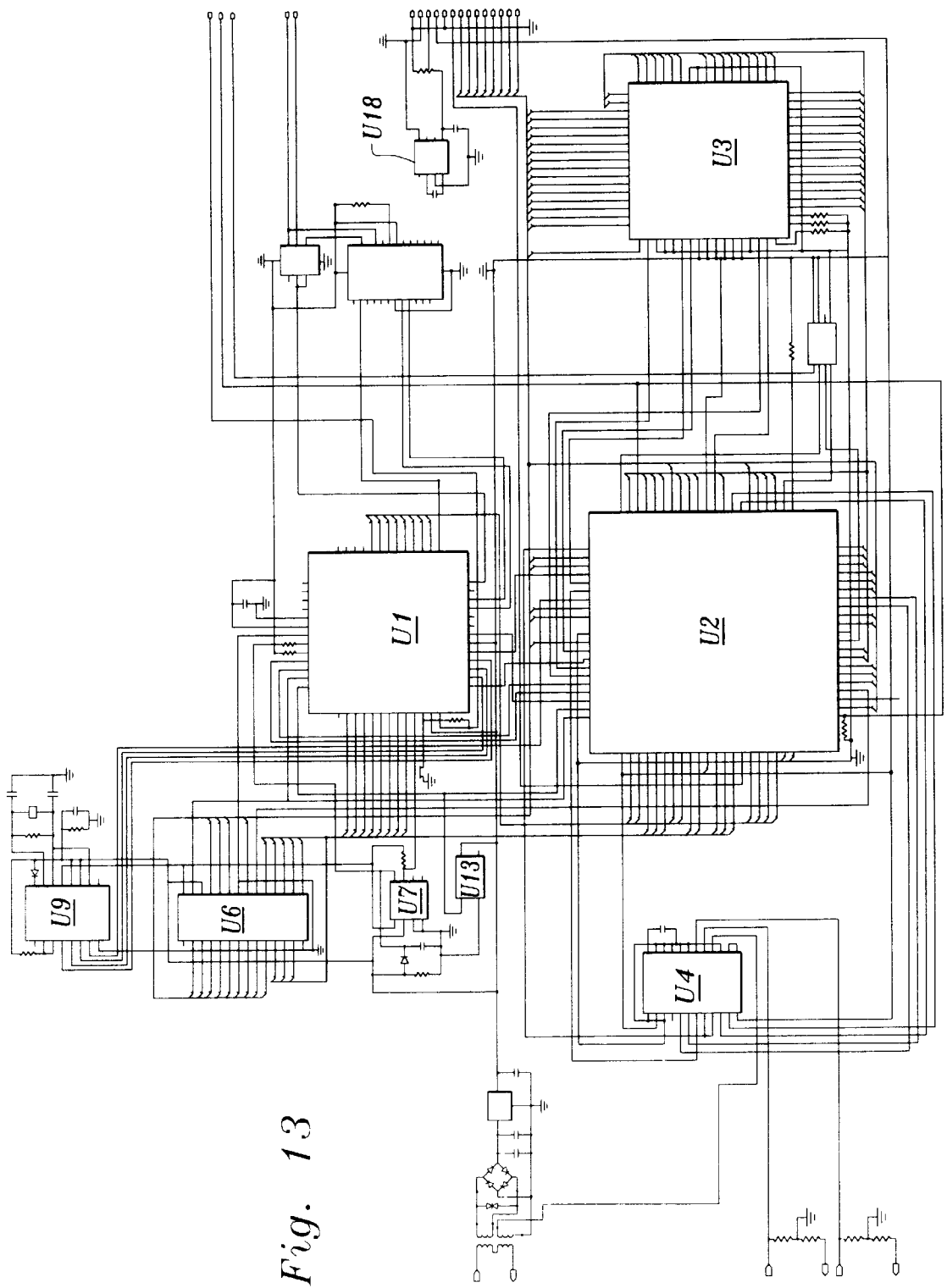
FIG. 13 is a master schematic of the electronics associated with the utility meter.

Each pair of stabs 112, 114 and 132, 134 are interconnected by a single conductive branch. Specifically, a first branch 116 interconnects stab 112 with stab 114 and a second conductive branch 136 interconnects stab 132 with stab 134. These conductive branches 116, 136 are preferably internal to the enclosure 80. A first inductive coil 118 circumscribes branch 116 and a second conductive coil 138 circumscribes branch 136. Referring to FIGS. 12 and 13, each inductive coil 118, 138 preferably includes a ferrous ring 120, 140 which is wrapped with one thousand (1,000) turns of wire 122, 142. Thus, the current sensors 110 and 130 transform the current by a ratio of 1:1000 to generate values on the leads 124, 126 and 144, 146 which are in the milliampere range. Utilizing this scaling factor eliminates the need for additional components to achieve the desired range used in the microelectronics of the meter 10.

Preferably, 30 -gauge wire is used for the thousand turns of wire 122 and wire 142. Wire wrap 122 and 142 each respectively include leads 124, 126 and 144, 146. Preferably, the ends of all leads are tinned. Each wire wrap 122, 142 is preferably tape wrapped with cloth tape 128, 148 and epoxy-coated. In addition, each conductive branch is preferably dip-coated with insulation which is approximately fifteen thousandths (0.015) of an inch thick.

Referring to FIG. 4, a voltage transformer 160 is operatively coupled between stabs 112 and 132. Specifically, a primary side 162 is coupled to stabs 112 and 132 via leads 164, 166 respectively. The voltage transformer 160 is a step down transformer which reduces a high voltage value of approximately 240-volts RMS induced on the primary side 162 to approximately 10-volts RMS induced on each of the secondary coils 168, 169. Voltage is outputted from a first secondary coil 168 via leads 170, 171 and also from a second secondary coil 169 via leads 172, 173. Note these voltages are isolated from each other. Therefore, the voltage and current waveforms entering the meter 10 are transformed by the current sensors 110, 130 and voltage transformer 160 to values within ranges acceptable for powering, processing and measuring by the electronic circuitry of the meter 10.

Figure 7:
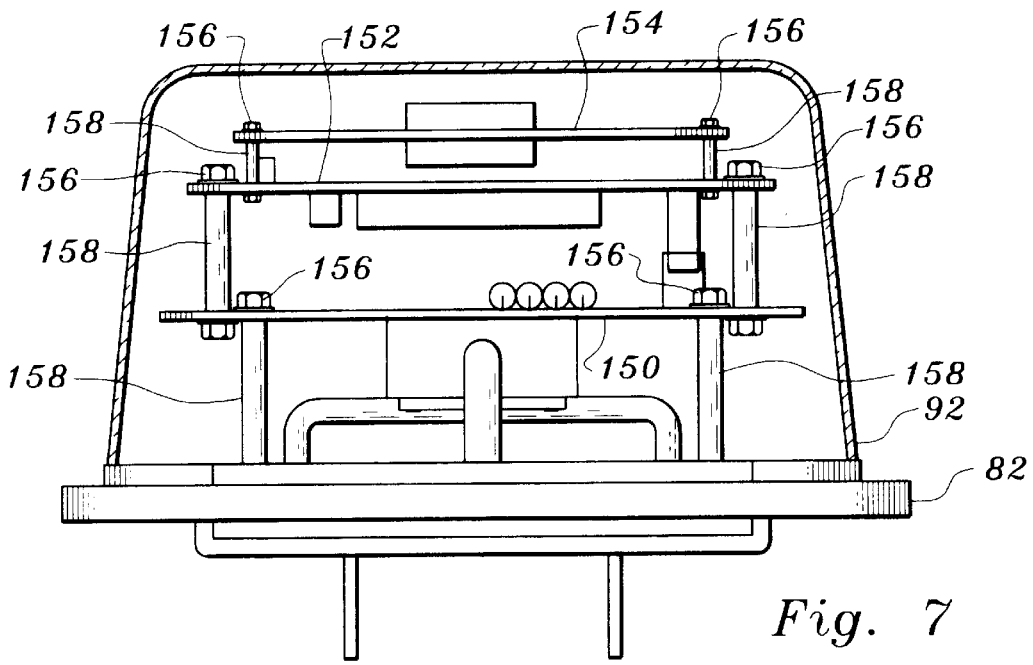
FIG. 7 is a second side view of the utility meter according to the present invention.

Referring to FIG. 7, the electronic circuitry coupled to current sensors 110, 130 and the voltage transformer 160 are disposed in a modular format. Preferably, there are three modules 150, 152 and 154 which are disposed in a spaced-apart parallel fashion. However, more or less modules may be provided. These modules are coupled together and to the base plate 82 of the enclosure 80 via bolts 156 and stand-off 158.

Figure 5:
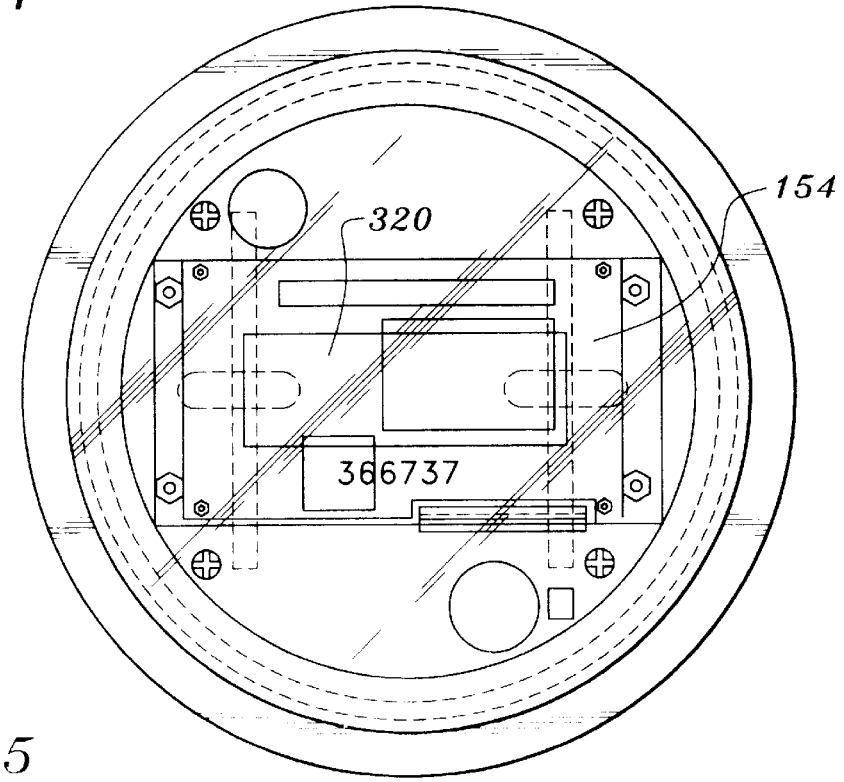
FIG. 5 is a top plan view of the utility meter according to the present invention.
Figure 6:
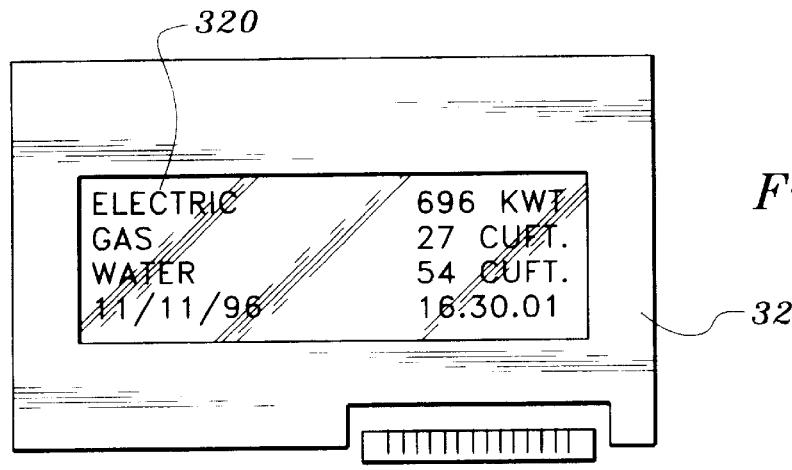
FIG. 6 is a front plan view of a display means according to the present invention.
Figure 7A:
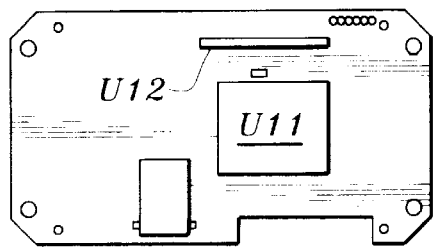
FIG. 7A is a top plan view of a middle module shown in FIG. 7.
Figure 7C:
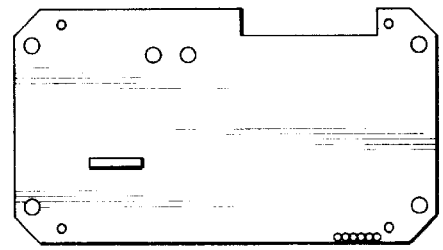
FIG. 7C is a bottom plan view of that which is shown in FIG. 7A.
Figure 7B:
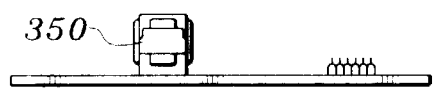
FIG. 7B is a side view of that which is shown in FIG. 7A.
Figure 7D:
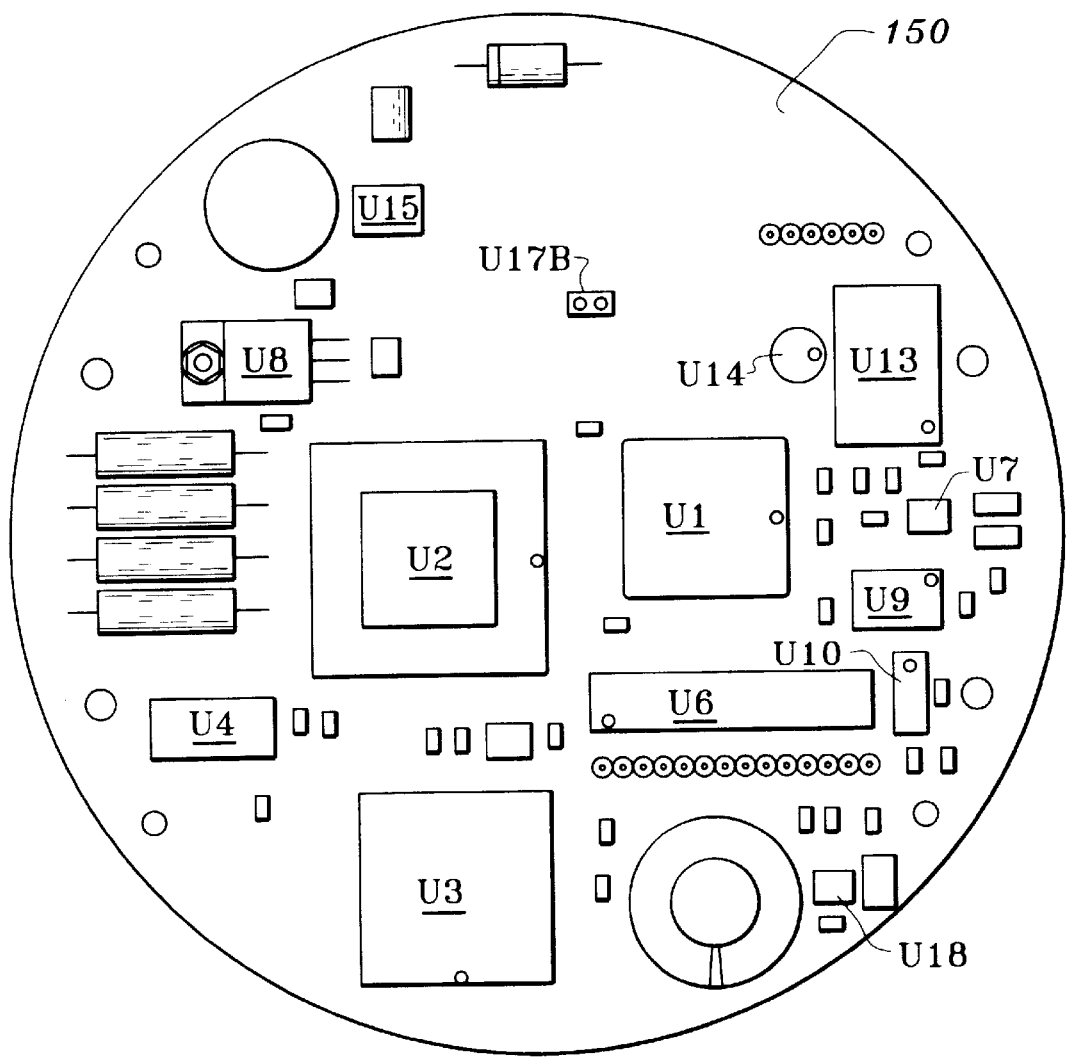
FIG. 7D is a top plan view of a bottom module shown in FIG. 7.
Figure 7E:
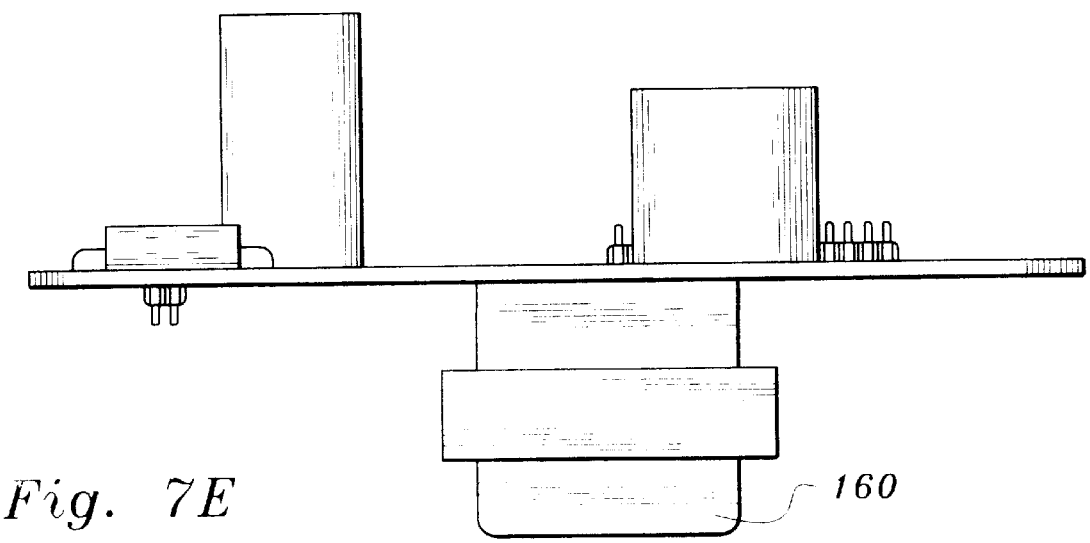
FIG. 7E is a side view of that which is shown in FIG. 7D.

Module 154 preferably includes a liquid crystal display (LCD) 320 and an associated driver board 321 (please see FIGS. 5 and 6). Referring to FIGS. 7A through 7C, module 152 preferably includes a DC power supply circuit 180 (FIG. 14), communications circuitry comprising a telephone receptacle 350 (FIG. 7B), a modem U11 and a telephone line status detector U12. Referring to FIGS. 7D and 7E, module 150 preferably includes an analog-to-digital conversion means U4, a field programmable gate array U2 having a perimeter of input-output blocks, a core array of configurable logic blocks and resources for interconnection, a microcontroller U1, a hardware multiplier U3, a negative voltage regulator U18 and associated discrete electronic components.

The voltage transformer 160 is preferably mounted on module 150 (FIG. 7E). The voltage transformer scales the 240-volt RMS voltage received from the power lines to a pair of 10-volt RMS voltages used in determining power consumption and for transforming into a DC signal needed to power the electronic circuitry of the meter 10.

Referring to FIG. 14, the DC power supply circuit 180 includes a four-way bridge rectifier 182, a plurality of discrete capacitors C1, C2 and C3 and preferably an IC-voltage regulator 192. The four-way bridge rectifier 182 has input leads 184, 186 operatively coupled to the secondary leads 170, 171 respectively of the voltage transformer 160. In addition, a transient suppressor 176 parallels these leads to protect against high voltage transients. Preferably, the transient suppressor is a metal oxide varistor (MOV) 176 which clips transients to some maximum voltage that is well within the range tolerated by the DC power supply circuit 180. The output leads 188, 190 of the four-way bridge rectifier 182 are operatively coupled to the input 194 of the voltage regulator 192 and to circuit ground 200, respectively. Capacitor C1 is coupled in a parallel fashion across the output leads 188, 190 of the bridge rectifier 182. Capacitor C1 is a filter capacitor whose job is to maintain the DC voltage level and minimize any AC ripple voltage riding on the DC voltage level output of the bridge rectifier 182. Capacitor C2 is coupled across the output leads 188, 190 of the bridge rectifier 182 but is preferably coupled close enough to the IC voltage regulator 192 so that it may also filter the DC voltage level outputted by bridge rectifier 182 to ensure a pure DC voltage level and to also suppress the transient noise that sometimes enters the DC power supply circuit 180 from external sources. These noise pulses can interrupt the operation of the regulator 192 and also affect its reliability. Thus, to prevent this problem, C2 is preferably mounted as close as possible to the IC voltage regulator 192. Capacitor C2 is often mounted directly to the device.

The job of the voltage regulator 192 is to keep the output voltage constant despite changes in input voltage, and changes in input load current requirements. Preferably, a typical three-terminal IC regulator such as a 7805 manufactured by National Semiconductor is used for the voltage regulator 192. Capacitor C3 is operatively coupled between the output 196 (Vcc) of the voltage regulator 192 and circuit ground 200. The purpose of capacitor C3 is also to suppress any transient noise that enters the DC power supply from external sources. In addition, capacitor C3 may smooth out variations in the output voltage that are caused by sudden changes in the load current demand by the electronic circuitry which is coupled thereto.

Thus, the DC power supply circuit 180 provides a stable 5-volt signal output between the voltage regulator output 196 (Vcc) and circuit ground 200. The power requirements of the electronic circuitry is provided by this DC power supply circuit 180.

Figure 15:
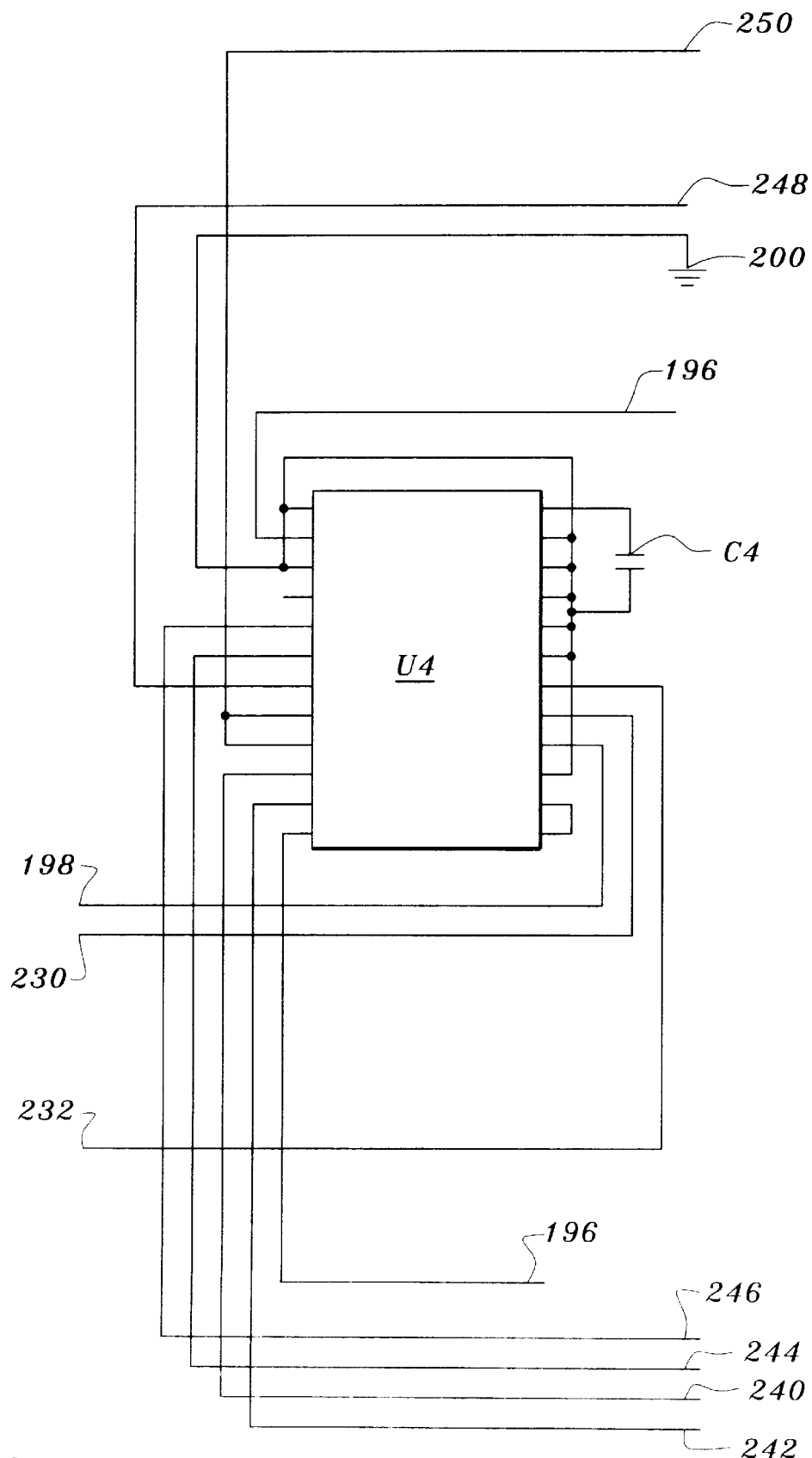
FIG. 15 is a section of the master schematic showing an analog to digital converter.

Referring to FIGS. 14 and 15, a voltage signal VIN1 developed across the second secondary coil 169 of the transformer 160 is one variable used in determining power consumption. The voltage signal VIN1 is delivered, via line 198, to pin 16 of the analog-to-digital converter (ADC) U4 for sampling and conversion. In addition, the output current I1 from the inductive coil 118 of the current sensor 110 is directed to a first precision resistance branch 210 to generate a voltage signal VIN2 at line 230. VIN 2 is coupled via line 230 to pin 17 of the ADC U4 for sampling and conversion. Similarly, the output current I2 from the inductive coil 138 is directed to a second precision resistance branch 220 to generate voltage signal VIN3 at line 232. VIN3 is coupled via line 232 to pin 18 of the ADC U4 for sampling and conversion.

The first precision resistance branch 210 preferably includes a resistor R2 and a resistor R3, both preferably having a 50 ohm value, coupled in series with each other and in parallel across leads 124, 126 of the inductive coil 118. The common connection between R2 and R3 is operatively coupled to circuit ground 200. Likewise, the second precision resistance branch 220 preferably includes a resistor R4 and a resistor R5, both preferably having a 50 ohm value, coupled in series with each other and in parallel across leads 144, 146 of the inductive coil 138. The common connection between R4 and R5 is operatively coupled to circuit ground 200.

Voltage signals VIN1 line 198, VIN2 line 230 and VIN3 line 232 are single ended analog inputs having a voltage input range of plus or minus 10 volts. Preferably, the analog-to-digital converter U4 is an eight-channel 12-bit data acquisition system. The analog-to-digital converter U4 may be implemented using an AD7890-10 manufactured by Analog Devices.

One function of the ADC U4 is to translate the analog sinusoidal waveforms VIN1, VIN2 and VIN3 to 16-bit serial digital data streams representative of the magnitude of the current and voltage supplied to building 40. These 16-bit serial digital data streams consist of one leading zero, preceding the three address bits of the control register and the twelve bits of conversion data. The output coding from the ADC U4 is 2's complement. The 16-bit serial digital data stream output from pin 10 of the ADC U4 is transferred, via line 240, to pin 60 (designated D5-1048) of the field programmable gate array (FPGA) U2.

Referring to FIGS. 14 and 15, the power Vcc for the A/D converter U4 is provided by the DC power supply circuit 180 via line 196 which is operatively coupled to Pin 12which has the designation of VDD. Pin 1 (AGND1) of U4 is an analog ground and is operatively coupled to the circuit ground 200. In addition, a digital ground Pin 3 (DGND), of U4 is also operatively coupled to circuit ground 200. Preferably, all on-used analog input channels are also operatively coupled to circuit ground 200. Capacitor C4 operatively couples Pin 24 to circuit ground 200. Pin 24 has the designation of REF Out- REF In and is the voltage reference input/output port. Capacitor C4decouples Pin 24 from Pin 15 which is second analog ground having the designation AGND2. Pins 13 and 14 of U4 have the respective designation of MUX Out and SHA In and are preferably connected together as a result of there being no requirement for an external anti-aliasing filter.

The field programmable gate array U2which in turn transfers the data to the hardware multiplier U3so that rapid multiplication operations may be performed thereon. The voltage values VIN1, VIN2 and VIN3 are also read by the microcontroller U1 for VAR calculations.

Figure 16:
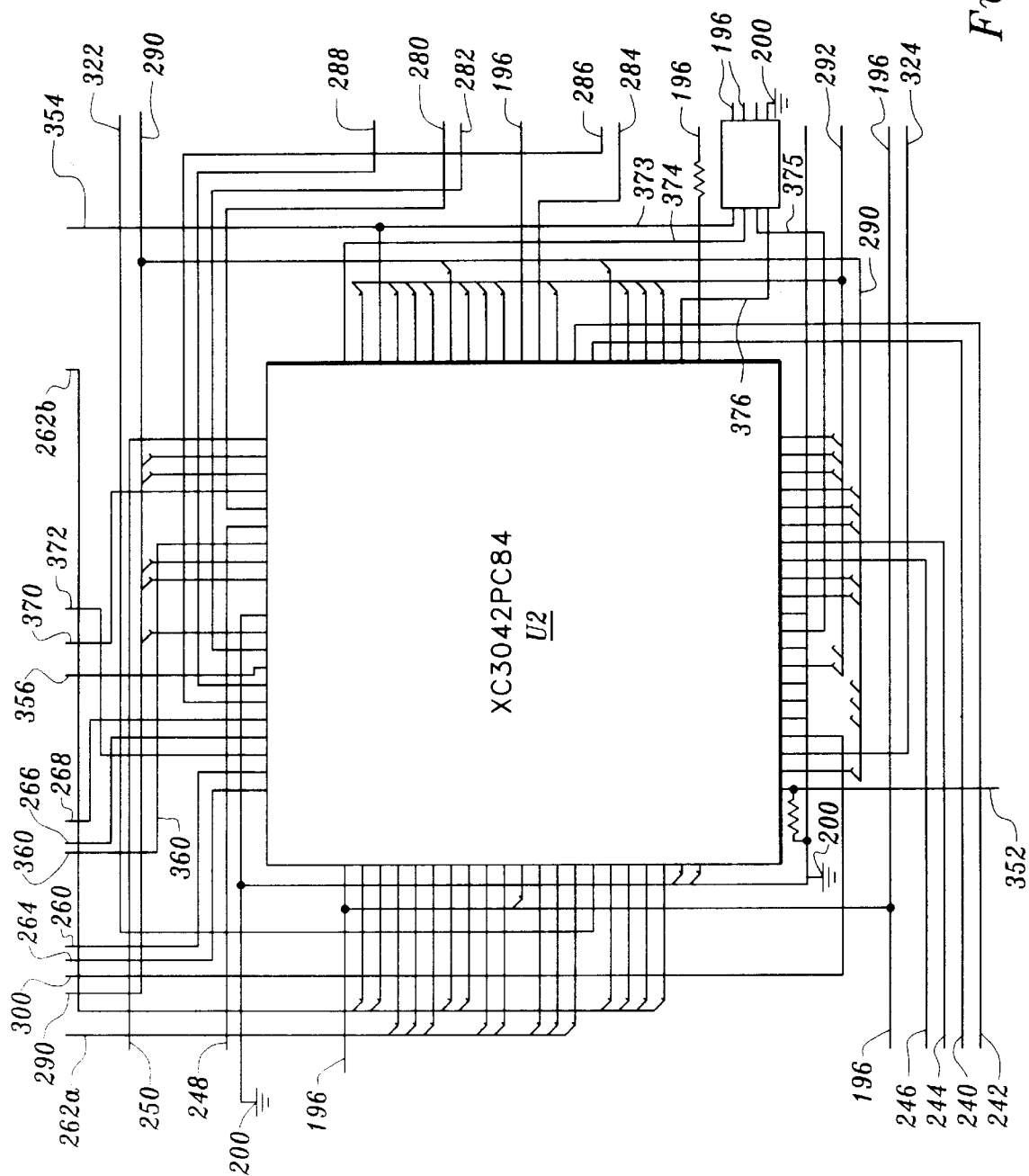
FIG. 16 is a section of the master schematic showing a field programmable array.

Referring to FIG. 16, the field programmable gate array (FPGA) U2 controls the operation of the analog-to-digital converter (ADC) U4. Specifically, FPGA U2 sends a 16-bit serial stream of instructions to communicate with the ADC U4. These instructions are received at Pin 11 (designated Data-in) of U4. Furthermore, the analog-to-digital conversion process and the clocking input are also controlled by the FPGA U2. The FPGA U2 sends a clocking input along line 244 which is received at Pin 6 (CLK_IN) of U4. The signal to begin the analog-to-digital conversion process is sent from the FPGA U2 along line 246 and is received at Pin 5 which has the designation of CONVST which represents the terms "Convert Start". An analog-to-digital conversion interface enable signal is sent from the FPGA U2 along line 250 to Pin 8 and Pin 9 of U4. Pin 8 is the transmit frame synchronization pulse pin and Pin 9 is the receive frame synchronization pulse pin. For applications that require that data be transmitted and received at the same time, Pins 8 and 9 are connected together as shown in FIG. 15.

Figure 22:
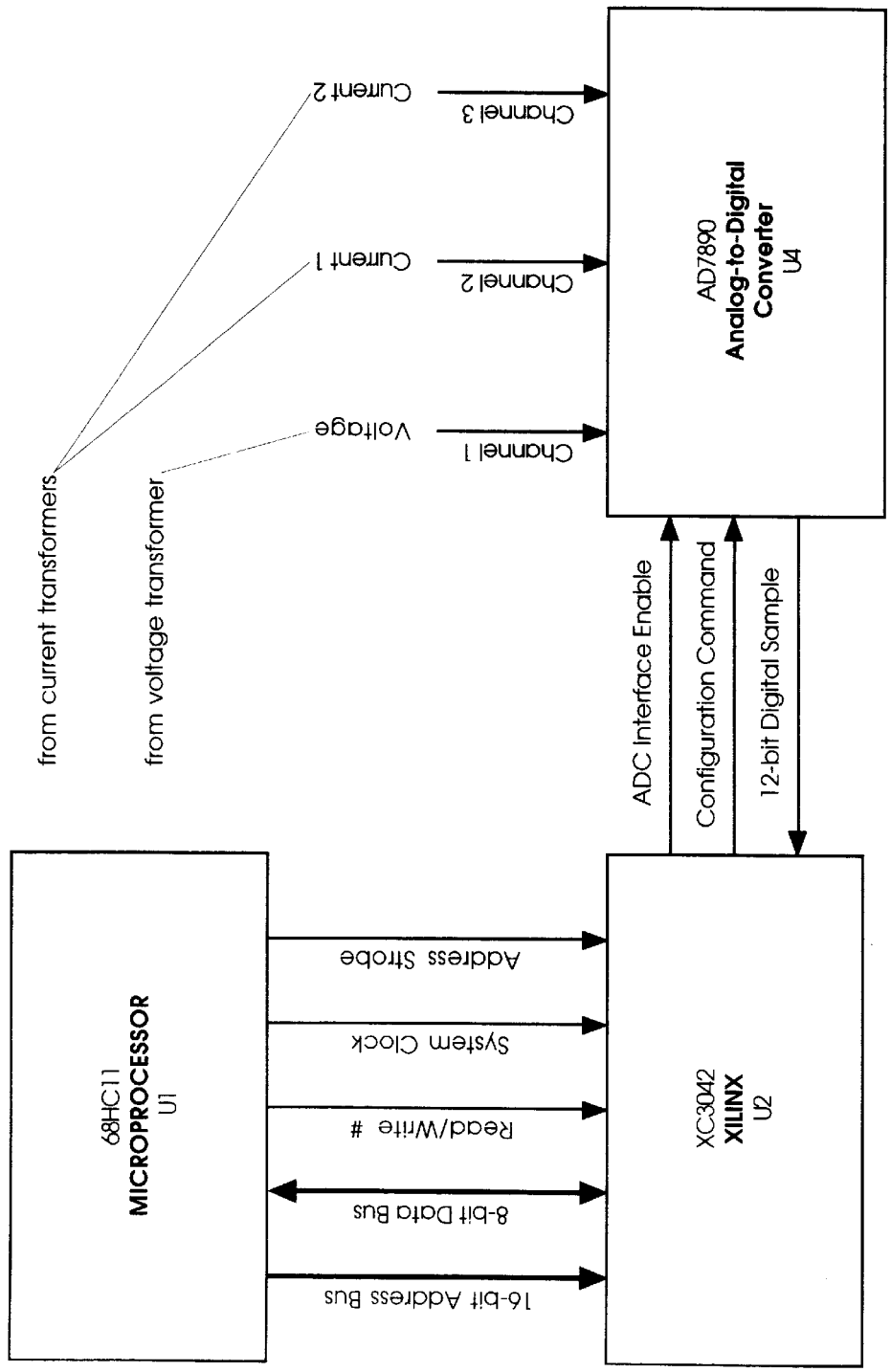
FIG. 22 is a block diagram of the microcontroller to analog to digital converter interface.
Figure 23:
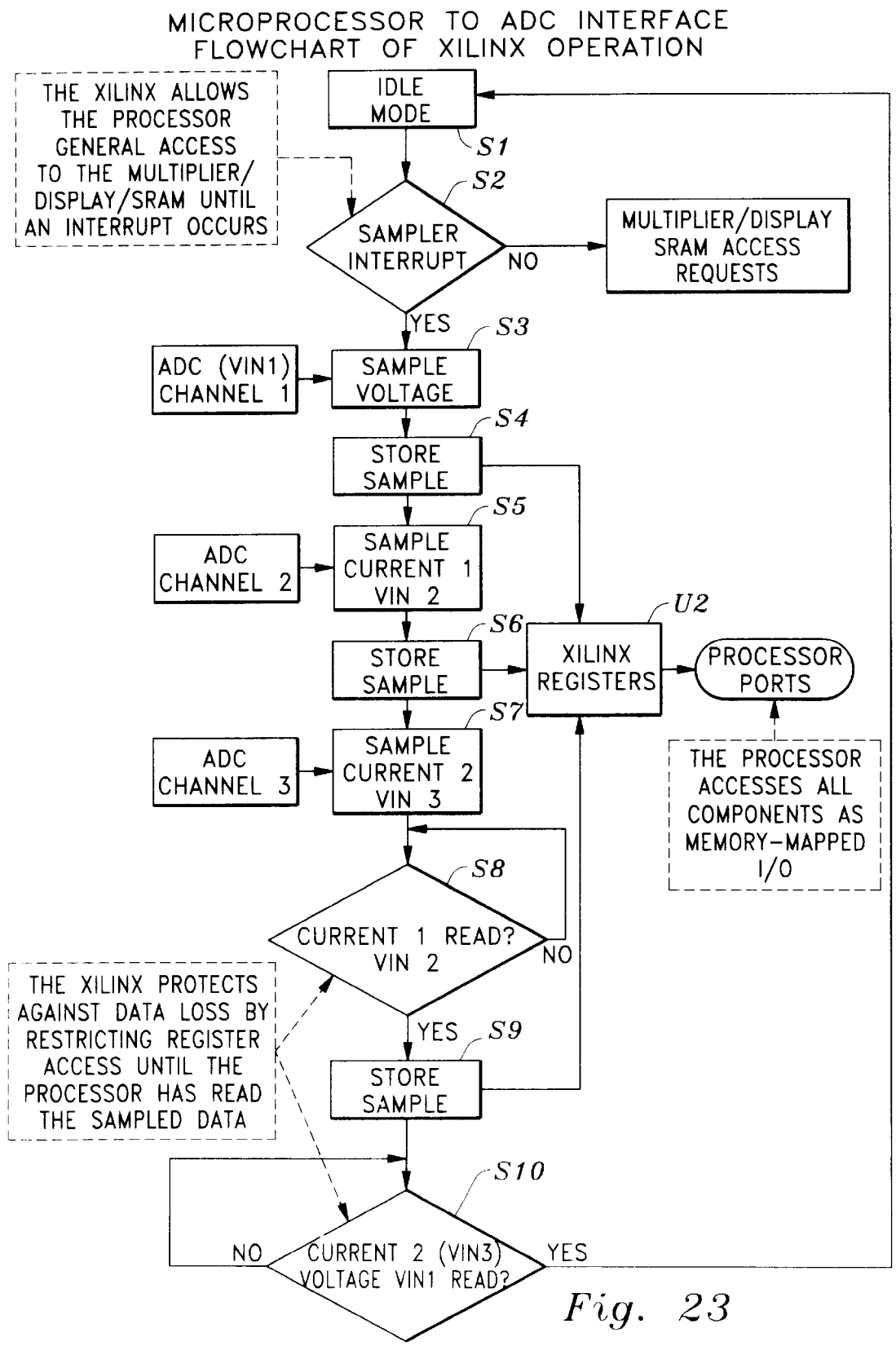
FIG. 23 is a flow chart detailing the field programmable gate array interfacing the microcontroller with the analog to digital converter.

The operation of the FPGA U2 interfacing between the microcontroller U1 and the ADC U4 is outlined in the block diagram of FIG. 22 and the flow chart of FIG. 23. Specifically, after the meter has been initialized (FIG. 30), it remains in an idle mode at step S1 (FIG. 23), waiting for the next instruction. In this idle mode the FPGA U2 allows the microcontroller U1 general access to the multiplier U3, the LCD 320 and the SRAM U6 until an interrupt occurs.

The meter 10 determines if a sampler interrupt (FIG. 35) has occurred at step S2. If the sampler interrupt has occurred, the ADC U4 begins the conversion process under the instruction of the FPGA U2. Specifically, at step S3, the voltage VIN1 from the second secondary side 169 of the voltage transformer 160 is sampled from channel 1 of the ADC U4. At step S4, the sample is stored into registers of the FPGA U2. This process continues and at step S5 the voltage VIN2 is sampled from channel 2 of the ADC U4 which is correlative to the current I1 from current sensor 110. This sample is stored at step S6 into the registers of the FPGA U2. Likewise, the voltage VIN3 at channel 3 of the ADC U4 is sampled at step S7. The voltage VIN3 at channel 3 of the ADC U4 is correlative to the current I2 from current sensor 130. Prior to storing the sample provided from channel 3, the meter 10 ensures that the voltage VIN2 has been read and stored from channel 2. If this is the case, the voltage VIN3 sampled from channel 3 is stored in the registers of the FPGA U2 at step S9. At step S10, the meter 10 determines if the sample from channel 3, voltage VIN3 of the ADC U4 has been read and stored and if the sample from channel 1, voltage VIN1 has been read and stored. When this criteria has been met, the meter 10 returns to the idle mode at step S1.

It is important to note that the FPGA U2 protects against data loss by restricting register access at step S8 and at step S10 until the microcontroller U1 has read the sampled data. The microcontroller U1 accesses all components of the sampled data as memory mapped input/output.

Preferably, the data is sampled at a rate which allows accurate measurement intervals for associating the voltage and current signals at 90-degrees interval. Thus, it is preferred that the rate of sampling is set at an even multiple of 4 per cycle and specifically at a rate of 84 times per cycle. Thus, sampling the 60-hertz waveforms VIN1, VIN2 and VIN3, the sampling rate is 84*60=5,040 times per second. By accomplishing this, the following interrupt algorithm is implemented with a software program.

Referring to FIG. 15A, the following is a detailed delineation of a WATT/VARS interrupt algorithm implemented in the software of the meter 10. 1) The interrupt counter will maintain the time relation between samples. 2) The sampled voltage VIN1 will be moved to a forward wrapping buffer B with a buffer-size N equal to [(samples per cycle/4)]. The buffer B is a wrap-around buffer. Thus, the next sample will overwrite the first sample which is lagging the present reading by 90 degrees. This buffer size reflects the 90-degrees interval between the sampled voltage VIN1 and sampled current VIN2, VIN3 required to calculate VARS. 3) The sampled current will be multiplied by the sampled voltage and the resulting watt-sample will be summed to a single buffer location. The sum will later be divided by the number of samples per second to obtain watt-seconds, and/or divided by the proper conversion to obtain watt-minutes, watt-hours, kilowatt-hours, etc. 4) The 90-degree buffer location of sampled voltage will be multiplied by the sampled current and the resulting VARS sample will be summed to a single buffer location. The sum will later (at the cycle rate) be divided to obtain the average VARS per cycle.

The field programmable gate array (FPGA) U2 provides the interface between the microcontroller U1, the analog-to-digital converter U4, the hardware multiplier U3, the static ram U6 and the liquid crystal display (LCD) 320. The FPGA U2 performs the function of a custom large scale integrated circuit, but is user programmable and even re-programmable within the system. Preferably, a serial configuration PROM U5 is used to configure the FPGA U2. Preferably, the field programmable gate array (FPGA) U2 is an XC3042PC84 IC and U5 is implemented using an XC1736IC both manufactured by Xilinx located in San Jose, Calif.

A design idea or schematic is configured into a data file using a development system software program running on a computer or workstation and then this data file is loaded into U5. The serial configuration PROM U5 is a one-time programmable device used to store the field programmable gate array (FPGA) configuration bit stream. Thus, the serial configuration PROM U5 provides a simple way to configure the FPGA U2 device using only four device pins. Using this method allows the configuration bit stream file to be loaded into the FPGA U2 where it is stored in latches arranged to resemble one long shift register. The data content of these latches customizes the FPGA U2 to perform the intended digital functions. These configuration bits control or define the combinatorial circuitry, flip-flops, interconnect structure and the input/output buffers. Upon power-up, the FPGA U2 waits for the voltage Vcc to reach an acceptable level, then clears the configuration memory, holds all internal flip-flops reset, and 3-states almost all outputs but activates their weak pull-up resistors. The device then initiates configuration, either as a master, clocking the serial PROM U5 to receive the serial bit stream, or as a slave, accepting an external clock and serial or 8-bit parallel data from an external source.

Preferably, the serial configuration PROM U5 is used to configure the FPGA U2. Referring to FIG. 16, the VCC and VPP designated pins of PROM U5 are coupled to the output of the DC power supply circuit 180 via line 196. The GND (ground) designated pin of PROM U5 is coupled to circuit ground 200. The four pins of PROM U5 used to configure FPGA U2 are designated as Data, CCLK, RST and CE. The Data designated pin of PROM U5 is coupled to the DIN designated pin (pin 72) of FPGA U2 via line 373. The configuration clock pin (CCLK) of U5 is coupled to the configuration clock pin 74 (CCLK) of FPGA U2 via line 374. The RST pin of U5 is connected to the INIT pin (pin 42) of FPGA U2 via line 375 and the CE pin of U5 is connected to the DONE pin (pin 55) of FPGA U2 via line 376. Thus, this combination of FPGA U2 and PROM U5 allows the FPGA U2 device to initiate the configuration as a master, clocking the serial PROM U5 to receive the serial bit stream data.

Specifically, the CCLK pin (pin 74) of FPGA U2 drives the CCLK pin of PROM U5 which in turn causes the serial bit stream to be outputted at the pin designated Data of U5 which is in turn connected to the DIN pin (pin 72) of U2. Each rising edge of the CCLK output (pin 74) from FPGA U2 increments the serial PROM U5 internal address counter which in turn sequentially outputs the data bit on the serial configuration PROM U5 (Data) pin which is connected to the DIN pin of FPGA U2. The FPGA U2 accepts this data on the subsequent rising CCLK edge. This process continues until all of the bit stream data is loaded from U5 to FPGA U2.

One important aspect of the design of the present invention is that the user can re-configure FPGA U2 at any time by pulling the DONE pin (pin 55) of FPGA U2 low which instigates a new configuration sequence. The reset pin, designated as RST on PROM U5, sends a high output to the INIT pin (pin 42) of FPGA U2 for the initialization of U2. The INIT pin (pin 42) of FPGA U2 is an active low open drain output which is held low during the power stabilization and internal clearing of the configuration memory. This pin may be used to indicate status to a configuring device or, as a wired "and" of several slave mode devices, a hold-off signal for a master mode device. After configuration, this pin becomes a user programmable input/output pin.

Figure 20:
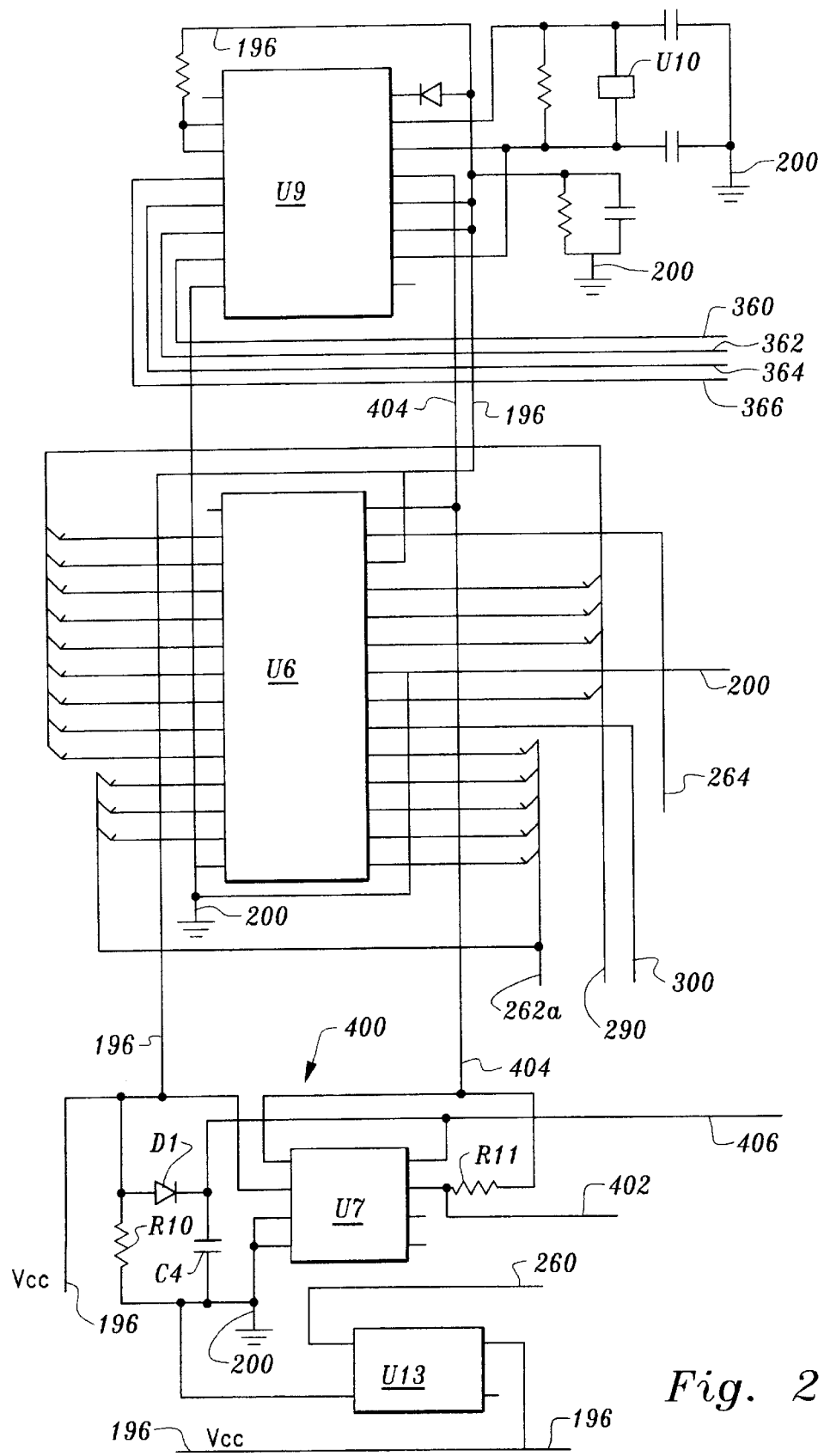
FIG. 20 is a section of the master schematic showing a real time clock, a memory means, and a power back-up circuit according to the present invention.
Figure 21:
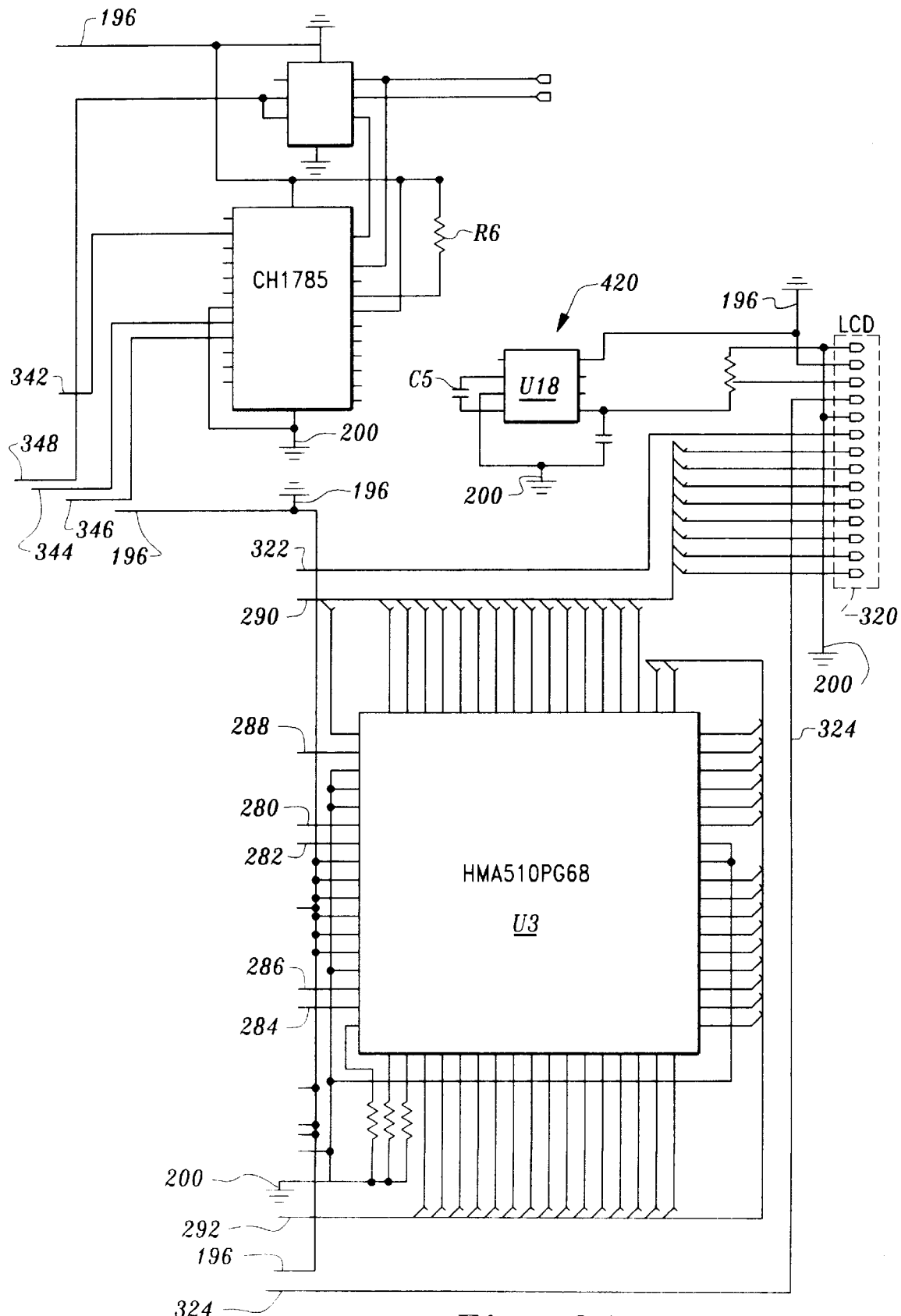
FIG. 21 is a section of the master schematic showing a hardware multiplier, a LCD display, a negative voltage converter, a modem, and a telephone line status detector circuit.

Referring to FIGS. 16 and 21, the coupling of the FPGA U2 with the hardware multiplier U3 includes latch enable lines 280, 282 and 284, output enable lines 286 and 288, a 16-bit X operand line 290, a 16-bit Y operand line and a 32-bit product line 292. Note that the 32-bit product line also doubles as the 16-bit Y operand line 292. In addition, the 16-bit X operand line 290 is also operatively coupled to the address inputs A0–A12 of the SRAM U6 (FIG. 20) and to the LCD display (FIG. 21). The hardware multiplier U3 is operatively coupled to the DC power supply circuit 180 via line 196 to pins 17, 18, 19 and 20 which have the designations VCC1, VCC2, VCC3 and VCC4, respectively. Pins 53 and 54 of hardware multiplier U3, which have the designations GND2 and GND1, respectively, are coupled to circuit ground 200.

Preferably, U3 is a high speed, low power 16-by-16 bit parallel CMOS multiplier-accumulator which is ideally suited for real-time digital signal processing. Because of such stringent sampling rates, utilizing U3 allows the minimization of software computing time. One example of this type of hardware multiplier is manufactured by Integrated Device Technologies, Inc., and distributed under part number IDT 7210L.

As mentioned, the FPGA U2 also interfaces the microcontroller U1 with the hardware multiplier U3. The coupling of the microcontroller U1 with the FPGA U2 has been delineated supra.

Figure 24:
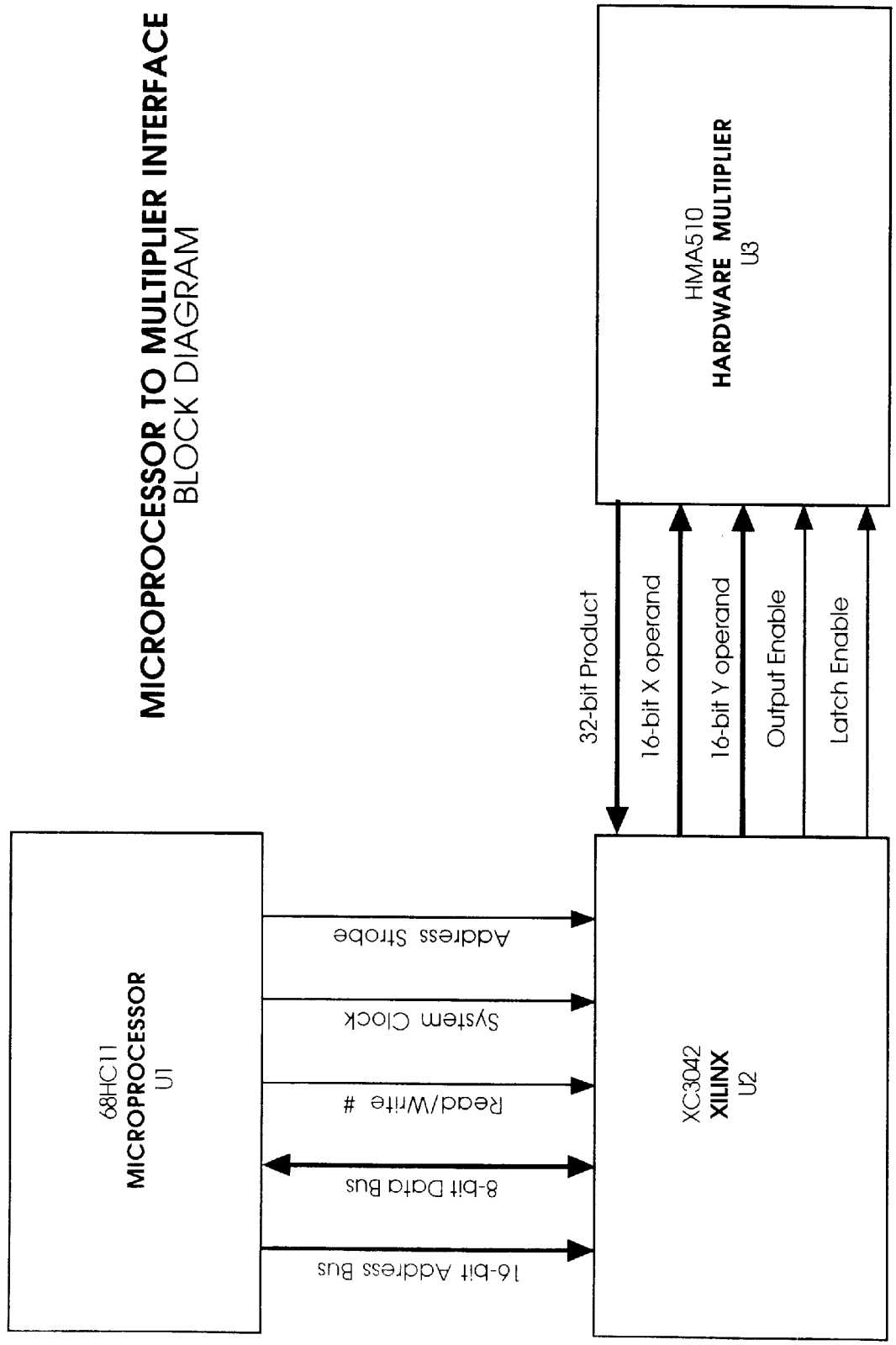
FIG. 24 is a block diagram of the field programmable gate array interfacing the microprocessor with the hardware multiplier.
Figure 25:
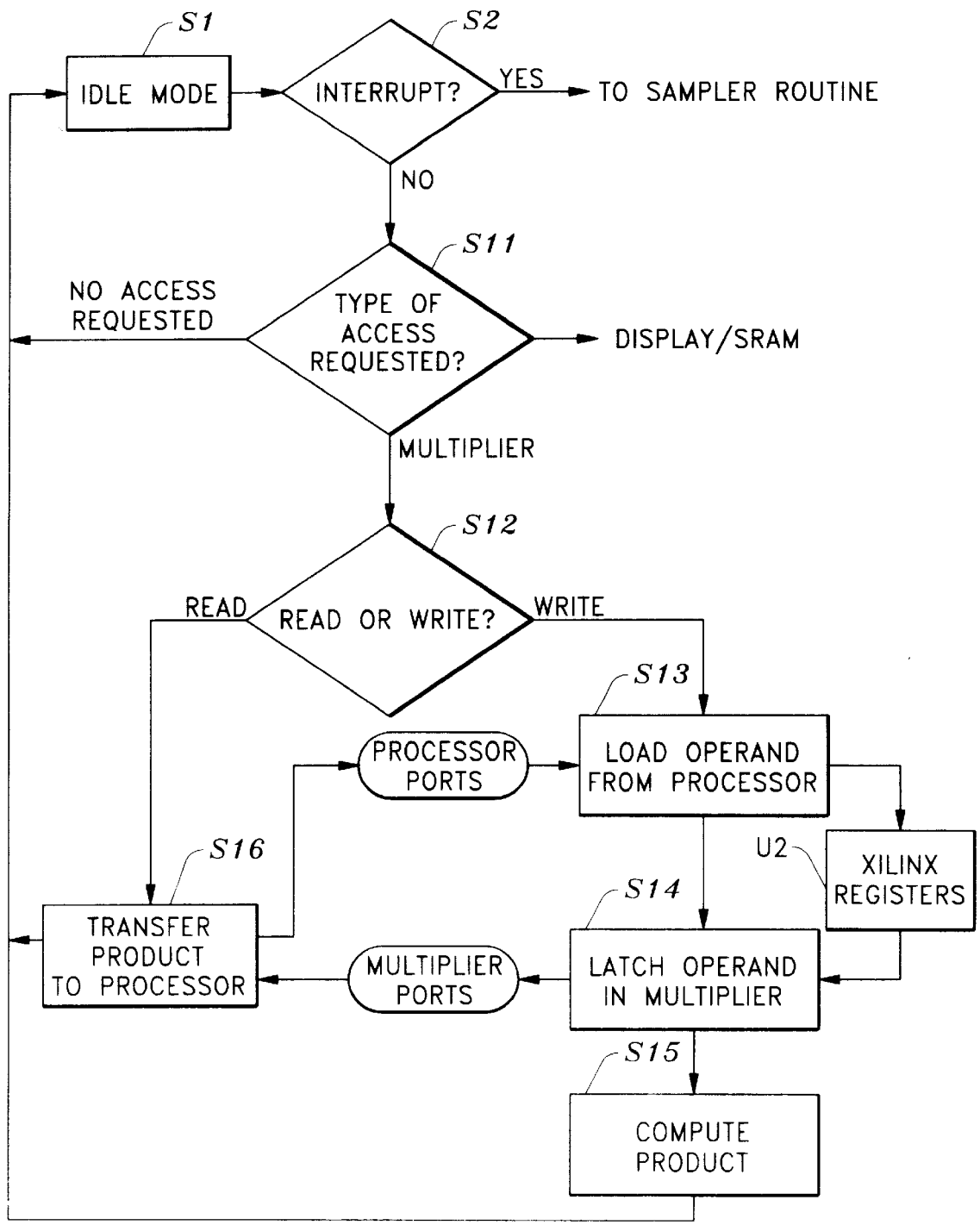
FIG. 25 is a flow chart of the field programmable gate array interfacing the microcontroller with the hardware multiplier.

Referring to FIGS. 24 and 25, the operation of the interface between the microcontroller U1 and the hardware multiplier U3 is delineated in a block diagram and a flow chart, respectively. Referring to FIG. 25, the meter 10 is in the idle mode at step S1. At step S2, the meter 10 determines if an interrupt has occurred. If no interrupt has occurred, the meter 10 determines if there has been a request for access of the multiplier at step S11. If a request has been made to access the multiplier it is determined at step S12 whether this access is to read data from the multiplier U3 or to write data to the multiplier U3. If a write access is initiated at step S12, the X operand and the Y operand data is loaded from the microcontroller U1 to the field programmable gate array U2 at step S13. Then, the FPGA U2 transfers the X operand data and the Y operand data to the hardware multiplier U3 where it is latched in the multiplier at step S14. At step S15, the multiplier computes the product of the 16-bit X operand data and the 16-bit Y operand data. Once all products of the X operand and the Y operand have been computed, the meter 10 returns to step S1, the idle mode.

Figure 17:
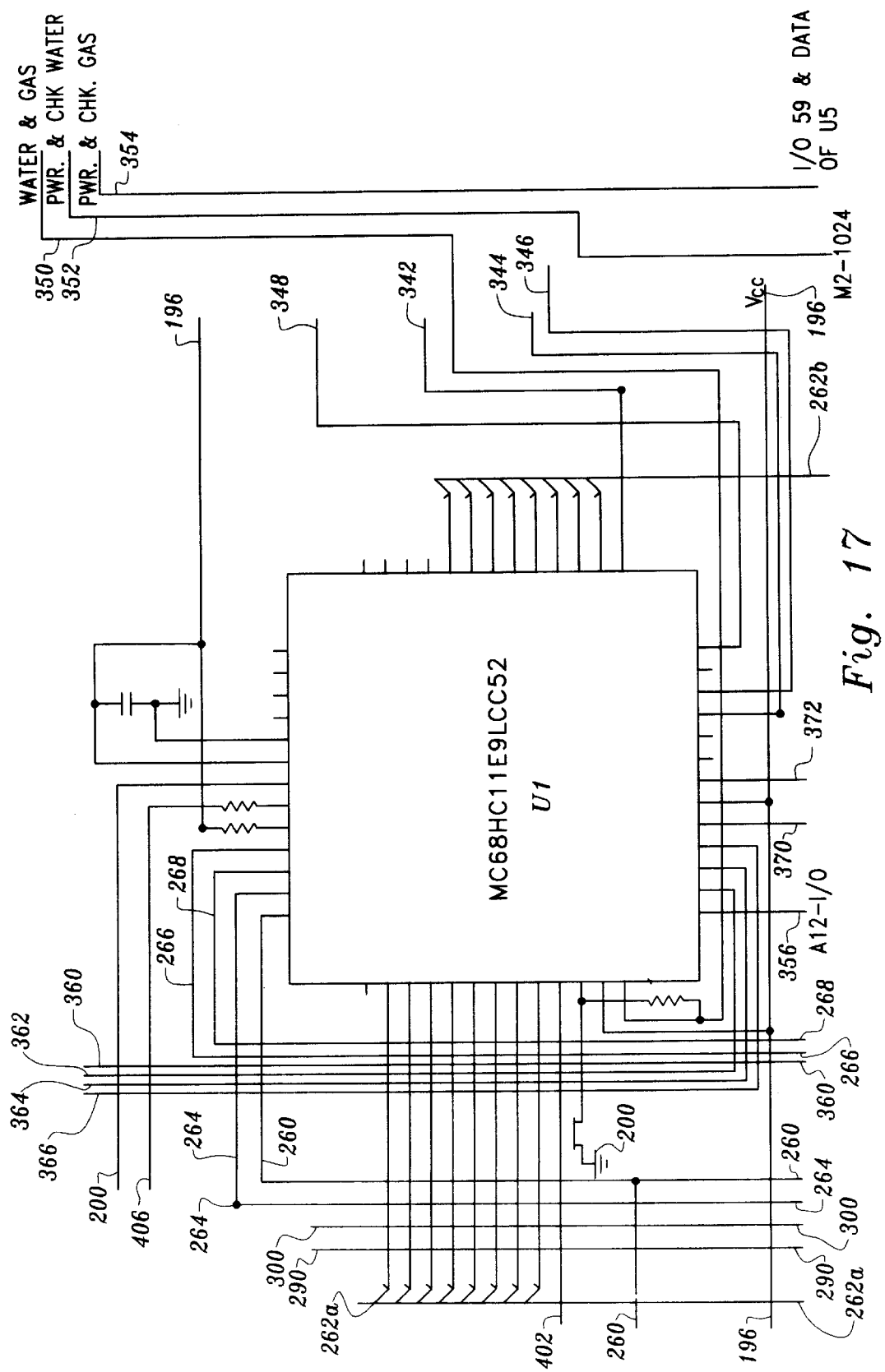
FIG. 17 is a section of the master schematic showing a microcontroller.
Figure 18:
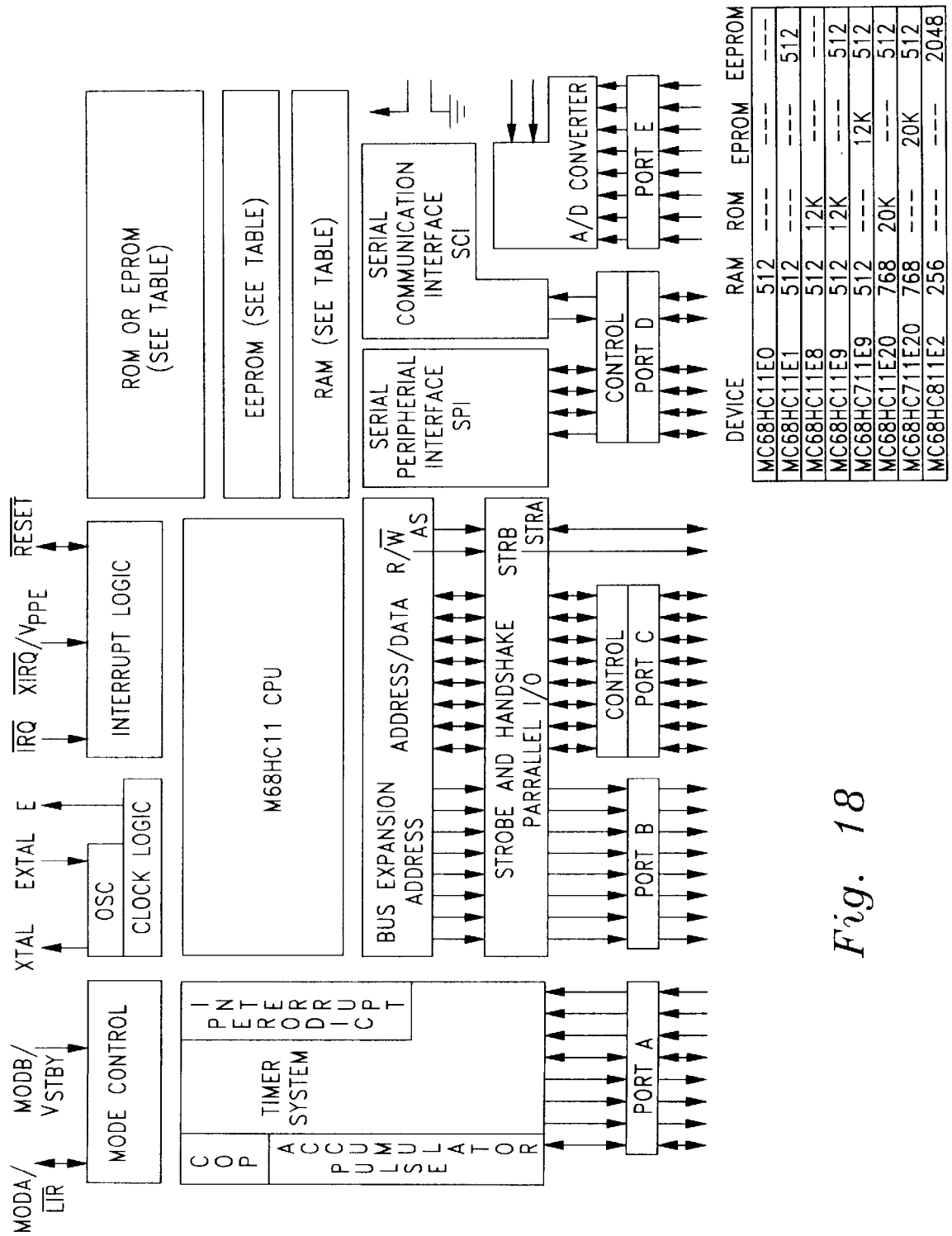
FIG. 18 is a block diagram of the microcontroller shown in FIG. 17.
Figure 18A:
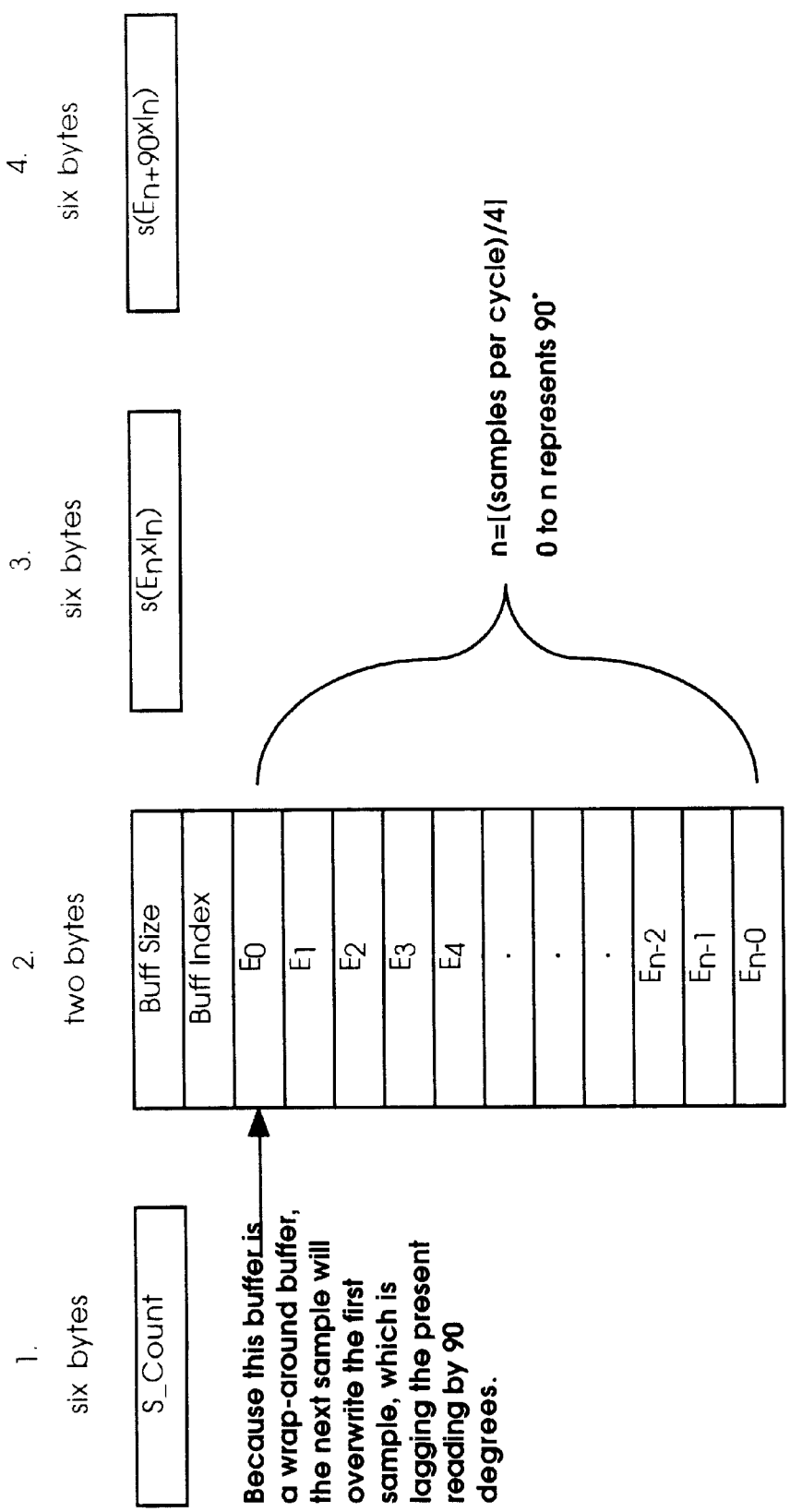
FIG. 18A is a diagram of a buffer used in an interrupt algorithm for calculating VARS.

Referring to FIGS. 17 and 18, the microcontroller U1 is preferably a Motorola MC68HC11E9 LCC52IC or equivalent. As designated in FIG. 17, the input and output pins of the microcontroller U1 have been labeled with their customary mnemonic designations. External crystal U13 (FIG. 20) provides a 12-megahertz time base and is operatively coupled to the EXTAL pin (pin 7) of U1 via line 260. The external crystal U13 is powered by the DC power supply circuit 180 via line 196 and is grounded using circuit ground 200.

The microcontroller U1 communicates with a bi-directional address/data bus 262a, an address bus 262b which provides 16 parallel address bits and 8 parallel data bits. The address/data bus 262a and address bus 262b operatively couples the microcontroller U1 with the FPGA U2. The address/data bus 262a also couples with data input/data output pins of SRAM U6. Preferably, memory means U6 is a static RAM (SRAM) device. This device may be implemented using an MCM6264C chip which an 8K by 8 bit fast static RAM device manufactured by Motorola. The operation and interfacing of the SRAM U6 will be discussed, infra.

Referring to FIGS. 16 and 17, microcontroller U1 is also operatively coupled to the FPGA U2 via a read/write line 264, the clock line 260, an address strobe line 266 and an E-clock line 268. U1 is also operatively coupled to the DC power supply circuit 180 via line 196 coupling to pin 26 of U1 and to circuit ground 200 at pin 1.

Figure 19:
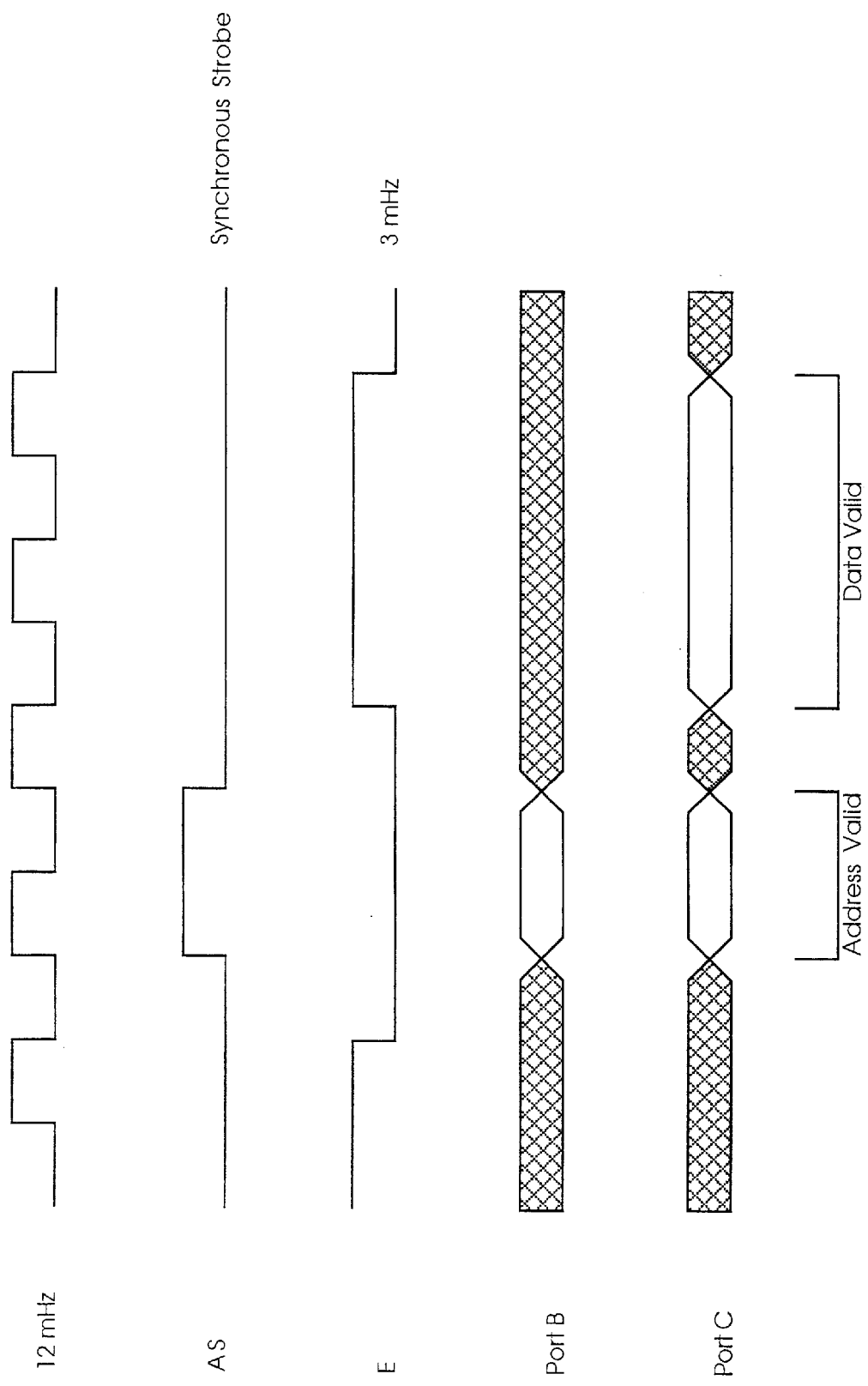
FIG. 19 is an example of a timing diagram for the microcontroller according to the present invention.

FIG. 19 shows an example of the timing relationship between the clock line 260, the address strobe line 266 and the E-clock line 268. In addition, and referring to FIGS. 15 and 16, the FPGA U2 is also operatively coupled to the analog-to-digital converter U4 via the ADC interface enable line 250, the configuration command line or instruction line 242 and data out line 240. The read/write line 264 is also operatively coupled between the microcontroller U1 and a write enable pin of the SRAM U6.

The field programmable gate array U2 also controls the operation of interfacing the microprocessor U1 with the static RAM U6. Referring to FIGS. 16, 17 and 20, the read/write line 264 operatively couples the microcontroller U1 with the read/write pin (pin 27) of the Static RAM U6. In addition, the 8-bit data bus line 262a which interconnects the microcontroller U1 with the FPGA U2 is also used to couple the microcontroller U1 with the data input pins of the SRAM U6. The FPGA U2 addresses the SRAM U6 via the address line 290 which doubles as the X operand data line. A memory enable line 300 is coupled between the field programmable gate array U2 and the static RAM U6 such that the FPGA U2 controls the enabling of the memory of the static RAM U6.

Figure 26:
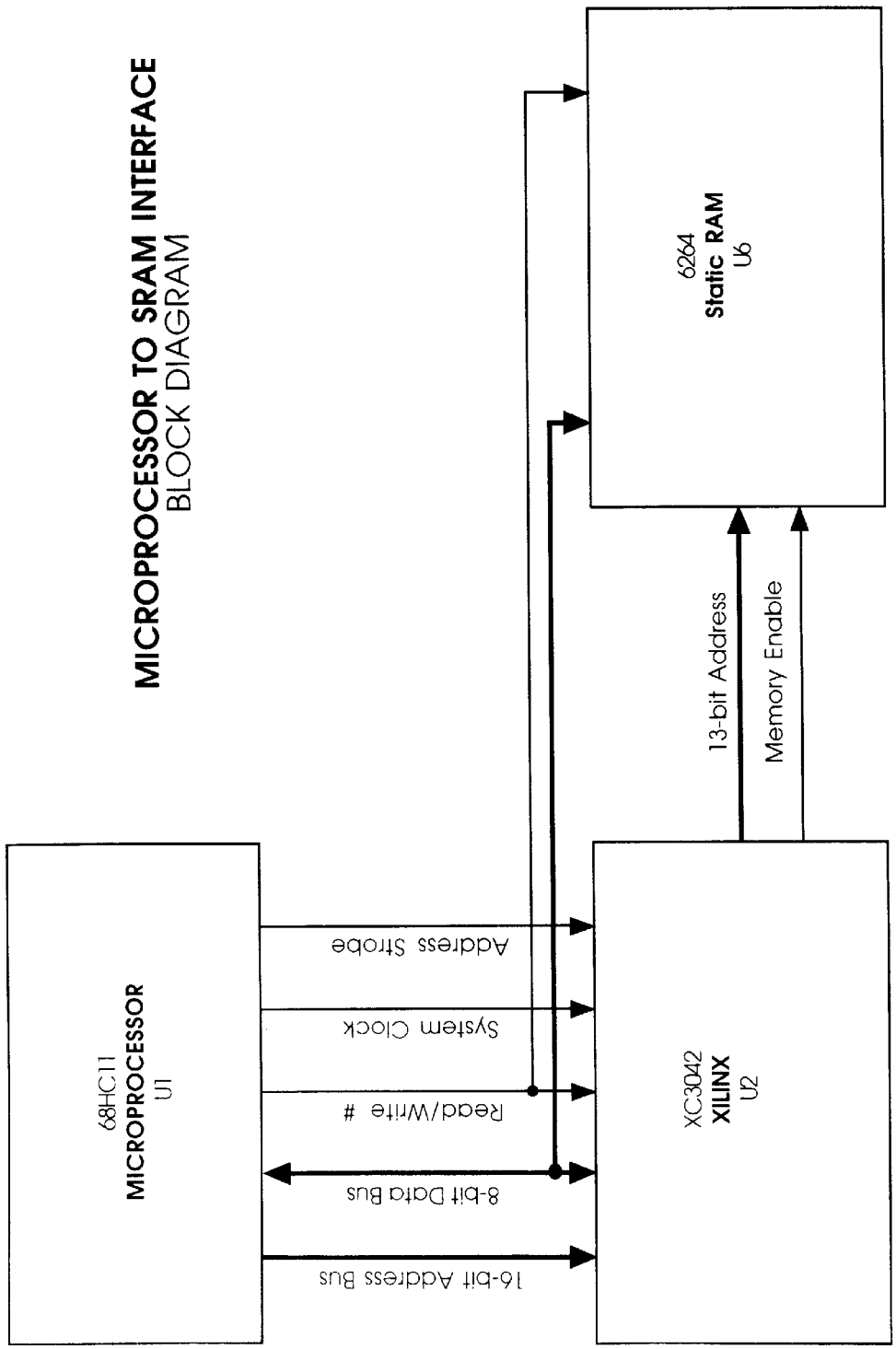
FIG. 26 is a block diagram of the field programmable gate array interfacing the microcontroller with a memory means.
Figure 27:
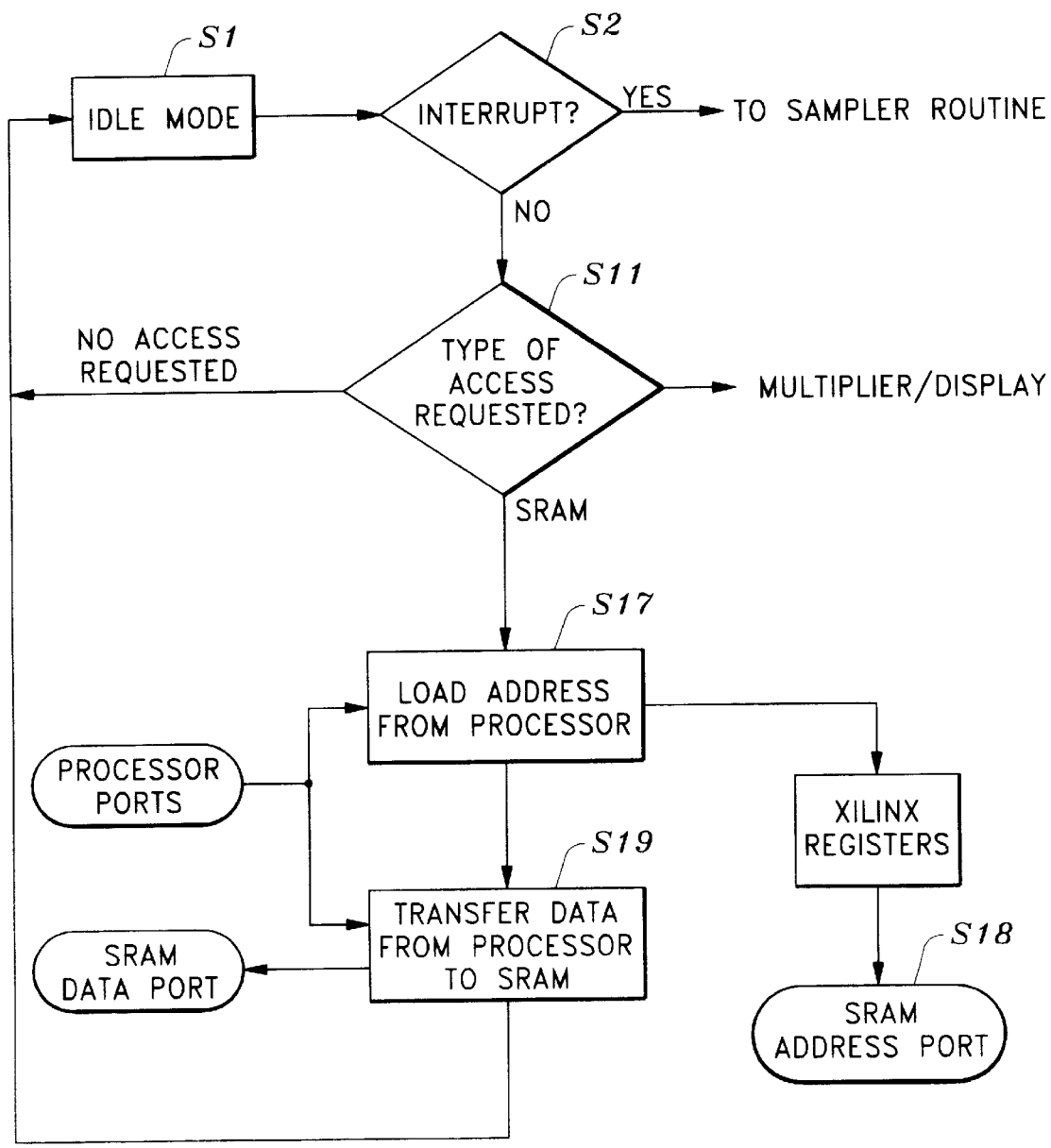
FIG. 27 is a flow chart of the operation of the field programmable gate array interfacing the microcontroller with the memory means.

Referring to FIGS. 26 and 27, the FPGA U2 is shown controlling the interface between the microcontroller U1 and the SRAM U6. Referring to FIG. 27, the meter 10 is in the idle mode at step S1 and at step S2, is determining whether an interrupt has occurred. If no interrupt has occurred, the meter 10 determines at step S11 if access has been requested to the multiplier U3, the static RAM U6 or to the LCD display. If a static RAM access is requested, then at least one address from the microcontroller U1 is loaded into the registers of the field programmable gate array U2 at step S17. The FPGA U2 in turn, provides a memory enable signal to the static RAM U6 via line 300. At step S18 the FPGA U2 outputs a 13-bit address via line 290 to direct the data from the microcontroller U1 to the static RAM U6. The data is transferred from the microcontroller U1 to the SRAM U6 via the 8-bit data bus line 262a. When the data has been transferred from the microcontroller U1 to the SRAM U6 at step S19 the meter returns to the idle mode, step S1.

Figure 28:
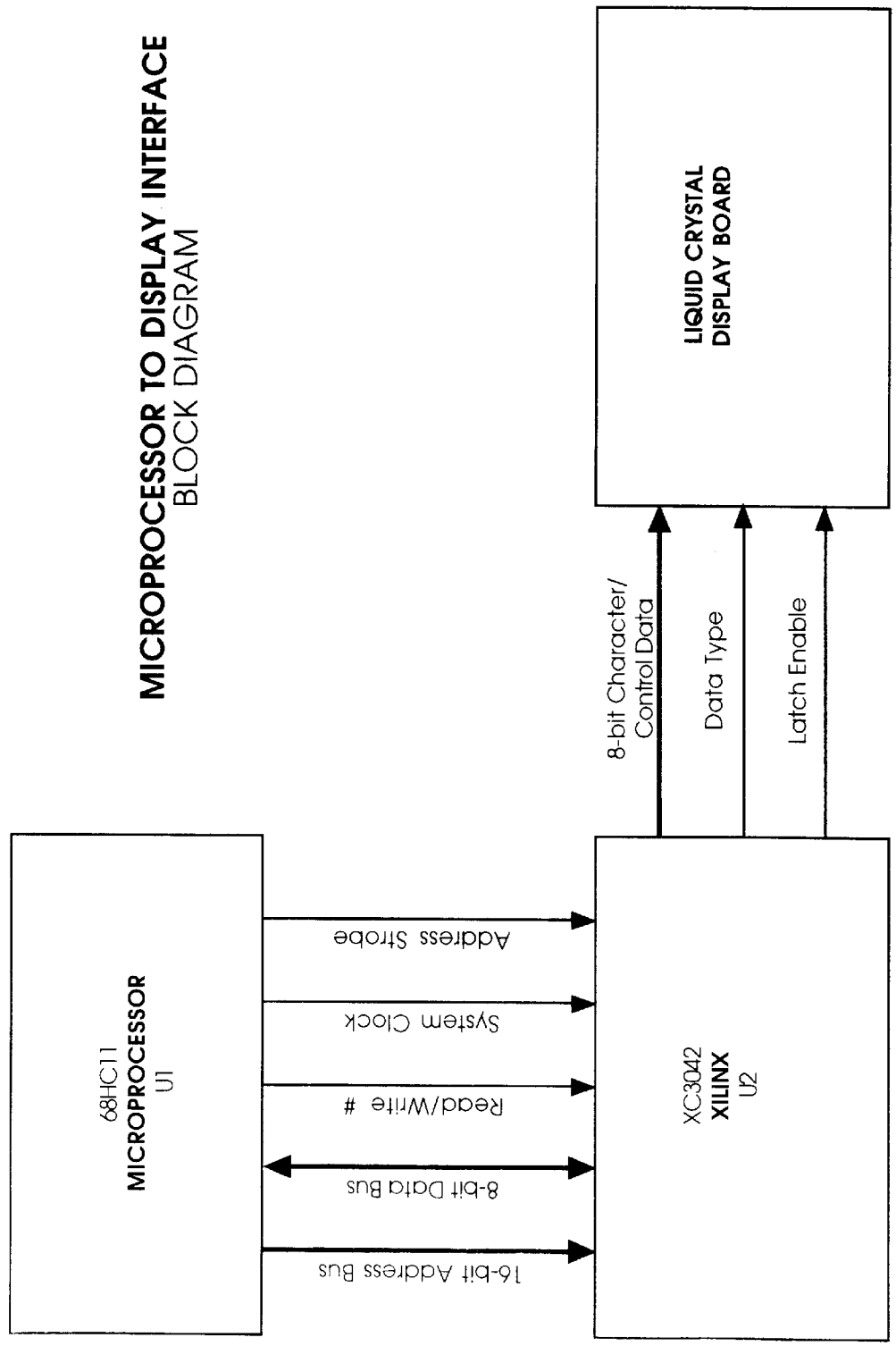
FIG. 28 is a block diagram of the field programmable gate array interfacing the microcontroller with a display means.

FIG. 28 shows the block diagram of the FPGA U2 interfacing the microcontroller U1 with a display 320. Preferably, the display is a liquid crystal display (LCD) 320. The LCD 320 is preferably implemented using a DMC-20434 display manufactured by (?) and includes 20-characters by 4 lines and 5 by 8 dot display fonts.

Referring to FIGS. 16 and 21, the FPGA U2 enables the LCD 320 via latch enable line 322. The data type is controlled by the FPGA U2 and sends a data type signal to the LCD display via line 324. An 8-bit character/control data line 290 transfers data from the FPGA U2 to the LCD display 320.

Figure 29:
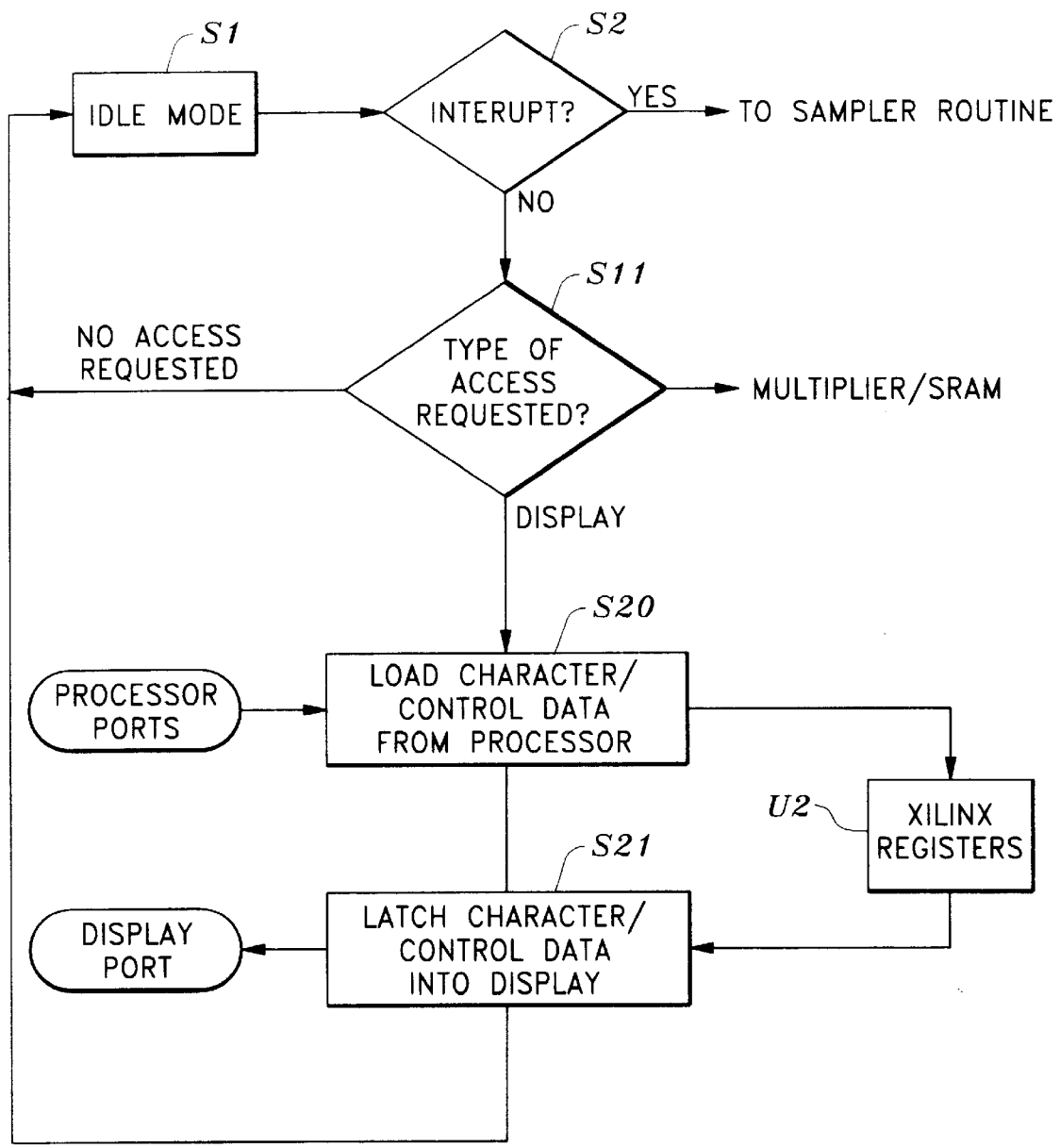
FIG. 29 is a flow chart of the operation of the field programmable gate array interfacing the microcontroller with the display means.

Referring to FIG. 29, if a display access has been requested at step S11, the character and control data is loaded from the microcontroller U1 to the FPGA U2 at step S20. In turn, the data is latched into the display at step S21 from the FPGA U2 and displayed by the LCD 320. After completion of step S21, the meter 10 returns to the idle mode, step S1.

The FPGA U2 also controls the operation of interfacing between the microcontroller U1 and the analog-to-digital converter U4 is outlined in the block diagram of FIG. 22 and the flow chart of FIG. 23. Specifically, after the meter has been initialized (FIG. 30), it remains in an idle mode at step S1 (FIG. 23), waiting for the next instruction. In the idle mode, the FPGA U2 allows the microcontroller U1 general access to the multiplier U3, the LCD display and the SRAM U6 until an interrupt occurs.

The meter 10 determines if a sampler interrupt (FIG. 35) has occurred at step S2. If the sampler interrupt has occurred, the analog-to-digital converter U4 begins the conversion process under the instruction of the FPGA U2. Specifically, at step S3, the voltage VIN1 from the voltage transformer 160 is sampled from channel 1 of the analog-to-digital converter U4. At step S4, the sample is stored into the registers of the field programmable gate array U2. This process continues and at step S5 the voltage VIN2 is sampled from channel 2 of the analog-to-digital converter U4 which is correlative to the current I1 from current sensor 110. This sample is stored at step S6 into the registers of the FPGA U2. Likewise, the voltage VIN3 at channel 3 of the analog-to-digital converter U4 is sampled at step S7. The voltage at channel 3 of the analog-to-digital converter is correlative to the current I2 from current sensor 130. Prior to storing the sample provided from channel 3, the meter 10 insures that the voltage VIN2, which is indicative of the current I1, has been read and stored from channel 2. If this is the case, the voltage sampled from channel 3, which is indicative of current I2, is stored in the registers of the FPGA U2 at step S9. At step S10, the meter 10 determines if the sample from channel 3, voltage VIN3 of the analog-to-digital converter U4 has been read and stored and if the sample from channel 1, voltage VIN1 has been read and stored. When this criteria has been met the meter 10 returns to the idle mode at step S1.

It is important to note that the field programmable gate array U2 protects against data loss by restricting register access at step S8 and at step S10 until the microcontroller U1 has read the sampled data. The microcontroller U1 accesses all components of the sampled data as memory mapped input/output.

Alternatively, if a read access has been initiated, the 32-bit product is transferred at step S16 to the microcontroller U1 via the FPGA U2. After completion of the read access, the meter 10 returns to the idle mode, step S1.

In summary, the results of the hardware multiplier U3 are used to calculate the average (real) power in units of kilowatt-hours (KWHs), apparent power in units of kilovolt amperes (KVAs) and reactive power in units of VARS. The sampled voltage and current values are sampled, stored and accessed for continuous calculations.

Specifically, the kilowatts and kilowatt-hours are obtained by multiplying the sampled voltage and current values, summing the results and then accumulating the results in memory. The results are preferably summed over periodic intervals. The summed result is divided by the number of multiplications to derive the average value over the given intervals. This average value represents watts. Watts are preferably accumulated over seconds, minutes and hours to respectively calculate kilowatt-seconds, kilowatt-minutes and kilowatt-hours. Longer intervals may be incorporated in these calculations.

VARS are calculated by taking the current samples and multiplying them by voltage samples which have been taken 90-degrees earlier. The results of the multiplications are continuously summed over time and are divided by the number of multiplications to derive the magnitude of VARS.

The calculated values of watts and VARS may now be used to calculate volt-amps (VA). The volt-amp value is the square root of the sum of watt squared and VARS squared.

As noted hereinabove, the meter 10 includes memory capability both on the microcontroller U1 and on the external SRAM U6. The values of the calculations derived for the kilowatt-hours, the kilovolt-amps and VARS are initially stored in the memory of the microcontroller U1. These values are transferred to the SRAM over a predetermined period of time, preferably five, ten or fifteen minutes. This time period is re-programmable by the utility company. The SRAM U6 is preferably coupled to a power backup means 400 to insure data retention during any power outage.

The meter 10 includes internal modem capability designed within to transfer data to or from a host computer 52 remote from the meter 10. Referring to FIGS. 17 and 21, the modem U11 is preferably implemented by using a CH1785 chip manufactured by Cermeteck Microelectronics. The CH1785 is the smallest, highly integrated full function 2400 bps modem, comprised of a modulator/demodulator, a controller and a FCC part 68 approved telephone interface (also referred to as a data access arrangement or DAA). The microcontroller U1 initiates transfer to and from the modem via serial ports. The microcontroller U1 commands the modem to initiate calls to the remote central host computer 76 at programmed intervals. The modem U11 accepts digital data retrieved from memory by the microcontroller U1 and transferred to the modem U11. The data includes an I.D. number unique to the particular residential customer, a central office number where the host computer 76 is located and data representing the power, gas and water consumption by the particular customer.

The pin designated VCC of the modem is operatively coupled to the DC power supply circuit 180 via line 196 and the pin designated GND is operatively coupled to circuit ground 200. The designated pin RxD and TxD of the modem are respectively coupled to serial ports PAO/IC3 (pin 34) via lines 342 and PA4/OC4/OC1 (pin 30) of U1 via line 344. Because of the inherent characteristics and physical design of U1 to achieve a 2400 bps transmission and to ensure compatibility with modem U11, a software routine is used to accomplish a transmission speed of 2400 bps. The software routine is discussed infra. The TXD pin of the modem U11 is a serial transmit data input and the RXD pin of the modem U11 is a serial received data input. The designated pin RTS of the modem U11 is operatively coupled to circuit ground 200. The TXA mnemonic designated pin of the modem VII is coupled to line 196 of DC power supply circuit 180 via a resistor R6. In addition, the designated pin AUT, an input pin, of the modem U11 is directly coupled to line 196 of DC power supply circuit 180. Furthermore, the designated pins TIP and RING are operatively coupled to a telephone line status detector U12.

Specifically, the designated pin TIP of the modem VII is operatively coupled to a designated pin TIP OUT of the telephone line status detector U12 and the designated pin RING of the modem U11 is operatively coupled to the designated RING pin of the telephone line status detector U12. In addition, line 346 couples the DTR designated pin of U11 to the microcontroller U1. The DTR pin is a data terminal ready input which is active when driven low. Switching the DTR off can either return the modem U11 to a command state, disconnect a phone call or reset the modem U1. The default is for the modem to ignore DTR. The DTR pin should be set low when not used.

Preferably, the telephone line status detector U12 is a CH1808 chip manufactured by Cermateck Microelectronics. The telephone line status detector U12 functions as a current sensor on the phone line to detect the status of the customer's phone. This function is necessary to detect an off-hook status of the phone indicating a requirement by the customer to place a phone call. The telephone line status detector U12 detects current changes due to the phone going into an off-hook condition and immediately signals the microcontroller U1 to provide notification of the customer's requirement to use the phone. Specifically, the designated pin OHD (off-hook detect) of U12 outputs a signal to the microcontroller U1 via line 348. As a result, should the modem currently be in a sending/receiving mode, the microcontroller U1 immediately stores existing data and cuts the modem U11 off-line. This frees up the phone line for immediate customer use. The analog output signal correlative to power, gas and water usage is sent to the telephone lines via lines RJ111 and RJ112.

The meter 10 incorporates a real time clock U9 to provide time and date from one one-hundredth of a second to years, including leap years. Preferably, an MC68HC68T1 real time clock manufactured by Motorola is provided. The real time clock U9 is driven by a crystal U10 and associated components as shown in FIG. 20. The microcontroller U1 accesses the real time clock at programmable intervals for functions requiring time and date. The microcontroller U1 continually updates the power backed-up memory (SRAM U6) with data from the real time clock U9. The functions for use of the real time clock U9 include the time and date to upload data to the remote host computer 76, marking power outages with a time and date stamp and time of use for different rate structures correlating to a particular monetary value of the power or other utility at any given time.

Specifically, and referring to FIG. 20, pin 8 of the real time clock U9 is operatively coupled to circuit ground 200. Pins 2, 3, 10, 11, 12 and 16 are operatively coupled to line 196 of DC power supply circuit 180. Pins 14 and 15 are operatively coupled to the crystal U10. Pins 4, 5 and 6 of U9 are operatively coupled to the microcontroller U1 (FIG. 17) via respective lines 366, 364 and 362. Pin 7 of U9 is operatively coupled to the FPGA U1 via line 360.

Specifically, the designated pin SCK of U9 is coupled to the designated pin SCK of U1 via line 366. Likewise, the designated pins MOSI and MISO of U9 are operatively coupled via respective lines 364, 362 to pins having the same designations MISO and MOSI on the microcontroller U1. The designated pin SS of U9 is operatively coupled to the field programmable gate array U2 via line 360.

The MISO and MOSI pins are serial data pins which are used for transmitting and receiving data serially. MISO stands for "master in/slave out" and MOSI stands for "master out/slave in." The SCK designated pin is used to synchronize the movement of data both in and out of the device through the MOSI and MISO pins. The SCK pin is an output when the synchronous serial peripheral interface (SPI) is configured as a master and an input when the SPI is configured as a slave. When the synchronous serial peripheral interface (SPI), is configured as a master, the SCK is derived from the internal microcontroller bus clock. The SS pin behaves differently on master devices than on slave devices. On a slave, this pin is used to enable the SPI slave for a transfer. On a master, the SS pin is normally pulled high externally. Note that the connection between the SS pin of U1 and the SS pin of U9 is via the field programmable gate array U2. Line 360 couples U9 with U2 and line 370 couples U2 with U1.

Referring to FIG. 17, a motion sensitive tamper switch U14 is operatively coupled via line 380 to the XIRQ designated pin of the microcontroller U1 to ensure that the meter 10 is not tampered with by unauthorized individuals. The microcontroller U1 immediately detects release of the motion switch via an interrupt signal to a microcontroller U1. In turn, it immediately initiates a call to a emergency number stored in memory. The real time clock U9 allows this tampering to be time and date stamped and this time and date stamped tampering is recorded in memory.

Preferably, the tamper switch U14 is a tilt switch manufactured by Durakool. The tilt switch makes a connection when an electrode of the switch is tilted below a horizontal and breaks the connection when tilted above the horizontal. The total travel from the make to break is the maximum included angle and the component to which the switch is attached must have a total tilt angle greater than the maximum included angle for proper operation.

Referring to FIG. 20, a unique power backup circuit 400 insures power is retained to the essential components of the meter 10 for preferably, a minimum of fifteen hours. The power backup circuit 400 is centered around a microprocessor supervisory circuit U7. Preferably, U7 is a MAX6902A which is manufactured by Maxim. The power backup circuit employs a very large value capacitor C4 to store and release energy sufficient to retain the power consumption data in the SRAM U6 and to operate the real time clock U9.

Capacitor C4 is initially charged through diode D1 which operatively couples, via line 196, the capacitor to Vcc output of the DC power supply circuit 180 (FIG. 14). Once the capacitor has become fully charged, the current is routed to circuit ground 200 through diode resistor R10.

U7 includes eight pins. Pins 3 and 4 are operatively coupled to circuit ground 200, pins 5 and 6 are preferably left open and pin 7 is a reset pin which is operatively coupled via line 402 to the Reset designated pin of the microcontroller U1 (FIG. 17). Pin 8 of U7 is operatively coupled to a first lead of the capacitor while a second lead of the capacitor is coupled to circuit ground 200. In addition, pin 8 of U7 is coupled via a resistor R20 and line 406 to the VSTBY designated pin of U1. Thus, a signal is sent to the microcontroller U1 notifying the microcontroller to go into a standby mode for saving values and conserving power.

The capacitor C4 is held at full charge until power drops below a predetermined threshold voltage. Pin 2 of U7 monitors the Vcc voltage output of the DC power supply circuit 180. When U7, at pin 2, detects a drop of Vcc below a set threshold level sufficient to insure power levels to the devices, it switches the power source to the backup power capacitor. Power from the backup capacitor C4 is outputted at pin 1 of U7. Pin 1 of U7 is operatively coupled to the VCC designated pin of U6 and the $V_{batt}$ designated pin of U9 by way of line 404. Thus, power is supplied by the capacitor to the static RAM U6 for maintaining the consumption data and also to U9 for maintaining the real time clock function. In addition, pin 1 of U7 is coupled to pin 7 of U7 via a resistor R11.

Due to the preferred requirement to update consumption data to the static RAM every five, ten or fifteen minutes (Utility company programmable), it should be noted that these are the maximum time intervals respectively for which data may be lost.

Referring to FIG. 21, a unique temperature compensation circuit 420 is operatively coupled to the LCD 320. The purpose of the temperature compensation circuit 420 is to extend the operating temperature of the LCD display 320. For example, when direct sunlight hits the meter 10, data outputted on the LCD display may not be viewable. Therefore, means for extending the temperature range such that data may be viewed at high temperatures is accomplished by using the unique temperature compensation circuit 420.

Specifically, the temperature compensation circuit includes means for providing a negative supply voltage from the positive supply voltage Vcc outputted at line 196. The temperature compensation circuit includes a positive to negative voltage converter and associated components. Preferably, the positive to negative voltage converter U18 is a LTC1046 monolithic CMOS switched capacitor voltage converter manufactured by Linear Technology. The switched capacitor voltage converter U18 includes eight pins. Pins 1, 6 and 7 are preferably left open. Pin 2 is capacitively coupled to pin 4 via capacitor C5. Pin 3 is operatively coupled to circuit ground 200. Pin 8 of U18 is operatively coupled to the power supply voltage Vcc via line 196. The output of the temperature compensation circuit is connected to pin 5 of U18. Pin 5 is also capacitively coupled to ground using capacitor C6. The output of the temperature compensation circuit is resistively coupled to pin 1 and pin 3 of the LCD display 320. Specifically, a variable resistor R14 is used to provide a negative voltage between pins 1 and 3 of the LCD display. Thus, the voltage between pins 1 and pin 3 of the LCD display may be varied from circuit ground 200 to a negative 5 volts.

Figure 30:
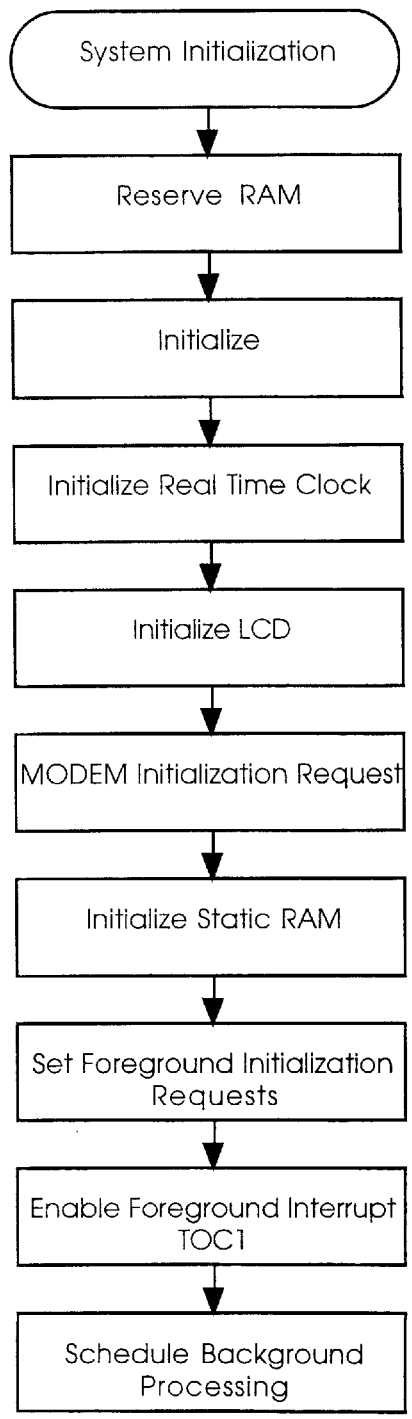
FIG. 30 is a system start-up flow diagram according to the present invention.

With the foregoing description of the invention in mind, the control programs will now be delineated. Referring to FIG. 30, the following describes the routine used to initialize and start up the meter 10.

The following code is required to configure certain elements and components of the microcontroller U1 (HC11E9) and meter 10 of the invention from reset conditions. This software is written in assembly. At the conclusion of this code, control is transferred to the main background program which is written in the "C" programming language. From reset, the point of entry is labeled "_Startup".

Initialize Critical 68HC11E9 Processor Elements and Components:

Referring to FIGS. 18 and 30, immediately after the processor has been reset to the default conditions and processing has begun at the point of entry, the stack pointer is set to the top of the stack. Next, the BPROT register is set to allow the microcontroller EEPROM to be written.

Next, Port D is cleared, and the data direction of the pins on Port D are set for the Serial Peripheral Interface (SPI) and the Serial Communications Interface (SCI). This is accomplished by setting the Data Direction Register for port D (DDRD). This is performed in preparation to read the Real-Time Clock (RTC) U9 which interfaces via the microcontroller SPI.

The DDRD is set for I/O to the RTC. Bits 0 and 1 are the RxD and TxD lines, respectively, for the SCI. Bit 2 is Master input/slave output (MISO). Bit 3 is Master output/slave input (MOSI). Bit 4 is the Serial Clock (SCK). Bit 5 is the Slave Select (SS) input to the slave RTC.

Next, the SPI is configured for operation with the RTC. The SPI interrupts are disabled. The SPI is set on. The SPI is set in the Master Mode with Normal CMOS outputs. The SPI is set to use the E clock divided by two with latching on positive E clock polarity and center E clock phase.

Initialize the Real Time Clock:

Read the RTC Control Register to determine if the clock has lost battery power. If the Control Register does not contain the initialized value, the battery backup to the clock has been lost or the clock has failed. In either case, initialize the RTC. Set the Battery Failed Bit Flag in the Startup Byte for the Tester software to later report the failure. Since battery power has been lost, the last recorded KWH usage in EEPROM is used to initialize the Total KWH eight byte accumulator. Clear the SPI Failed Bit Flag in the Seconds byte to allow writing to the clock. Set the Set Clock Bit Flag in the Clock Control Byte (ClockCtrl) to cause the Seconds software to later set the RTC.

Initialize the LCD so that the Liquid Crystal Display is initialized in the foreground by the Seconds routine, the Initialize Display Bits (InitDisp) are set in the Display Control Byte (DispCtrl).

Initialize the Modem so that the Modem interface will later be initialized in the background, the Initialize Modem Bit (InitModem) is set in the Modem Control Byte (ModemCtrl).

Set Foreground Initialization Requests, Configure and Enable Foreground Interrupts. Set the initialization bits for Sampler (iSampler), Seconds (iSeconds), and Xminutes (iXminutes) in the initialization Control Byte (InitCtrl).

Set the data direction for bits 3, and 7 of port A as output pins. Bits 2 and 7 of the Pulse Accumulator Control Register (PACTL) are set to configure bits 3 and 7 of Port A as output pins. Bit 3 provides Data Terminal Ready (DTR) to the Modem and bit 7 provides the sampling interrupt to the hardware. Set bits 2 and 3 of the Timer Control 1 Register (TCTL 1) such that the output of the timer and the Timer Output Compare 4 Register (TOC4). Bit 4 of Port A is used as the TxD line for the serial communications interface to the Modem.

Set bits 0 and 1 of the Timer Control 2 Register (TCTL2) such that a transition of the input bit 0 of Port A from a one to zero will trigger the latching of the timer output to the Timer Output Compare 3 Register (TIC3). Bit 0 of Port A is used as the RxD line for the serial communications interface to the Modem.

Set bits 2 and 3 of the Timer Control 2 Register (TCTL2) such that a transition of the input bit 1 of Port A from a zero to a one will trigger the latching of the timer output to the Timer Input Compare 3 Register (TIC3) and also trigger an interrupt to the software for processing the Off-Hook Detection (OHD) from the Modem.

Toggle bit 7 of the Output Compare 1 Data Register (OC1D). This will cause a transition of the output of bit 7 of Port A. The transition of bit 7 of Port A will cause the sampling interrupt to be detected by the FPGA U2.

Set the bit 7 of the Output Compare 1 Mask (OC1M) so that the output of bit 7 of Port A is enabled.

Now synchronize with the sampling hardware by reading the voltage and current while checking for the sampling hardware to transition to the general mode of processing. If the transition if not detected within a limited time, the FPGA 4 bit in the Sampler byte is set to later indicate to the Tester software that the hardware has failed.

Clear the Output Compare 1 Flag (OC1F) for sampling interrupts and the Output Compare 4 Flag (OC4F) for serial communication interrupts.

Set the Output Compare 1 Interrupt (OC1I) bit in the Timer Mask 1 Register (TMSK1) to enable the Sampler interrupt to be serviced in the software.

Clear the X and I bits of the Condition Control Register (CCR) to unmask the External Interrupt Request pin (XIRQ) and all the software maskable interrupts, respectively. The XIRQ pin provides the tamper interrupt.

Reserve RAM

Figure 31:
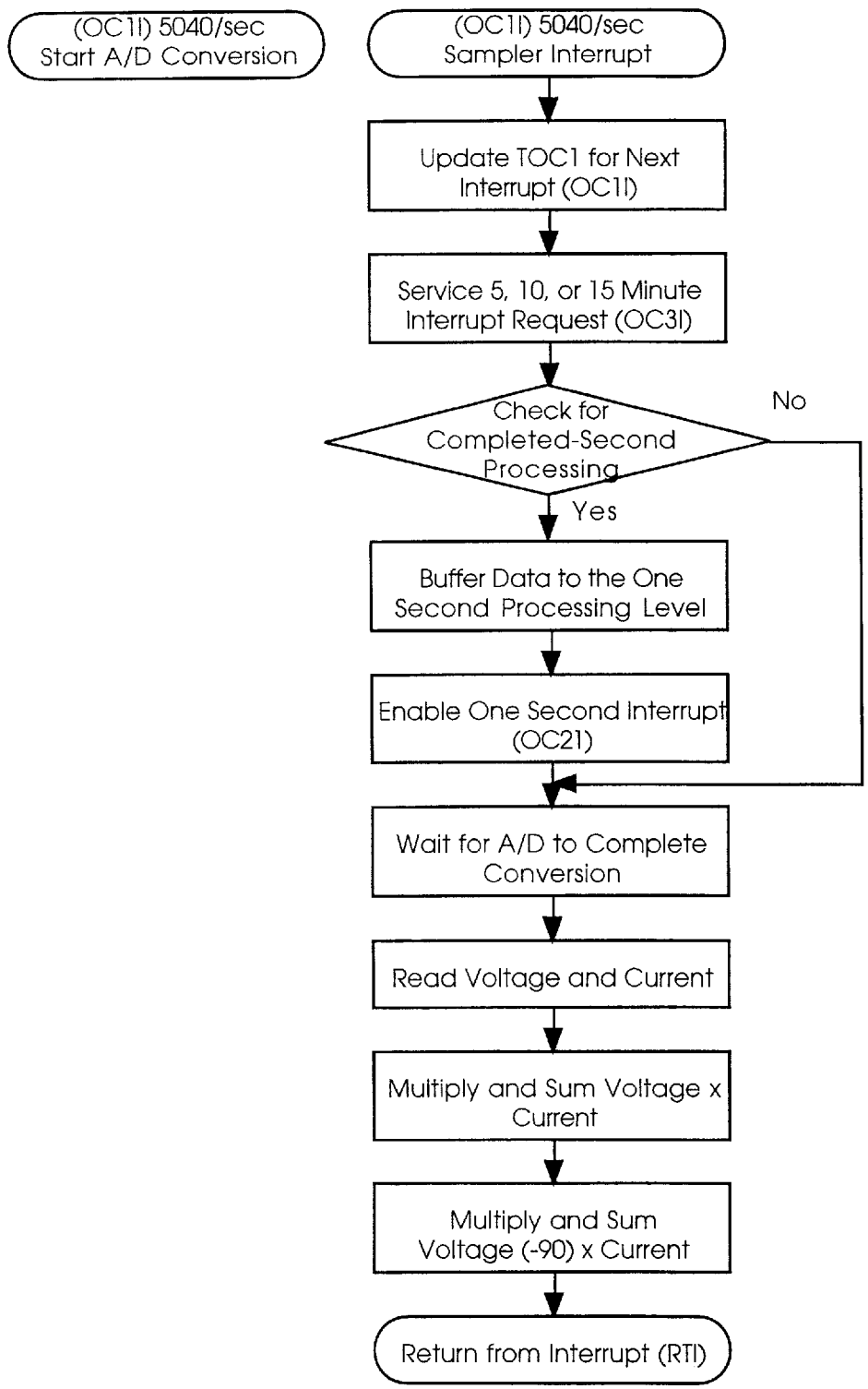
FIG. 31 is a sampler interrupt flow diagram according to the present invention.

The first part of Chip RAM ($00-$FF, single byte addressing) has been reserved for a Sampler Routine (FIG. 31). The first long word is reserved for general applications where a short address is required for the instruction mode.

The first part of Static RAM U6 has been reserved for the values of all the microcontroller U1 registers at the time of a major failure interrupt. These values are moved from a stack to the reserved location and saved for an attempt to report to an external interface (Serial Port) at a later time. The order of the registers from the stack have been rearranged to make the order consistent with debuggers and more easily interpreted.

Initialize Static RAM

The Static Ram (SRAM) U6 is used to maintain the accumulation of the raw data and final report data until the data can be officially reported. The SRAM is provided with a power back-up by the power back-up circuit 400 to prevent any loss of data during main power outages. To prevent the changing of data in the foreground while the background is reading the data, the data will be double buffered and a semaphore will be used to indicate that the background has priority use of the buffered data until it has been reported to the host computer 52. The SRAM handlers for the background and foreground are provided here to insure the proper control of the SRAM. RdSRAM/WtSRAM subroutines perform the requirements for the hardware interfacing with the SRAM U6. The interface is via the Field Programmable Gate Array (FPGA) U2 which controls the data latching (see Sampler routine, FIG. 31).

Set Foreground Initialization Requests and Enable Foreground Interrupt (TOC1):

Now that all the resources have been set up, set the foreground initialization requests (if appropriate) and enable the foreground interrupt, Timer Output Compare One (TOC1). The foreground will perform its own initialization, when requested.

Request the foreground to initialize and start sampling data. Initialize the foreground by setting the foreground bits high in the initialization control byte, InitCrl.

Set the data direction for Port A, as an output pin for the Output Compare 1 to start the analog to digital (A/D) sampling. Set an output Pin for the 2400 Hz clock for the modem U11. The pulse accumulator is preferably not used.

Delay for a time to allow the FPGA U2 to initialize and settle before setting the tri-state pins as output pins.

Schedule Background Processing:

Now schedule the background processing in a continuous loop. The scheduling will utilize a table of the background processes to allow for easy expansion of the background processing.

Figure 34:
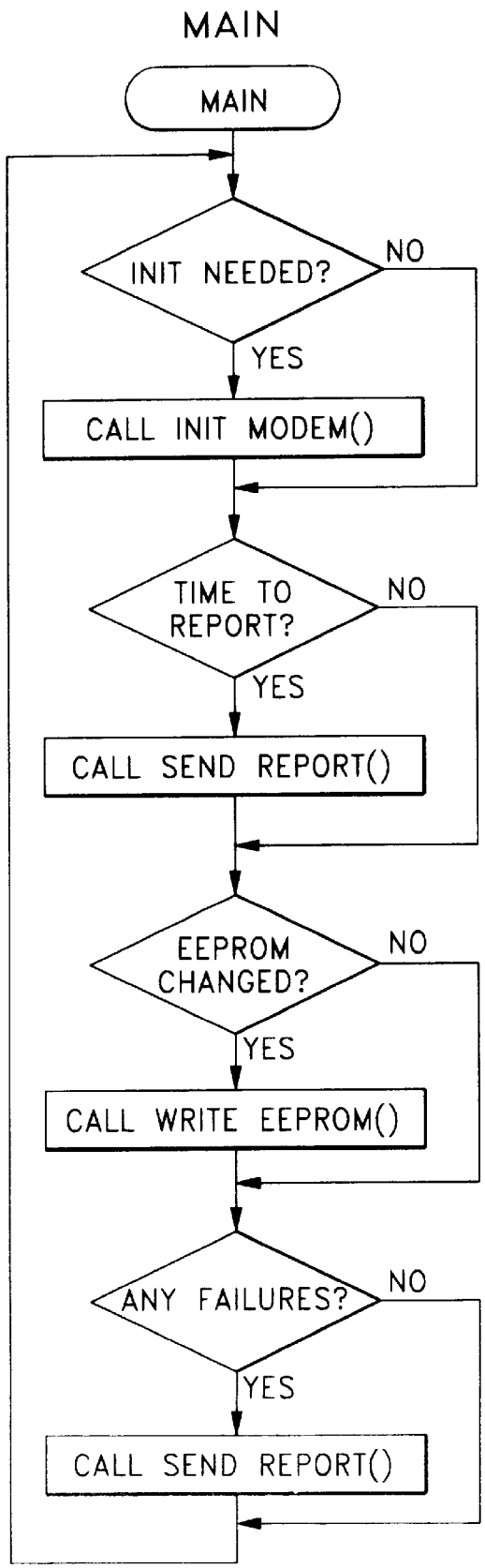
FIG. 34 is a main background flow diagram according the present invention.

FIG. 34 shows a flow chart of a main background scheduler routine. The routine is an infinite loop which checks various flags and schedules background processing contingent on the values of those flags.

Figure 35:
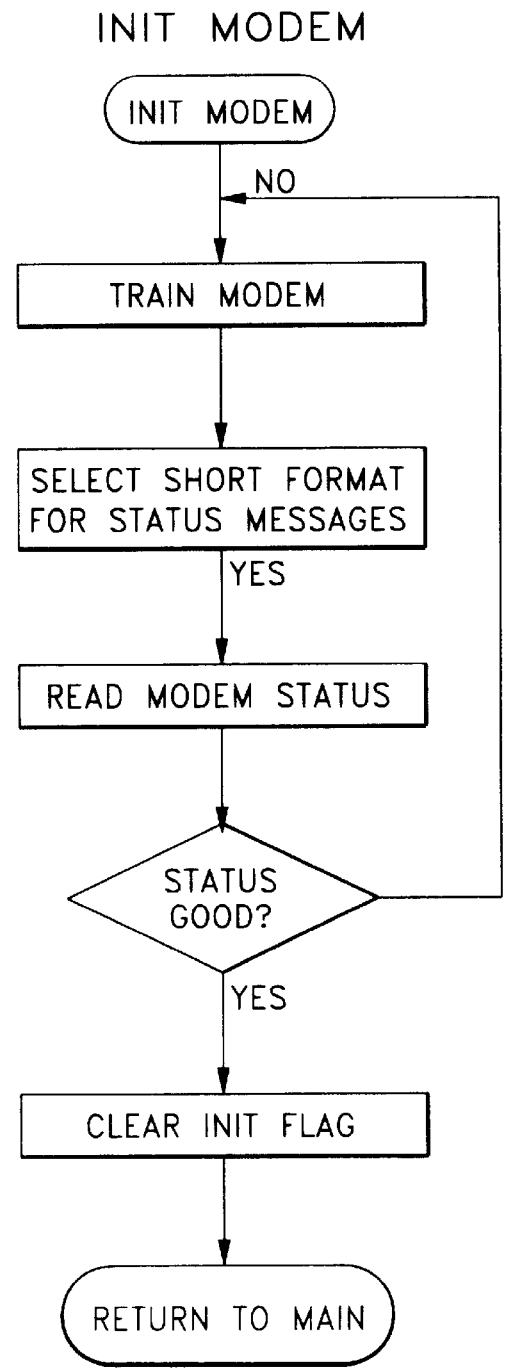
FIG. 35 is a flow diagram of an initialization of a modem.

Determine if initialization is needed by a check of a bit flag. The bit is set by the foreground and cleared by the background. If the flag is high, initiate a function call to initialization modem routine, initModem routine (FIG. 35). Upon completion, control is returned to the main scheduler. If the flag is low, initialization is not required.

Call InitModem( )

Determine if it is a time to report data to the host system by a check of a bit flag. The bit is set by the foreground and cleared by the background. If the flag is high, a sendUseReport routine (FIG. 37) is scheduled. If the flag is low, it is not time for the regularly scheduled usage report.

If a sendReport is scheduled, a function call is initiated to start a serial communication routine. The function receives the phone number designated for regular usage reporting. Upon completion, control is returned to the main scheduler.

Next, determine if any changes to the EEPROM are required by a check of the flag. This flag is set by the background during a modem session with the host. If the host transmits EEPROM changes, the flag is set. The background clears the flag after the EEPROM changes have been written to EEPROM and verified.

Figure 38:
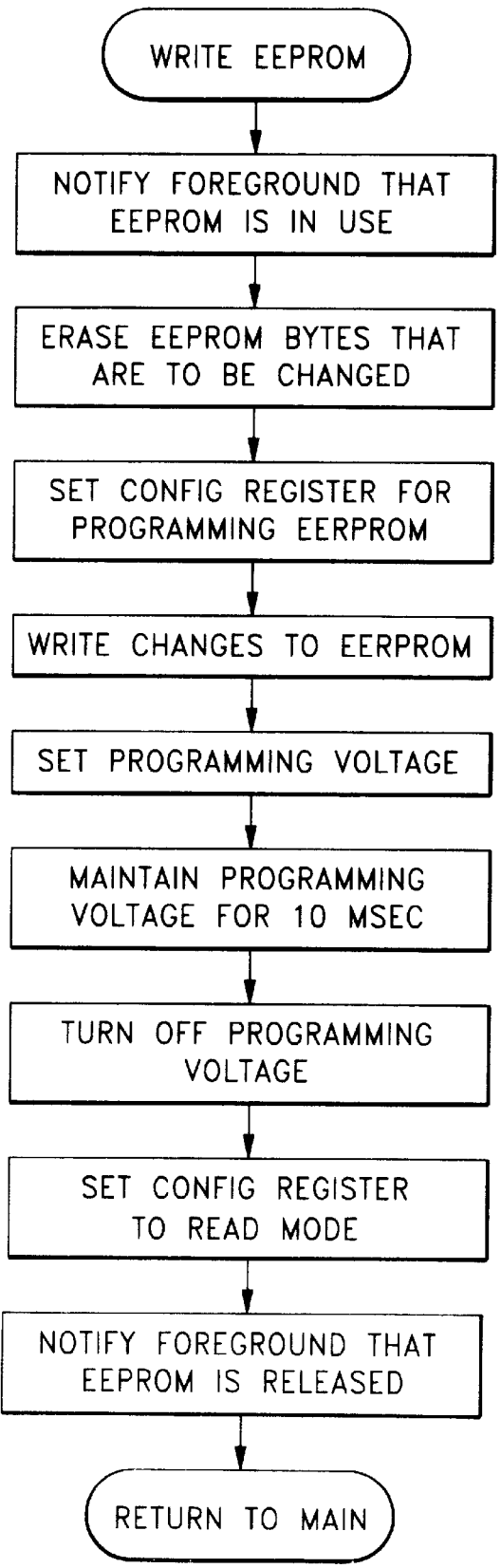
FIG. 38 is a flow diagram of a wright EEPROM routine according to the present invention.
Figure 39:
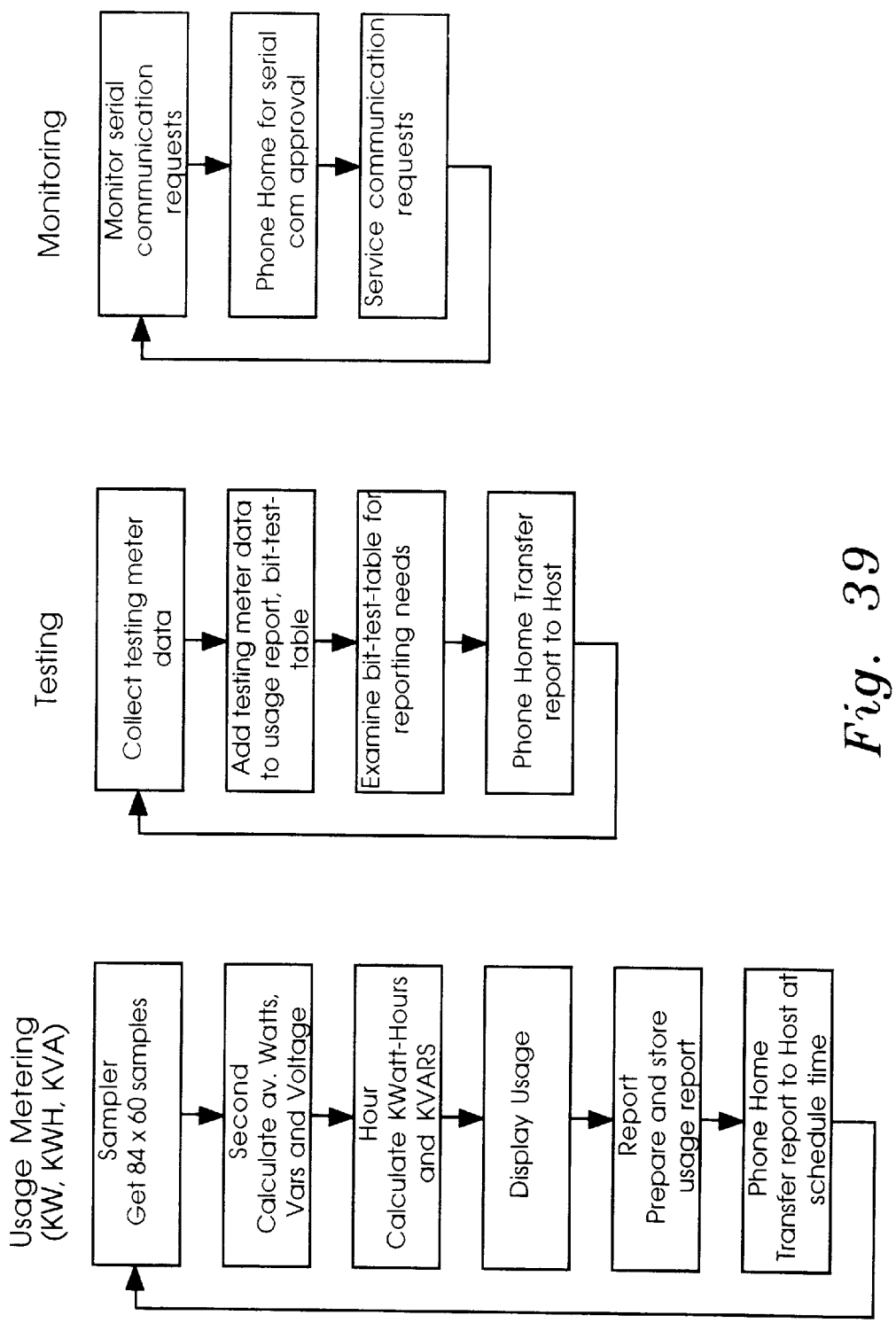
FIG. 39 is an overview of a top level control/data flow according the present invention.

Referring to FIG. 38, the call writeEEPROM routine is a function call to EEPROM processing. Upon completion, control is returned to the main scheduler (FIG. 34).

Figure 32:
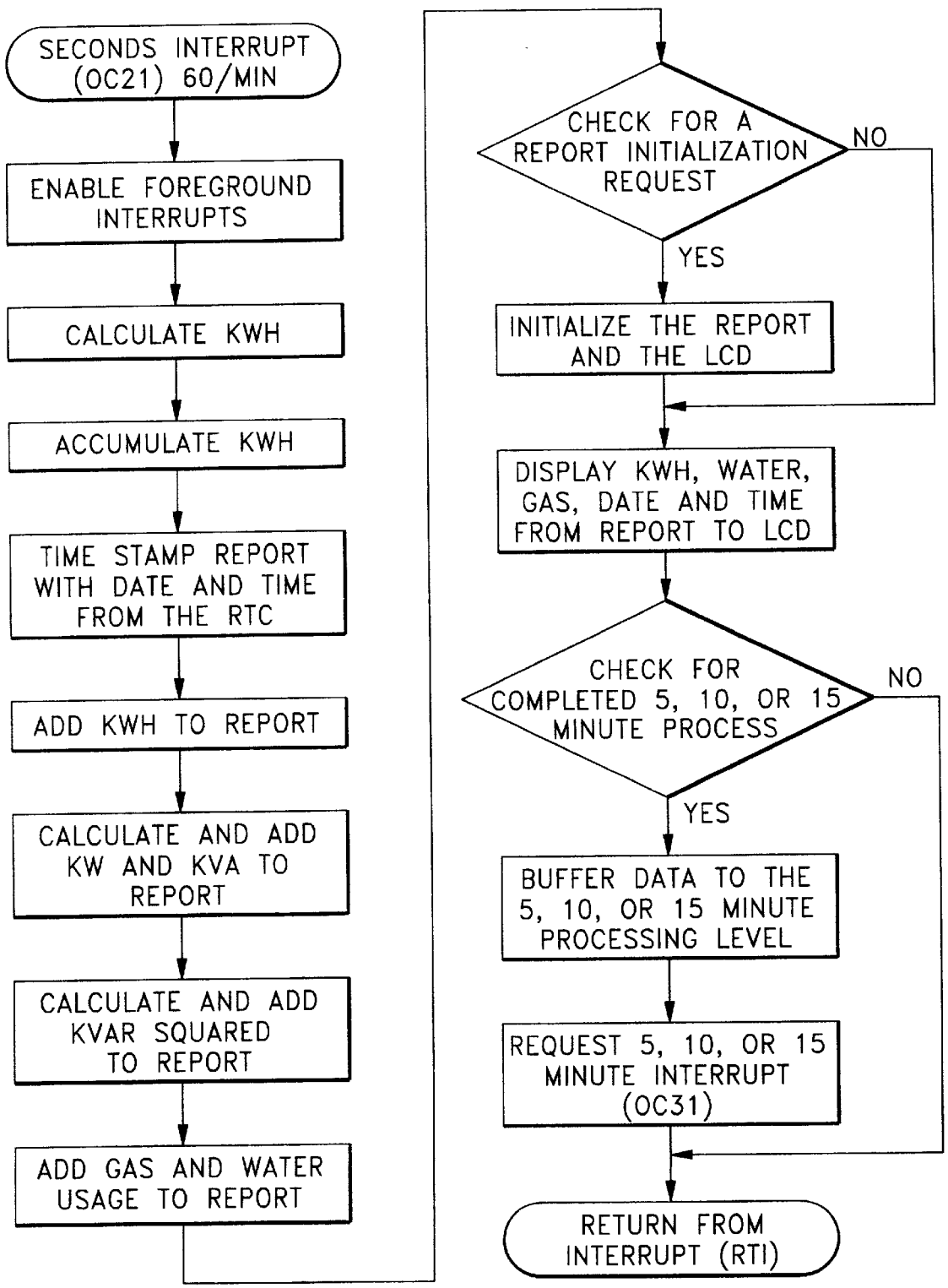
FIG. 32 is a second interrupt flow diagram according to the present invention.
Figure 33:
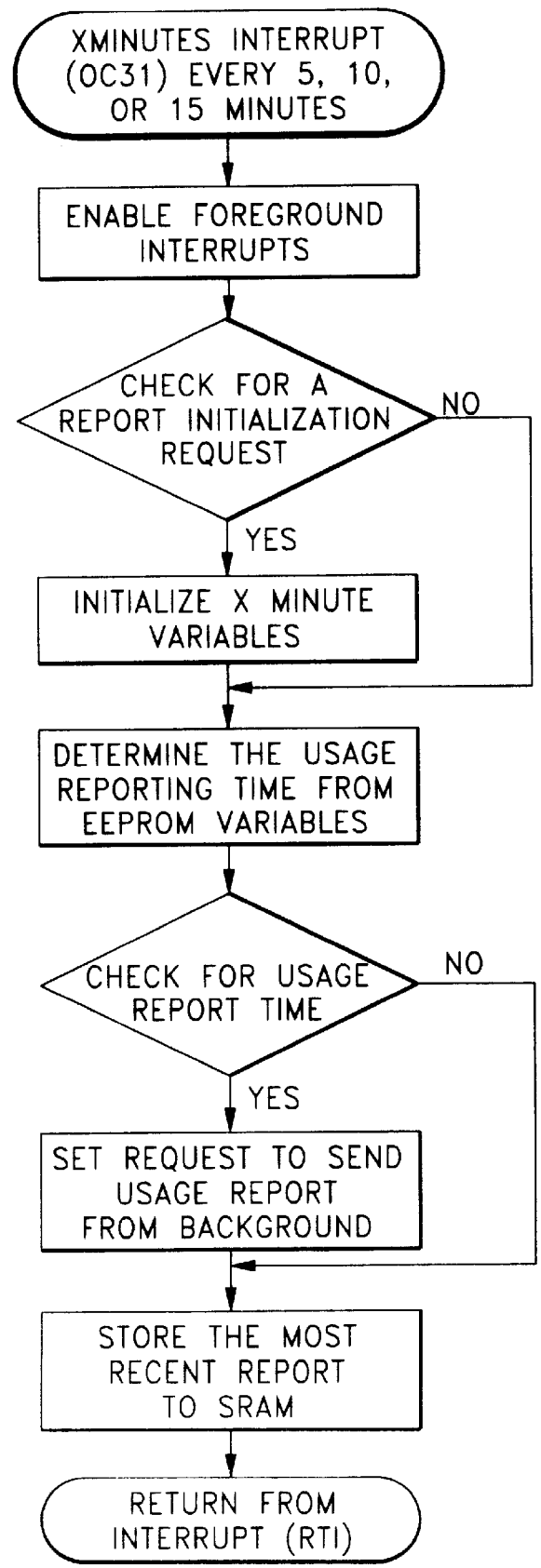
FIG. 33 is a X-minutes interrupt flow diagram according to the present invention.

Determine if there are any failures by having the background program check the test bytes for the startup routine (FIG. 30), sampler routine (FIG. 31), seconds routine (FIG. 32), and X-minutes routine (FIG. 33). These bytes are set by the foreground program, FIGS. 31 through 33. The background program determines if the data in these test bytes indicate a problem report should be sent to the host 52.

Figure 37:
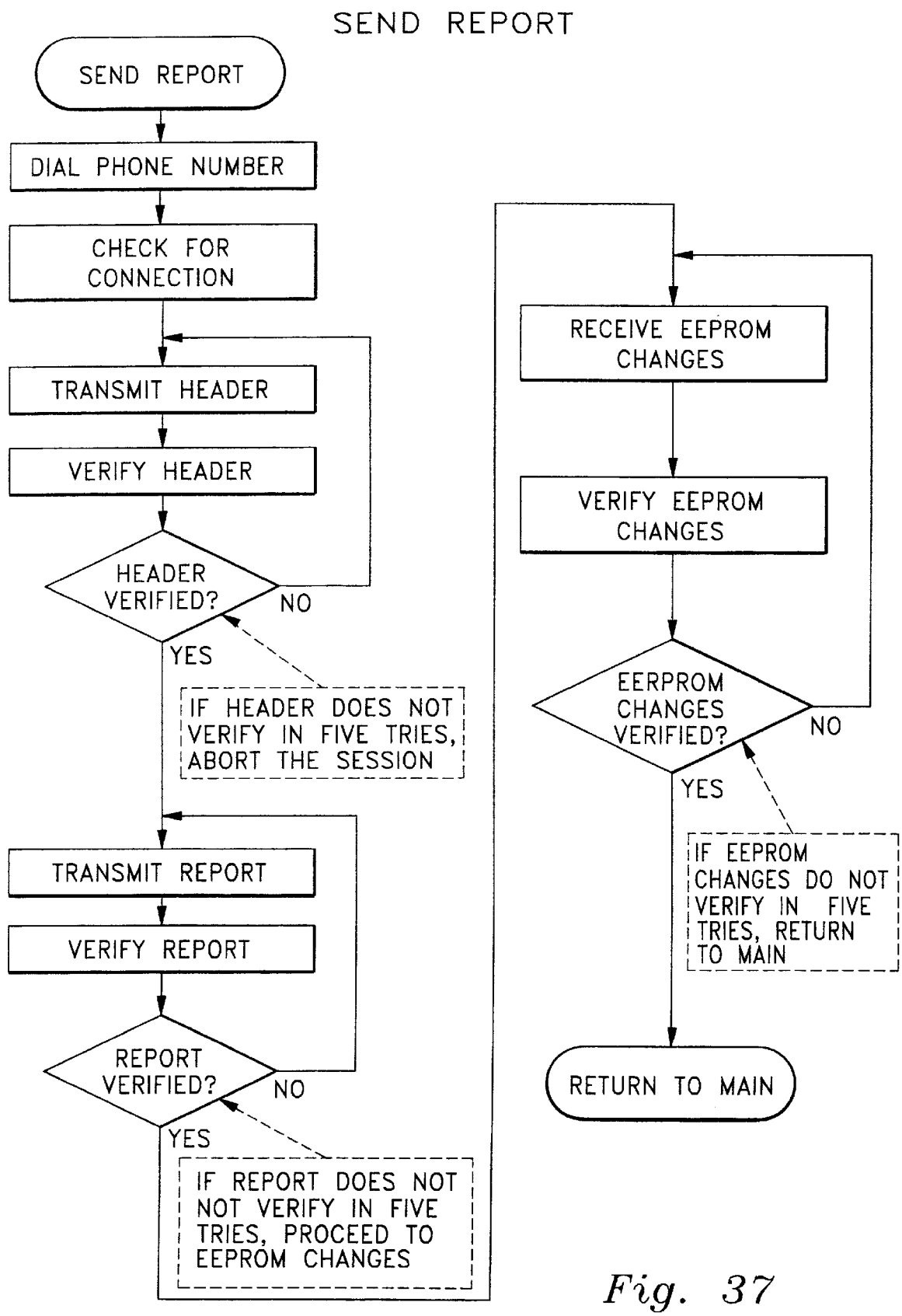
FIG. 37 is a flow diagram of a send report routine.

Referring to FIG. 37, the call sendReport routine is a function call to the serial communication routine. The function is passed the phone number designated for problem reporting. Upon completion, control is returned to the main scheduler (FIG. 34).

The initialization modem routine (FIG. 35), is executed at installation and after a power outage. Also, certain internal error conditions within the meter may necessitate a call to this routine.

The Train Modem routine matches the modem U11 in the meter 10 to the speed and parity of the microcontroller U1 in the meter 10.

Next, select Short Format for Status Messages. The status is read by calling an assembly receive handler. The handler stores incoming bytes in a wrap around buffer. The Status is then determined. A good status is represented by "OCR". This means the command has been executed. If the status is good, the init flag is cleared by setting the init flag to zero. Then, return to the main background scheduler. If the status is not good, the initialization is retried up to a total of five tries.

Referring to FIG. 37, the sendReport routine includes processing for regularly scheduled usage report and as needed problem reporting. The report is prefaced with a header. Optionally, the host may request EEPROM changes during a session.

Command the modem to dial the host phone number assigned to regular usage reports or as needed problem reports. The phone numbers are stored in EEPROM of U1.

The modem sends back status on every command. The status for a valid connection between meter and host is "10CR". This signifies a carrier has been detected at 2400 baud. The modem changes to data mode.

If the status is not a "10CR", wait for 1 minute and try to phone again up to a total of 5 tries. Other possible status values include: busy, no carrier, no dial tone, connect at the wrong baud.

The meter transmits data through an assembly transmit handler. The data is transmitted serially from Port A. The header is first built in the background because the data for the header is stored in several different locations in memory.

The background sits in an infinite loop waiting for the host to send back the header data. All infinite loops in the background have time-outs incorporated so that the background does not hang. As the bytes of header data are received by the meter 10, the background does a byte by byte comparison of the host data to the header.

If each byte matches, the header is verified. If one or more bytes do not match, the meter retries the header transmission and verification for up to five tries. If the header is not verified in five tries, the modem session is aborted.

Call the assembly transmit handler to serially send out the report. The report includes both usage data and test byte information.

The background sits in an infinite loop waiting for the host to send back the report data. As the bytes of report data are received by the meter, the background does a byte by byte comparison of the host data to the report. If each byte matches, the report is verified. If one or more bytes do not match, the meter retries the report transmission and verification for up to five tries. If the report is not verified in five tries, the background proceeds to EEPROM changes.

The background sits in an infinite loop waiting for a data stream from the host. The data stream may consist of an EEPROM image or a message stating that no EEPROM changes are requested for this session. The meter sends the EEPROM image data back to the host. The host does a string comparison of the meter data and the EEPROM image. If the strings match, the host sends a verification message to the meter. If the EEPROM image is not verified, the host retries the EEPROM image transmission and verification for up to five tries. If the EEPROM image is not verified in five tries, the host sends an appropriate message to the meter and the background software in the meter hangs up and returns from the function call to the main background scheduler (FIG. 34).

The following is the processing which implements the special procedures needed to write to EEPROM.

Referring to FIG. 38, the Foreground is notified that EEPROM is In Use. Note that when the EEPROM is being written to, software routines can not read from the EEPROM. This is accomplished by setting a semaphore flag to prevent other software from accessing EEPROM.

The preferred method to write to the EEPROM is to first erase the bytes and then write the new data values. An erased byte of EEPROM is $FF. EEPROM may be erased a byte at a time—a row at a time (16 bytes)—or as a block (512 bytes).

The CONFIG register, when set, controls the erase and programming modes for the EEPROM. The new data values are written to the desired EEPROM locations.

A programming voltage is set to a high voltage 20 volts to program the EEPROM. This voltage is controlled by the CONFIG register. The high voltage must be maintained for a minimum of 10 msec. A delay of longer than 10 msec will work, but may decrease the life span of the EEPROM.

The Programming Voltage is turned off and the CONFIG register is cleared. Then, the CONFIG Register is set to the Read Mode and the foreground notified that EEPROM is Released and the semaphore flag is cleared. Control is then returned to the main background scheduler (FIG. 34).

A Sampler Interrupt Service Routine is an assembly Interrupt Service Routine (ISR) dedicated to collecting the voltage and current readings and to pacing the analog-to-digital converter U1, the foreground software, and priority background software.

This ISR was written in assembly because of the following:

The allowed processing cycles per interrupt=595. This was calculated by assuming the use of a 3 Mhz clock and a sample rate of 84*60 per second. The Multiply and Sum for a 16×16 multiply and summation (using 8 bit multiply provided by HC11) will consume more than 170 cycles for each call. Therefore, the measurement of the current and the voltage could not be implemented, if a 16 bit external hardware multiply were not provided. One cycle of time consumed at this level is equivalent to 5040 cycles at the one second priority interrupt level. Thus, the time constraints for this code are highly stringent and are reflected in the structuring of the code to minimize extended and indexed addressing.

The following registers have been pushed onto the stack prior to entry (This operation requires 12 cycles):

Condition Code Register (CCR)—8 bits

Accumulator B (B)—8 bits

Accumulator A (A)—8 bits

Index Register X (IX)—16 bits

Index Register Y (IY)—16 bits

Program Counter next instruction (PC)—16 bits

The global interrupt bit, I, in the Condition Code Register, has been set to disable all maskable interrupts.

These two happenings will be utilized later to enable or disable the foreground and/or priority background Interrupt Servicing when executing the Return-from-Interrupt (RTI) instruction.

Sampler is the ISR point of entry. In order to have reached this point of processing the OC1I (bit 7 of TMSK1) must have been set to 1. The OC1F flag was set high due to a successful compare of the Timer Output Compare 1 (TOC1) register with the free running clock. The OC1F must be cleared and OC1I must remain high for the next Sampler interrupt to occur. At the point of entry, the OC1 interrupt has already initiated the analog-to-digital converter U4 to convert the voltage (VIN 1) and current samples (VIN 2, VIN 3) to digital format.

Update TOC1 for Next Interrupt (OC1)

Now set in the output compare register the value required for the next sampled interrupt. The method to be used to pace the software for 5040 interrupts per second will use one of the microcontroller's 16-bit Timer Output Comparators. This method requires the ISR, servicing the interrupt, to calculate the compare value for the next interrupt and move that value to an Output Comparator's register (OCR) before exiting the ISR.

when E=3,000,000 Hz and the Rate=84*60 Hz then the Output Compare Register (TOCR)=TOCI+E/Rate= TOCI+3000000/5040 or

TOCR=TOC1+595.2380952381 cycles per interrupt

Because only integers can be added to TOC1, the ISR will have to keep track of the fractional error and correct periodically for the inaccuracy due to truncation. If no correction is implemented the accumulation error would be 34.56 sec per day.

Accumulation error=0.238095, which is approximately: $3CF3 (integer scaled)= 0.238082

The OC1 interrupt will be enabled for the next interrupt only after completed and successful data processing and just prior to exiting this ISR (RTI).

Set end of the external interrupt to allow for the next interrupt to be detected by the FPGA U2. Force the output of PA7 low for the next interrupt to occur when the next output compare 1 is valid. Note that the PA7 designated pin of U1 is operatively coupled to U2 via line 372 (FIGS. 16 and 17).

Service 5, 10 or 15 Minute Interruption Request (OC3I)

Service the 5, 10 or 15 Minute Interrupt Request from the Seconds Interrupt Service Routine, and enable 5, 10 and 15 Minute interrupt generated by OC3I.

Check for the end of a second of processing, and if completed, force the interrupt for completed second processing. First, increment the count of samples for this present interrupt from 0 to the maximum sample rate. Define a global output buffer which will contain the minimum necessary information to allow final processing of the data at a slower rate. The intent is to postpone as much processing as possible to a slower rate. The next slower rate will occur at the end of each set of samples for a complete second of voltage and current measurements.

First, increment the count of samples, then check for wrapping of the indexing for the 90 degree voltage buffer. Next, increment the count of quadrants and wrap if necessary. Then increment the count of cycles for this present interrupt from 0 to the maximum cycle rate.

Buffer the Data to the One Second Processing Level

Once samples have been accumulated for a complete Second move the accumulated data from the Sample's buffer to the Second's. buffer, unlock the buffer and enable the Seconds Interrupt Service Routine to continue processing the data at the seconds rate. Before writing into the Seconds buffer, check to make sure the buffer has been left locked. If it is unlocked, Seconds could have overrun its allocated frame time, or Seconds processing has failed. If no problem exists, the buffering will occur once every second.

Enable One Second Interrupt (OC2I)

Now that the data has been moved to the next level of processing, unlock the buffer and enable the interrupt for the next level of processing. Enable the one second interrupt generated by OC2I.

Check to make sure that the analog-to-digital converter U4 has completed the conversions, and if the data is good, increment the Sample count and do 16×16 multiply and sum the results to the Sample buffer. The analog-to-digital converter U4 and multiply interface function will have nine bytes accessible to the software as Memory Mapped Input/Output.

Read Voltage and Current

If samples are invalid, do not enable the foreground interrupt, OC1I, and exit the ISR. This will leave the system operable, but in a degraded mode of operation. Disabling this foreground processing will also allow the testing and reporting to move to the foreground to provide better reporting response times.

Now read the voltage VIN 1 and the current VIN 2, VIN 3. Move the present voltage into the 90 degree wrap-around buffer and sum the product to Sample buffer.

Figure 36:
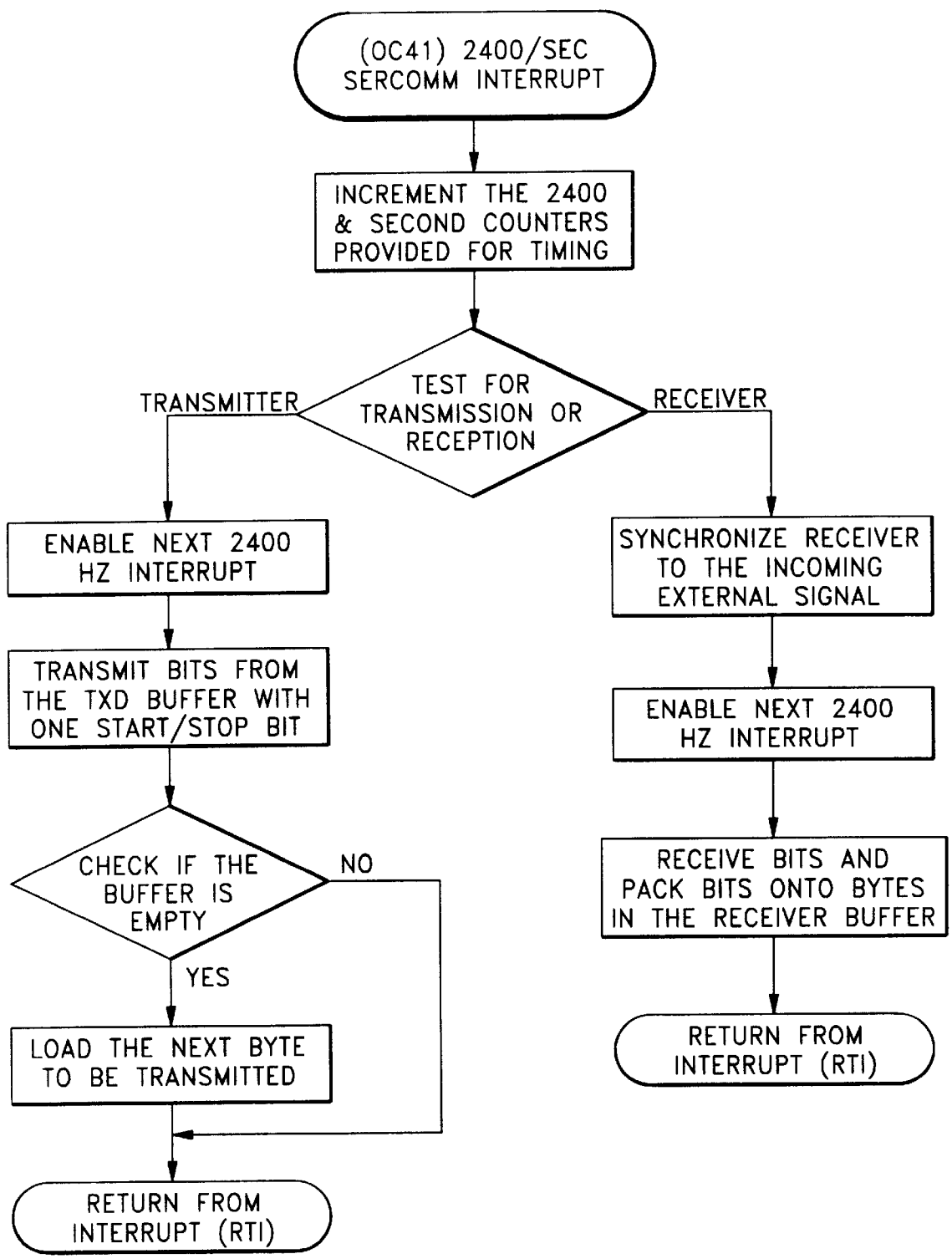
FIG. 36 is a flow diagram of how the microcontroller controls the modem for transmitting and receiving data therebetween.

Now multiply remaining voltages and currents and do summations. The result of summation can be rescaled at a later time, when the time restrictions are more relaxed (during seconds processing, FIG. 36, or the X-minutes processing, FIG. 33). At this point, the voltage has been saved to the 90 degree buffer. The first current has also been saved and the first product has been accumulated. Remaining calculations include:

Accumulating the second current/voltage Watt product;

Accumulating the second current/voltage 90 VARS product. The previous 90 degree voltage was saved previously;

Accumulating the first current/voltage 90 VARS product;

Execution to this juncture implies successful data processing. Enable the next local interrupt (OC1I), and enable all maskable interrupts via the RTI instruction which will restore the Interrupt Request Mask (IRQ) in the Condition Code Register (CCR) to zero.

The Seconds Interrupt Service Routine (Seconds Interrupt (OC2I) 60/min) is dedicated to calculating and displaying KW, KWH, and KVA. It is a foreground routine situated one priority level below the Sampler routine, but it takes priority over all other foreground and over all background processing. The following registers have been pushed onto the stack prior to entry (this operation requires 12 cycles):

Condition Code Register (CCR)—8 bits

Accumulator B (B)—8 bits

Accumulator A (A)—8 bits

Index Register X (IX)—16 bits

Index Register Y (IY)—16 bits

Program Counter (PC) next instruction—16 bits

The global interrupt bit, 1, in the Condition Code Register, has been set to disable all maskable interrupts.

These two happenings will be utilized later to enable or disable the foreground and/or priority background Interrupt Servicing when executing the Return-from-Interrupt (RTI) Instruction. This ISR is paced from the Sampler routine and will process buffered data from the Sampler routine once every second. This ISR is entered via an Output Compare 2 Interrupt (OC2I), which is forced at the completion of every second by the Sampler ISR.

Enable Foreground Interrupts. Set the OC2D (bit 6 of TMSK1) low to acknowledge the interrupt and prevent another interrupt from occurring, before unmasking all interrupts.

Before processing any data, enable all maskable interrupts to allow the foreground interrupt to occur without disruption by clearing the I bit of the condition code register (CCR).

Now, calculate the kilowatts (KW) and kilowatt hours (KWH) and kilovolt-amperes (KVA) for this present second from the raw accumulations for this second.

Voltage,. Current, Watts, VA, KVA, and PF are all averaged values for the present measured second. However, the watts that are accumulated represent a scaled volt-ampere value at this level. Therefore, simply multiplying the watt accumulation by the unit conversions will yield the correct KW and KWH usage.

Now accumulate the raw Kilowatt-hours till a report is successfully sent to the host computer 76. Then, reset the accumulations, and continue. If the meter 10 is at a setting that does not allow electronic reporting, then the accumulations will continue for the life of the meter. The process of accumulation truncates the last 16 bits, therefore the scaling of the raw Total_KWH is B32, because the Raw_KWH is scaled B48 prior to truncation.

Time Stamp Report with Date and Time from the real time clock U9:

Now, get the time/date from the real time clock. Then convert the BCD data to ASCII format and save the results in the SecReport.

Add KWH to Report

Now, write the kilowatt-hrs since last report was phoned home to the SecReport.

Convert the scaled Total_KWH to binary coded digit format. This will be accomplished by multiplying Total_KWH by 10, truncating to the most significant digit and adding the digit to the result.

Calculate and Add KW and KVA to Report

Now, multiply the first 32 bits of Sum 1_V*I with the 16 bit KW scale factor. Because the radix of the 32 bit Sum 1_V*I is B14 and the radix of KW_Factor is B22, the radix of the 48 bit result will be B36. In order to maintain maximum accuracy and force the product of the scaling to a byte boundary, the KW_Factor will be multiplied by an additional 1/10 B4. This KW_Factor will produce a product of 1/10 th KW and KVA scaled B40. The KW_0.1 Factor is determined as follows:

Calculate the Raw 0.01KVARsq from the sum of the squares of Raw 0.1KW+1 and Raw 0.1KVA+1. Now get the gas and water usage and add to the report to complete the report.

Now check to see if there is a report initialization interrupt. If so, go directly to the initialization section before continuing. Check InitCtrl byte/iSeconds bit for initialization request Initialize the Report and the LCD:

The following is the initialization that will be performed by this Interrupt Service Routine when requested by the bit set in the Initialization Control byte from Tester.

First set the seconds counter for the beginning of 5, 10 or 15 minutes. The maximum count of 15 for Xmax_Cnt is set in Startup as a default power-on value. The maximum count is reset in other routines according to the demands of the current system situations by the host 76.

Now, display the total kilowatt-hours since the last reported readings. Also display the gas and water readings. The source of these displays will be the SecReport. The destination will be the LCD.

Now, check for the completion of a 0, 5, 10 or 15 minute processing interval or return from this interrupt. First, increment the count of seconds and request the interrupt if necessary.

Buffer Data to the 5, 10 or 15 minute Processing Level when the 5, 10 or 15 minute processing level. Buffer the necessary data for each specified priority interrupt level. The data that is to be buffered is the completed portion of the ASCII final report, SecReport. The report resides in direct RAM and is to be copied to the report section of RAM for X-minute processing. Before buffering to the next processing level, make sure that the buffer has been locked.

Referring to FIG. 33 the X-minutes Interrupt (OC3I) (every 5, 10 or 15 minutes) is an assembly Interrupt Service Routine dedicated to organizing the 5, 10 or 15 minute reports and storing the reports to SRAM for power backup until the background software can report the information to the host 52.

Enable Foreground Interrupts setting the OC3D (bit 5 of TMSK1) low to acknowledge the interrupt and to prevent another interrupt from occurring, before unmasking all interrupts. Before enabling the sampling interrupt, check for the maximum allowable lost samples per X-minute interrupt. If the maximum has not been reached, then clear the counter to allow the maximum lost samples before the next X-minute interrupt.

Check for an initialization request. If requested, initialize for X-minutes processing and SRAM pointers.
Initialize Xminute Variables as follows:
Get the beginning of storage SRAM U6;
Set the pointer to the same address to indicate SRAM empty;
Get the maximum possible storage;
Set the maximum storage allowed;

Now, determine the time to report usage. Note that report time is determined from the time set in the EEPROM during installation. If it is time to report the usage and the last report has been sent and delivery has been verified, copy the report to the background buffer. The EEPROM time is added to the time of the last report sent from background and compared to the time stamp in the report from seconds. If the last report has not been sent and the new report is due to be sent, then the report is stored in SRAM, if the time of the last report added to the EEPROM time is less than the time stamp on the latest report from seconds.

First determine the reporting interval and calculate the next reporting Time.

Now compare the seconds report time with the calculated reporting time. If it is not time to report do nothing and return from this interrupt after cleaning up.

Set a Request to Send Usage Report from Background. If report is to be sent, and the report verified semaphore has been set, copy the most recent report to the background buffer.

Specifically, save the report to SRAM in a wrap-around storage such that the size of the storage is an even multiple of the size of the usage report with the pointers to the oldest report.

If the latest report has not been sent then set the request to send the report, unlock the minute buffer, and return from this interrupt (RTI).

Moreover, having thus described the invention, it should be apparent that numerous structural modifications and adaptations may be resorted to without departing from the scope and fair meaning of the instant invention as set forth hereinabove and as described hereinbelow by the claims.

We claim:

1. An automatic utility meter, comprising:
   (a) an internal power supply circuit, said internal power supply circuit having an input, said internal power supply circuit having an output for powering internal components in said utility meter;
   (b) a voltage transducer, said voltage transducer having an input for connection across first and second external power supply lines, said voltage transducer having a first output operatively coupled to said input of said internal power supply circuit, said voltage transducer having a second output for providing a first voltage signal;
   (c) a first current transducer configured for sensing current flow through said first power supply line and outputting a second voltage signal proportional to current flowing through said first power supply line;
   (d) a second current transducer configured for sensing current flow through said second power supply line and outputting a third voltage signal proportional to current flowing through said second power supply line;
   (e) sampling means for sampling said first, second and third voltage signals;
   (f) processing means for processing said sampled voltage signals, and for processing encoded signals from a utility supply meter such as a gas or water meter; and
   (g) a communications interface operatively coupled to said processing means for transferring data between said processing means and an external computer.

2. An automatic utility meter as recited in claim 1, wherein said voltage transducer comprises a voltage transformer having a primary winding for connection across said first and second external power supply lines, said voltage transformer having a first secondary winding connected to said input of said internal power supply circuit, said voltage transformer having a second secondary winding for outputting said first voltage signal.

3. An automatic utility meter as recited in claim 1, wherein said first and second current transducers each comprise a current transformer operatively coupled to a resistive branch circuit for outputting a voltage signal proportional to current flowing through said respective power supply line.

4. An automatic utility meter as recited in claim 1, further comprising interface means for receiving said first, second and third sampled voltage signals and storing said signals until retrieved by said processing means.

5. An automatic utility meter as recited in claim 4, further comprising a hardware multiplier operatively coupled to said interface means.

6. An automatic utility meter as recited in claim 5, wherein said interface means comprises a field programmable gate array.

7. An automatic utility meter as recited in claim 4, wherein said sampling means comprises an A/D converter.

8. An automatic utility meter as recited in claim 1, wherein said current transducers comprise current transformers having a turns ratio of 1000:1.

9. An automatic utility meter, comprising:

(a) an internal power supply circuit, said power supply circuit having an input, said internal power supply circuit having an output for powering internal components in said utility meter;

(b) a voltage transformer having a primary winding for connection across first and second external power supply lines, said voltage transformer having a first secondary winding operatively coupled to said input of said internal power supply circuit, said voltage transformer having a second secondary winding for outputting a first voltage signal;

(c) a first current transformer configured for sensing current flow through said first power supply line;

(d) a second current transformer configured for sensing current flow through said second power supply line;

(e) a first resistive branch circuit, said first resistive branch circuit coupled to said first current transformer for outputting a second voltage signal proportional to current flowing through said first power supply line;

(f) a second resistive branch circuit, said second resistive branch circuit coupled to said second current transformer for outputting a third voltage signal proportional to current flowing through said second power supply line;

(g) sampling means for sampling said first, second and third voltage signals;

(h) processing means for processing said sampled voltage signals, and for processing encoded signals from a utility supply meter such as a gas or water meter; and (i) a communications interface operatively coupled to said processing means for transferring data between said processing means and an external computer.

10. An automatic utility meter as recited in claim 9, further comprising interface means for receiving said first, second and third sampled voltage signals and storing said signals until retrieved by said processing means.

11. An automatic utility meter as recited in claim 10, further comprising a hardware multiplier operatively coupled to said interface means.

12. An automatic utility meter as recited in claim 11, wherein said interface means comprises a field programmable gate array.

13. An automatic utility meter as recited in claim 12, wherein said sampling means comprises an A/D converter.

14. An automatic utility meter as recited in claim 13, wherein said current transformers have a turns ratio of 1000:1.

15. An automatic utility meter as recited in claim 13, wherein said current transformers have a turns ratio of 1000:1.

16. An automatic utility meter, comprising:

(a) an internal power supply circuit, said power supply circuit having an input, said internal power supply circuit having an output for powering internal components in said utility meter;

(b) a voltage transformer having a primary winding for connection across first and second external power supply lines, said voltage transformer having a first secondary winding operatively coupled to said input of said internal power supply circuit, said voltage transformer having a second secondary winding for outputting a first voltage signal;

(c) a first current transformer configured for sensing current flow through said first power supply line;

(d) a second current transformer configured for sensing current flow through said second power supply line;

(e) a first resistive branch circuit, said first resistive branch circuit coupled to said first current transformer for outputting a second voltage signal proportional to current flowing through said first power supply line;

(f) a second resistive branch circuit, said second resistive branch circuit coupled to said second current transformer for outputting a third voltage signal proportional to current flowing through said second power supply line;

(g) an A/D converter for sampling said first, second and third voltage signals and converting said voltage signals to digital signals;

(h) a field programmable gate array operatively coupled to said A/D converter for receiving said digital signals and storing said signals for later retrieval;

(i) a hardware multiplier operatively coupled to said field programmable gate array; and (j) a microprocessor operatively coupled to said field programmable gate array, said microprocessor including means for processing said digital signals, and for processing encoded signals from a utility supply meter such as a gas or water meter; and (k) a communications interface operatively coupled to said microprocessor for transferring data between said processing means and an external computer.

* * * * *